US008932734B2

(12) United States Patent
Dyatkin

(10) Patent No.: US 8,932,734 B2
(45) Date of Patent: Jan. 13, 2015

(54) ORGANIC ELECTROLUMINESCENT MATERIALS AND DEVICES

(75) Inventor: Alexey Dyatkin, Ambler, PA (US)

(73) Assignee: Universal Display Corporation, Ewing, NJ (US)

( * ) Notice: Subject to any disclaimer, the term of this patent is extended or adjusted under 35 U.S.C. 154(b) by 257 days.

(21) Appl. No.: 12/900,925

(22) Filed: Oct. 8, 2010

(65) Prior Publication Data
US 2012/0086329 A1 Apr. 12, 2012

(51) Int. Cl.
H01L 51/50 (2006.01)
H01L 51/00 (2006.01)

(52) U.S. Cl.
CPC ........... *H01L 51/0072* (2013.01); *H01L 51/006* (2013.01); *H01L 51/0073* (2013.01); *H01L 51/0074* (2013.01); *H01L 51/0081* (2013.01); *H01L 51/0085* (2013.01); *H01L 51/5012* (2013.01); *H01L 51/5048* (2013.01); *H01L 51/5096* (2013.01); *H01L 2251/308* (2013.01); *Y10S 428/917* (2013.01)
USPC ........... 428/690; 428/917; 313/504; 313/505; 313/506; 257/E51.05; 257/E51.026; 257/E51.032; 546/18; 546/79; 546/81; 546/101; 548/304.1; 548/418; 548/440; 548/444

(58) Field of Classification Search
USPC .................. 428/690, 917; 313/504, 505, 506; 257/40, E51.05, E51.026, E51.032; 546/18, 79, 81, 101; 544/234
See application file for complete search history.

(56) References Cited

U.S. PATENT DOCUMENTS

| 4,769,292 | A | 9/1988 | Tang et al. |
|---|---|---|---|
| 5,061,569 | A | 10/1991 | VanSlyke et al. |
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |

(Continued)

FOREIGN PATENT DOCUMENTS

| EP | 0650955 | 5/1995 |
|---|---|---|
| EP | 1725079 | 11/2006 |

(Continued)

OTHER PUBLICATIONS

Baldo et al., "Highly Efficient Phosphorescent Emission from Organic Electroluminescent Devices," Nature, vol. 395, 151-154, (1998).

(Continued)

*Primary Examiner* — Gregory Clark
(74) *Attorney, Agent, or Firm* — Duane Morris LLP

(57) ABSTRACT

Compounds comprising a 3,9-linked oligocarbazole moiety and a dibenzothiophene, dibenzofuran, dibenzoselenophene, aza-dibenzothiophene, aza-dibenzofuran, or aza-dibenzoselenophene are provided. The 3,9-linked oligocarbazole and dibenzo or aza-dibenzo moiety are separated by an aromatic spacer. The compounds may be used as non-emissive materials for phosphorescent OLEDs to provide devise having improved performance.

11 Claims, 3 Drawing Sheets

(56) References Cited

U.S. PATENT DOCUMENTS

| | | | |
|---|---|---|---|
| 6,303,238 B1 | 10/2001 | Thompson et al. |
| 6,337,102 B1 | 1/2002 | Forrest et al. |
| 6,468,819 B1 | 10/2002 | Kim et al. |
| 6,528,187 B1 | 3/2003 | Okada |
| 6,687,266 B1 | 2/2004 | Ma et al. |
| 6,835,469 B2 | 12/2004 | Kwong et al. |
| 6,921,915 B2 | 7/2005 | Takiguchi et al. |
| 7,087,321 B2 | 8/2006 | Kwong et al. |
| 7,090,928 B2 | 8/2006 | Thompson et al. |
| 7,154,114 B2 | 12/2006 | Brooks et al. |
| 7,250,226 B2 | 7/2007 | Tokito et al. |
| 7,279,704 B2 | 10/2007 | Walters et al. |
| 7,332,232 B2 | 2/2008 | Ma et al. |
| 7,338,722 B2 | 3/2008 | Thompson et al. |
| 7,393,599 B2 | 7/2008 | Thompson et al. |
| 7,396,598 B2 | 7/2008 | Takeuchi et al. |
| 7,431,968 B1 | 10/2008 | Shtein et al. |
| 7,445,855 B2 | 11/2008 | Mackenzie et al. |
| 7,534,505 B2 | 5/2009 | Lin et al. |
| 2002/0034656 A1 | 3/2002 | Thompson et al. |
| 2002/0134984 A1 | 9/2002 | Igarashi |
| 2002/0158242 A1 | 10/2002 | Son et al. |
| 2003/0138657 A1 | 7/2003 | Li et al. |
| 2003/0152802 A1 | 8/2003 | Tsuboyama et al. |
| 2003/0162053 A1 | 8/2003 | Marks et al. |
| 2003/0175553 A1 | 9/2003 | Thompson et al. |
| 2003/0230980 A1 | 12/2003 | Forrest et al. |
| 2004/0036077 A1 | 2/2004 | Ise |
| 2004/0137267 A1 | 7/2004 | Igarashi et al. |
| 2004/0137268 A1 | 7/2004 | Igarashi et al. |
| 2004/0174116 A1 | 9/2004 | Lu et al. |
| 2005/0025993 A1 | 2/2005 | Thompson et al. |
| 2005/0112407 A1 | 5/2005 | Ogasawara et al. |
| 2005/0238919 A1 | 10/2005 | Ogasawara |
| 2005/0244673 A1 | 11/2005 | Satoh et al. |
| 2005/0260441 A1 | 11/2005 | Thompson et al. |
| 2005/0260449 A1 | 11/2005 | Walters et al. |
| 2006/0008670 A1 | 1/2006 | Lin et al. |
| 2006/0202194 A1 | 9/2006 | Jeong et al. |
| 2006/0240279 A1 | 10/2006 | Adamovich et al. |
| 2006/0251923 A1 | 11/2006 | Lin et al. |
| 2006/0263635 A1 | 11/2006 | Ise |
| 2006/0280965 A1 | 12/2006 | Kwong et al. |
| 2007/0141387 A1 | 6/2007 | Nakano et al. |
| 2007/0190359 A1 | 8/2007 | Knowles et al. |
| 2007/0224446 A1 | 9/2007 | Nakano et al. |
| 2007/0278938 A1 | 12/2007 | Yabunouchi et al. |
| 2008/0015355 A1 | 1/2008 | Schafer et al. |
| 2008/0018221 A1 | 1/2008 | Egen et al. |
| 2008/0106190 A1 | 5/2008 | Yabunouchi et al. |
| 2008/0124572 A1 | 5/2008 | Mizuki et al. |
| 2008/0220265 A1 | 9/2008 | Xia et al. |
| 2008/0297033 A1 | 12/2008 | Knowles et al. |
| 2009/0008605 A1 | 1/2009 | Kawamura et al. |
| 2009/0009065 A1 | 1/2009 | Nishimura et al. |
| 2009/0017330 A1 | 1/2009 | Iwakuma et al. |
| 2009/0030202 A1 | 1/2009 | Iwakuma et al. |
| 2009/0039776 A1 | 2/2009 | Yamada et al. |
| 2009/0045730 A1 | 2/2009 | Nishimura et al. |
| 2009/0045731 A1 | 2/2009 | Nishimura et al. |
| 2009/0101870 A1 | 4/2009 | Prakash et al. |
| 2009/0108737 A1 | 4/2009 | Kwong et al. |
| 2009/0115316 A1 | 5/2009 | Zheng et al. |
| 2009/0134784 A1 | 5/2009 | Lin et al. |
| 2009/0153034 A1 | 6/2009 | Lin et al. |
| 2009/0165846 A1 | 7/2009 | Johannes et al. |
| 2009/0167162 A1 | 7/2009 | Lin et al. |
| 2009/0179554 A1 | 7/2009 | Kuma et al. |

FOREIGN PATENT DOCUMENTS

| | | |
|---|---|---|
| EP | 2034538 | 3/2009 |
| EP | 1885818 | 1/2010 |
| JP | 200511610 | 1/2005 |
| JP | 2007123392 | 5/2007 |
| JP | 2007254297 | 10/2007 |
| JP | 2008074939 | 4/2008 |
| JP | 2008074939 | 10/2009 |
| WO | WO 0139234 | 5/2001 |
| WO | WO 0202714 | 1/2002 |
| WO | WO 0215645 | 2/2002 |
| WO | WO 03040257 | 5/2003 |
| WO | WO 03060956 | 7/2003 |
| WO | WO 2004093207 | 10/2004 |
| WO | WO 2004107822 | 12/2004 |
| WO | WO 2005014551 | 2/2005 |
| WO | WO 2005019373 | 3/2005 |
| WO | WO 2005030900 | 4/2005 |
| WO | WO 2005089025 | 9/2005 |
| WO | WO 2005123873 | 12/2005 |
| WO | WO 2006009024 | 1/2006 |
| WO | WO 2006056418 | 6/2006 |
| WO | WO 2006072002 | 7/2006 |
| WO | WO 2006082742 | 8/2006 |
| WO | WO 2006098120 | 9/2006 |
| WO | WO 2006100298 | 9/2006 |
| WO | WO 2006103874 | 10/2006 |
| WO | WO 2006114966 | 11/2006 |
| WO | WO 2006128800 | 12/2006 |
| WO | WO 2006132173 | 12/2006 |
| WO | WO 2007002683 | 1/2007 |
| WO | WO 2007004380 | 1/2007 |
| WO | WO 2007063754 | 6/2007 |
| WO | WO 2007063796 | 6/2007 |
| WO | WO 2008101842 | 8/2008 |
| WO | WO 2008132085 | 11/2008 |
| WO | WO 2009000673 | 12/2008 |
| WO | WO 2009003898 | 1/2009 |
| WO | WO 2009008099 | 1/2009 |
| WO | WO 2009008311 | 1/2009 |
| WO | WO 2009018009 | 2/2009 |
| WO | WO 2009050290 | 4/2009 |
| WO | WO 2008056746 | 5/2009 |
| WO | WO 2009021126 | 5/2009 |
| WO | WO 2009062578 | 5/2009 |
| WO | WO 2009063833 | 5/2009 |
| WO | WO 2009066778 | 5/2009 |
| WO | WO 2009066779 | 5/2009 |
| WO | WO 2009086028 | 7/2009 |
| WO | WO 2009100991 | 8/2009 |
| WO | WO 2011/122133 | 10/2011 |

OTHER PUBLICATIONS

Baldo et al., "Very high-efficiency green organic light-emitting devices based on electrophosphorescence," Appl. Phys. Lett., vol. 75, No. 3, 4-6 (1999).

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," Adv. Mater., 6(9):677-679 (1994).

Paulose, Betty Marie Jennifer S. et al., "First Examples of Alkenyl Pyridines as Organic Ligands for Phosphorescent Iridium Complexes," Adv. Mater., 16(22):2003-2007 (2004).

Tung, Yung-Liang et al., "Organic Light-Emitting Diodes Based on Charge-Neutral $Ru^{II}$PHosphorescent Emitters," Adv. Mater., 17(8)1059-1064 (2005).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).

Wong, Wai-Yeung, "Multifunctional Iridium Complexes Based on Carbazole Modules as Highly Efficient Electrophosphors," Angew. Chem. Int. Ed., 45:7800-7803 (2006).

Tang, C.W. and VanSlyke, S.A., "Organic Electroluminescent Diodes," Appl. Phys. Lett., 51(12):913-915 (1987).

Adachi, Chihaya et al., "Organic Electroluminescent Device Having a Hole Conductor as an Emitting Layer," Appl. Phys. Lett., 55(15):1489-1491 (1989).

(56) References Cited

OTHER PUBLICATIONS

Ma, Yuguang et al., "Triplet Luminescent Dinuclear-Gold(I) Complex-Based Light-Emitting Diodes with Low Turn-On voltage," *Appl. Phys. Lett.*, 74(10)1361-1363 (1999).
Gao, Zhigiang at al., "Bright-Blue Electroluminescence From a Silyl-Substituted ter-(phenylene-vinylene) derivative," *Appl. Phys. Lett.*, 74(6):865-867 (1999).
Lee, Chang-Lyoul et al., "Polymer Phosphorescent Light-Emitting Devices Doped with Tris(2-phenylpyridine) Iridium as a Triplet Emitter," *Appl. Phys. Lett.*, 77(15):2280-2282 (2000).
Hung, L.S. et al., "Anode Modification in Organic Light-Emitting Diodes by Low-Frequency Plasma Polymerization of $CHF_3$," *Appl. Phys. Lett.*, 78(5):673-675 (2001).
Ikai, Masamichi and Tokito, Shizuo, "Highly Efficient Phosphorescence From Organic Light-Emitting Devices with an Exciton-Block Layer," *Appl. Phys. Lett.*, 79(2):156-158 (2001).
Wang, Y. et al., "Highly Efficient Electroluminescent Materials Based on Fluorinated Organometallic Iridium Compounds," *Appl. Phys. Lett.*, 79(4):449-451 (2001).
Kwong, Raymond C. et al., "High Operational Stability of Electrophosphorescent Devices," *Appl. Phys. Lett.*, 81(1):162-164 (2002).
Holmes, R.J. et al., "Blue Organic Electrophosphorescence Using Exothermic Host-Guest Energy Transfer," *Appl. Phys. Lett.*, 82(15):2422-2424 (2003).
Sotoyama, Wataru et al., "Efficient Organic Light-Emitting Diodes with Phosphorescent Platinum Complexes Containing NCN-Coordinating Tridentate Ligand," *Appl. Phys. Lett.*, 86:153505-1-153505-3 (2005).
Okumoto, Kenji et al., "Green Fluorescent Organic Light-Emitting Device with External Quantum Efficiency of Nearly 10%," *Appl. Phys. Lett.*, 89:063504-1-063504-3 (2006).
Kanno, Hiroshi et al., "Highly Efficient and Stable Red Phosphorescent Organic Light-Emitting Device Using bis[2-(2-benzothiazoyl)phenolato]zinc(II) as host material," *Appl. Phys. Lett.*, 90:123509-1-123509-3 (2007).
Aonuma, Masaki et al., "Material Design of Hole Transport Materials Capable of Thick-Film Formation in Organic Light Emitting Diodes," *Appl. Phys. Lett.*, 90:183503-1-183503-3 (2007).
Sun, Yiru and Forrest, Stephen R., "High-Efficiency White Organic Light Emitting Devices with Three Separate Phosphorescent Emission Layers," *Appl. Phys. Lett.*, 91:263503-1-263503-3 (2007).
Adachi, Chihaya et al., "High-Efficiency Red Electrophosphorescence Devices," *Appl. Phys. Lett.*, 78(11)1622-1624 (2001).
Wong, Keith Man-Chung et al., A Novel Class of Phosphorescent Gold(III) Alkynyl-Based Organic Light-Emitting Devices with Tunable Colour, *Chem. Commun.*, 2906-2908 (2005).
Hamada, Yuji et al., "High Luminance in Organic Electroluminescent Devices with Bis(10-hydroxybenzo[h]quinolinato)beryllium as an Emitter," *Chem. Lett.*, 905-906 (1993).
Nishida, Jun-ichi et al., "Preparation, Characterization, and Electroluminescence Characteristics of α-Diimine-type Platinum(II) Complexes with Perfluorinated Phenyl Groups as Ligands," *Chem. Lett.*, 34(4):592-593 (2005).
Mi, Bao-Xiu et al., "Themally Stable Hole-Transporting Material for Organic Light-Emitting Diode: an Isoindole Derivative," *Chem. Mater.*, 15(16):3148-3151 (2003).

Huang, Wei-Sheng et al., "Highly Phosphorescent Bis-Cyclometalated Iridium Complexes Containing Benzoimidazole-Based Ligands," *Chem. Mater.*, 16(12):2480-2488 (2004).
Niu, Yu-Hua et al., "Highly Efficient Electrophosphorescent Devices with Saturated Red Emission from a Neutral Osmium Complex," *Chem. Mater.*, 17(13):3532-3536 (2005).
Lo, Shih-Chun et al., "Blue Phosphorescence from Iridium(III) Complexes at Room Temperature," *Chem. Mater.*, 18(21):5119-5129 (2006).
Takizawa, Shin-ya et al., "Phosphorescent Iridium Complexes Based on 2-Phenylimidazo[1,2-α]pyridine Ligands: Tuning of Emission Color toward the Blue Region and Application to Polymer Light-Emitting Devices," *Inorg. Chem.*, 46(10):4308-4319 (2007).
Lamansky, Sergey et al., "Synthesis and Characterization of Phosphorescent Cyclometalated Iridium Complexes," *Inorg. Chem.*, 40(7):1704-1711 (2001).
Ranjan, Sudhir et al., "Realizing Green Phosphorescent Light-Emitting Materials from Rhenium(I) Pyrazolato Diimine Complexes," *Inorg. Chem.*, 42(4):1248-1255 (2003).
Noda, Tetsuya and Shirota,Yasuhiko, "5,5'-Bis(dimesitylboryl)-2,2'-bithiophene and 5,5''-Bis(dimesitylboryl)-2,2':5',2''-terthiophene as a Novel Family of Electron-Transporting Amorphous Molecular Materials," *J. Am. Chem. Soc.*, 120 (37):9714-9715 (1998).
Sakamoto, Youichi et al., "Synthesis, Characterization, and Electron-Transport Property of Perfluorinated Phenylene Dendrimers," *J. Am. Chem. Soc.*, 122(8):1832-1833 (2000).
Adachi, Chihaya et al., "Nearly 100% Internal Phosphorescence Efficiency in an Organic Light Emitting Device," *J. Appl. Phys.*, 90(10):5048-5051 (2001).
Shirota, Yasuhiko et al., "Starburst Molecules Based on π-Electron Systems as Materials for Organic Electroluminescent Devices," *Journal of Luminescence*, 72-74:985-991 (1997).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," *J. Mater. Chem.*, 3(3):319-320 (1993).
Kido, Junji et al., 1,2,4-Triazole Derivative as an Electron Transport Layer in Organic Electroluminescent Devices, *Jpn. J. Appl. Phys.*, 32:L917-L920 (1993).
Van Slyke, S. A. et al., "Organic Electroluminescent Devices with Improved Stability," *Appl. Phys. Lett.*, 69(15):2160-2162 (1996).
Guo, Tzung-Fang et al., "Highly Efficient Electrophosphorescent Polymer Light-Emitting Devices," *Organic Electronics*, 1:15-20 (2000).
Palilis, Leonidas C., "High Efficiency Molecular Organic Light-Emitting Diodes Based on Silole Derivatives and Their Exciplexes," *Organic Electronics*, 4:113-121 (2003).
Ikeda, Hisao et al., "P-185: Low-Drive-Voltage OLEDs with a Buffer Layer Having Molybdenum Oxide," *SID Symposium Digest*, 37:923-926 (2006).
T. Östergård et al., "Langmuir-Blodgett Light-Emitting Diodes of Poly(3-Hexylthiophene): Electro-Optical Characteristics Related to Structure," *Synthetic Metals*, 87:171-177 (1997).
Hu, Nan-Xing et al., "Novel High $T_9$ Hole-Transport Molecules Based on Indolo[3,2-b]carbazoles for Organic Light-Emitting Devices," *Synthetic Metals*, 111-112:421-424 (2000).
Salbeck, J. et al., "Low Molecular Organic Glasses for Blue Electroluminescence," *Synthetic Metals*, 91:209-215 (1997).
International Search Report issued in PCT/US2011/055438 application.

ORGANIC ELECTROLUMINESCENT MATERIALS AND DEVICES

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs). More specifically, the present invention relates to phosphorescent materials containing a 3,9-linked oligocarbazole and dibenzothiophene or dibenzofuran. These materials may provide devices having improved performance.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the structure:

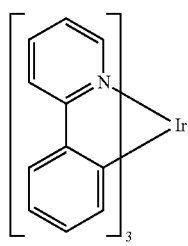

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

Compounds comprising a 3,9-linked oligocarbazole and a dibenzo or aza-dibenzo moiety are provided. The compound have the formula:

Formula I

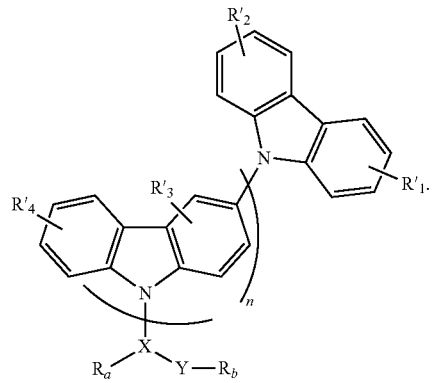

n is 1-20. Preferably, n is 1, 2, or 3. Most preferably, n is 1. Each of $R'_1$, $R'_2$, $R'_3$, and $R'_4$ independently represent mono, di, tri or tetra substitutions. $R'_1$, $R'_2$, $R'_3$, and $R'_4$ are independently selected from the group consisting of hydrogen, deuterium, alkyl, alkoxy, amino, alkenyl, alkynyl, arylkyl, aryl, and heteroaryl. $R_a$ and $R_b$ independently represent mono, di, tri, or tetra substitutions. $R_a$ and $R_b$ are independently selected from the group consisting of hydrogen, deuterium, alkyl, alkoxy, amino, alkenyl, alkynyl, arylkyl, aryl, and heteroaryl. X is an aryl or heteroaryl linker further substituted with $R_a$. Y is dibenzothiophene, dibenzofuran, dibenzoselenophene, aza-dibenzothiophene, aza-dibenzofuran, or aza-dibenzoselenophene that is further substituted with $R_b$. Preferably, Y is 2-dibenzothiophenyl, 4-dibenzothiophenyl, 2-dibenzofuranyl, or 4-dibenzofuranyl.

In one aspect, X is

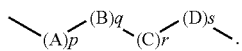

A, B, C and D are independently selected from the group consisting of:

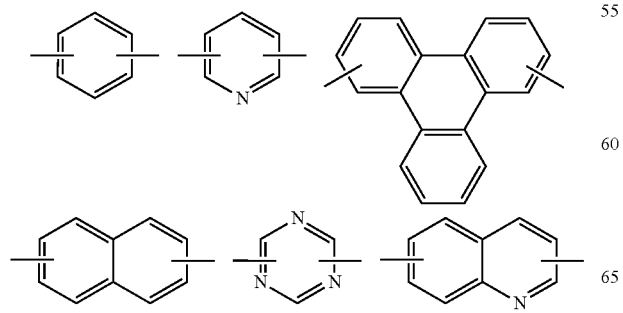

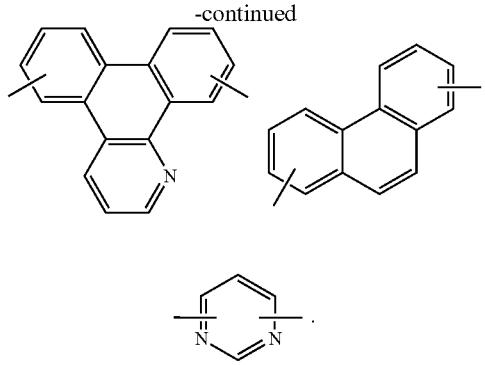

A, B, C and D are optionally further substituted with $R_a$. Each of p, q, r and s are 0, 1, 2, 3, or 4. p+q+r+s is at least 1.

Specific examples of the compounds are provided. In one aspect, the compound is selected from the group consisting of Compound 1-Compound 83.

An organic light emitting device is also provided. The device comprises an anode, a cathode, and a first organic layer disposed between the anode and the cathode. The organic layer comprises a compound having the formula:

Formula I

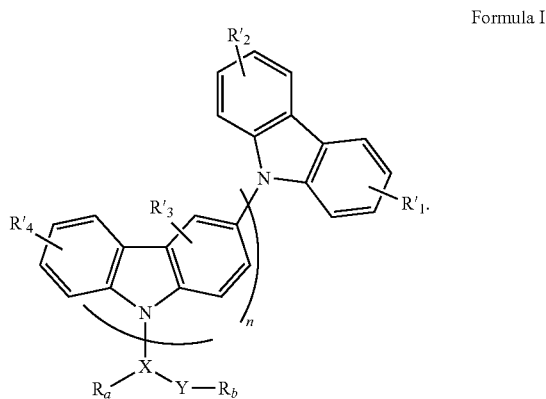

n is 1-20. Preferably, n is 1, 2, or 3. Most preferably, n is 1. Each of $R'_1$, $R'_2$, $R'_3$, and $R'_4$ independently represent mono, di, tri or tetra substitutions. $R'_1$, $R'_2$, $R'_3$, and $R'_4$ are independently selected from the group consisting of hydrogen, deuterium, alkyl, alkoxy, amino, alkenyl, alkynyl, arylkyl, aryl, and heteroaryl. $R_a$ and $R_b$ independently represent mono, di, tri, or tetra substitutions. $R_a$ and $R_b$ are independently selected from the group consisting of hydrogen, deuterium, alkyl, alkoxy, amino, alkenyl, alkynyl, arylkyl, aryl, and heteroaryl. X is an aryl or heteroaryl linker further substituted with $R_a$. Y is dibenzothiophene, dibenzofuran, dibenzoselenophene, aza-dibenzothiophene, aza-dibenzofuran, or aza-dibenzoselenophene that is further substituted with $R_b$. Preferably, Y is 2-dibenzothiophenyl, 4-dibenzothiophenyl, 2-dibenzofuranyl, or 4-dibenzofuranyl.

In one aspect, X is

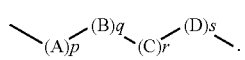

A, B, C and D are independently selected from the group consisting of:

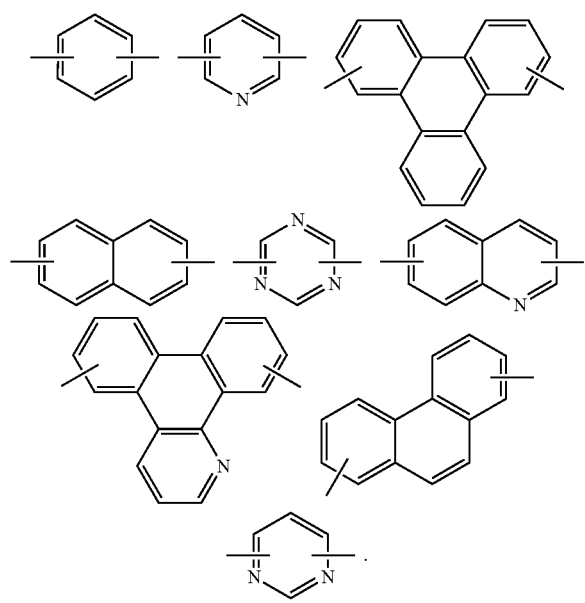

A, B, C and D are optionally further substituted with $R_a$. Each of p, q, r and s are 0, 1, 2, 3, or 4. p+q+r+s is at least 1.

Specific examples of devices comprising the compounds are provided. In one aspect, the compound is selected from the group consisting of Compound 1-Compound 83.

In one aspect, the first organic layer is an emissive layer and the compound having

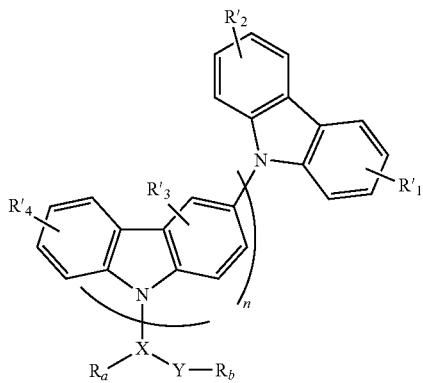

Formula I is a host.

In another aspect, the first organic layer further comprises an emissive dopant having the formula

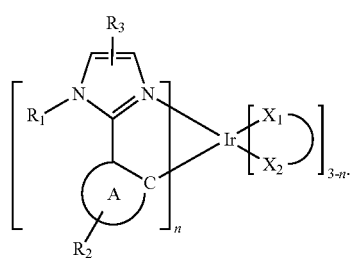

A is a 5 or 6 membered carbocyclic or heterocyclic ring. $R_1$, $R_2$, and $R_3$ independently represent mono, di, tri or tetra substituents. Each of $R_1$, $R_2$, and $R_3$ are independently selected from the group consisting of hydrogen, deuterium, alkyl, alkoxy, amino, alkenyl, alkynyl, arylkyl, aryl, and heteroaryl. n is 1, 2, or 3. X—Y is an ancillary ligand.

In a further aspect, the emissive dopant is selected from the group consisting of:

Compound H

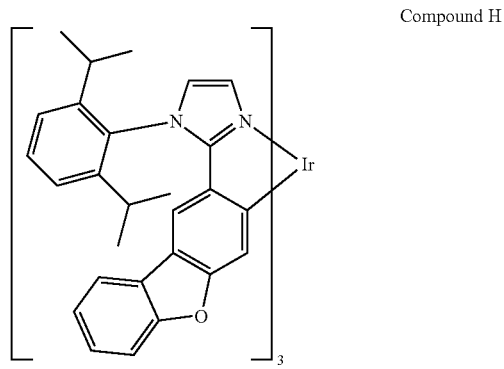

Compound I

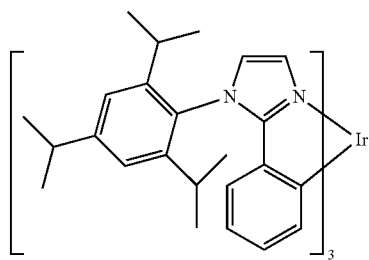

Compound J

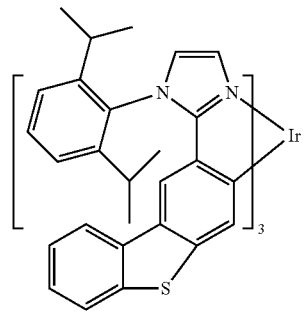

Compound K

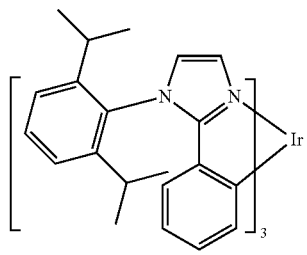

Compound L

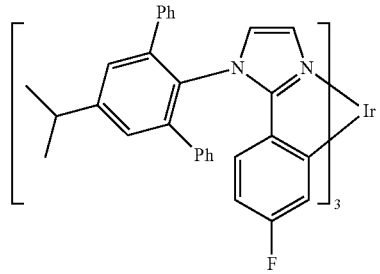

-continued

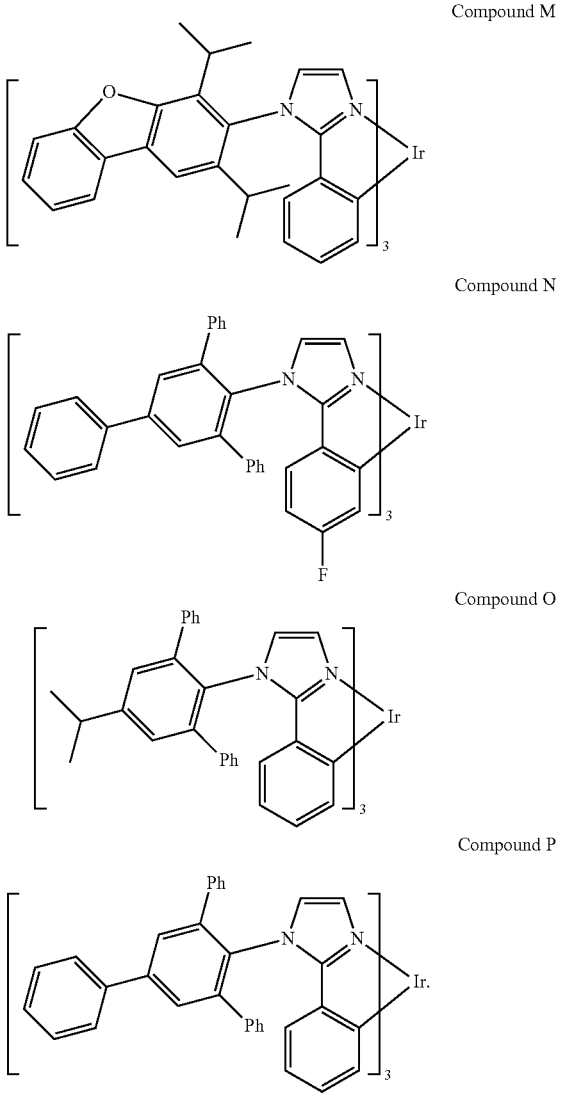

In yet another aspect, the device further comprises a second organic layer that is a non-emissive layer and the compound having Formula I is a material in the second organic layer.

In one aspect, the second organic layer is an electron transporting layer and the compound having Formula I is an electron transporting material in the second organic layer.

In another aspect, the second organic layer is a blocking layer and the compound having Formula I is a blocking material in the second organic layer.

In one aspect, the first organic layer is disposed using solution processing.

In one aspect, the device is an organic light emitting device. In another aspect, the device is a consumer product.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
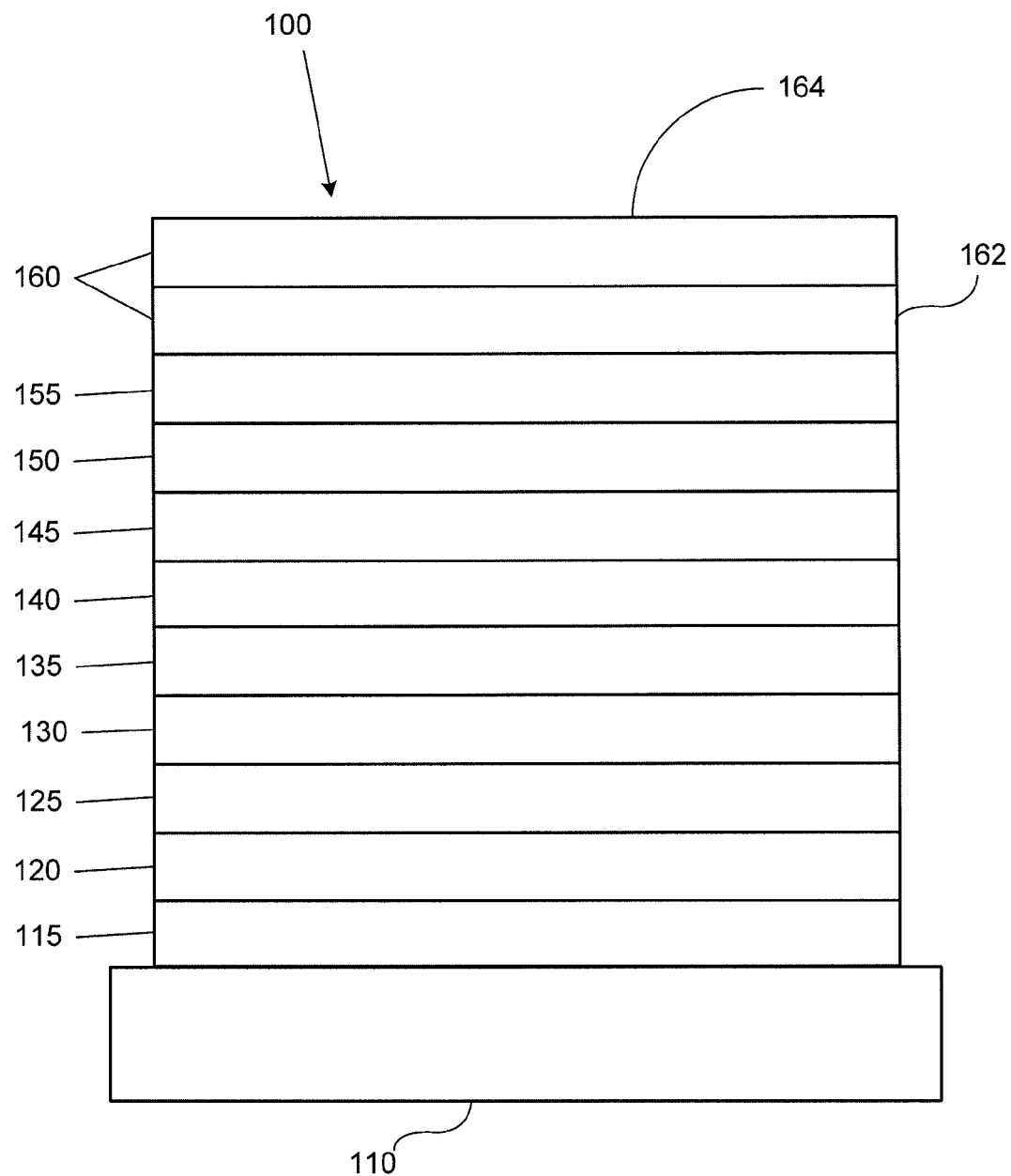
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
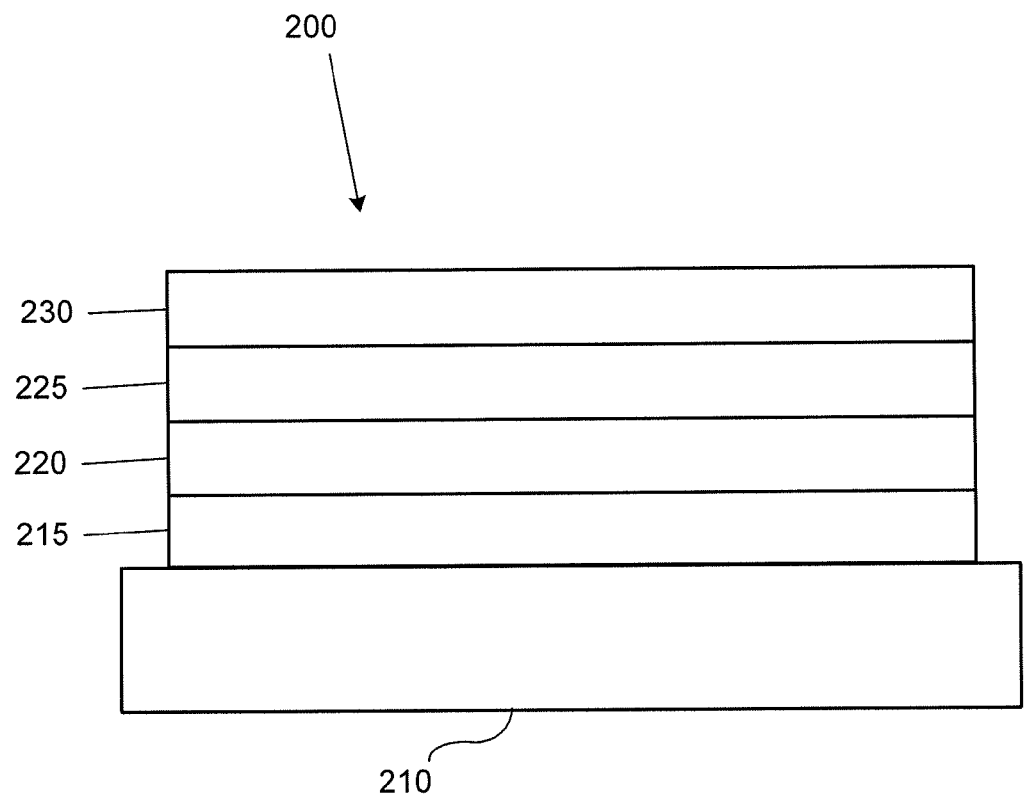
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

Figure 3:
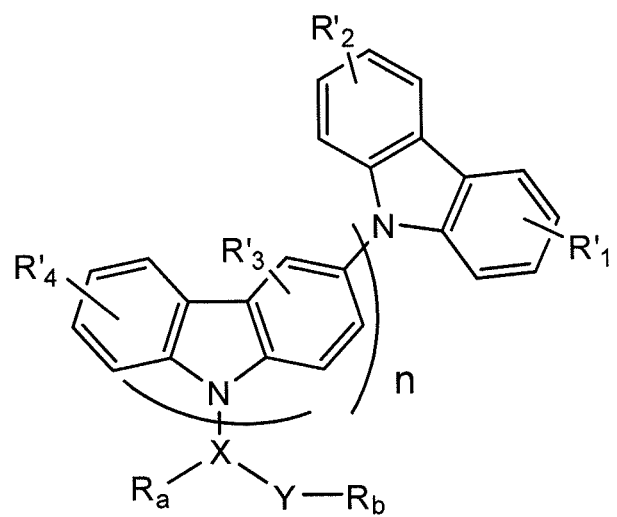
FIG. 3 shows a compound containing a 3,9-linked oligocarbazole and a dibenzo or aza-dibenzo group.

Novel compounds containing a 3,9-linked oligocarbazole and a dibenzo or aza-dibenzo group are provided (illustrated in FIG. 3). In particular, the compounds comprise a 3,9-linked oligocarbazole moiety and a dibenzothiophene (DBT), dibenzofuran (DBF), dibenzoselenophene, aza-dibenzothiophene (aza-DBT), aza-dibenzofuran (aza-DBF), or aza-dibenzoselenophene, such that the 3,9-linked oligocarbazole moiety and the dibenzo or aza-dibenzo moiety are separated by an aromatic spacer. The compounds may be used as non-emissive materials for phosphorescent OLEDs. For example, the compounds may be used as host materials, electron transporting materials and/or materials in a blocking layer.

A mentioned above, the compounds consist of 3,9-linked oligocarbazole and dibenzo moiety, e.g., DBT or DBF fragments, or aza-dibenzo moiety, e.g., aza-DBT or aza-DBF, separated by aromatic spacers. Without being limited as to any theory regarding how embodiments of the invention work, the HOMO of the compound is controlled by the 3,9-linked oligocarbazole moiety, and the LUMO is controlled by the dibenzo moiety or aza-dibenzo moiety. The aromatic spacer can be designed to extend the conjugation. Without being bound by theory, it is believed that compounds with extended conjugation have improved stability because the charge is delocalized over a greater area. The compound provides good tunability of the HOMO and the LUMO. The compounds showed improved device performance (i.e. efficiency, voltage and lifetime) when used a host for a light blue PHOLED. It is believed that selecting the 3,9-linked oligocarbazole and dibenzo or aza-dibenzo moieties and their connection to one another via the aromatic spacer may keep the triplet value of these compounds in the blue part of the spectrum. These compounds not only can serve as a host, but they also can function as an electron transporting material or material in a blocking layer.

In addition to improved charge balance and charge stability, the compounds provided herein may also provide better film formation. In particular, materials having an asymmetrical structure may offer improved film formation. The improved film formation may be a result of increased tendency to stay amorphous even at elevated temperatures due to the asymmetrical structure of the compound, as evidenced by unexpected results from solution processing devices using the compounds as a host material.

Compounds comprising a 3,9-linked oligocarbazole and a dibenzo or aza-dibenzo moiety are provided. The compound has the formula:

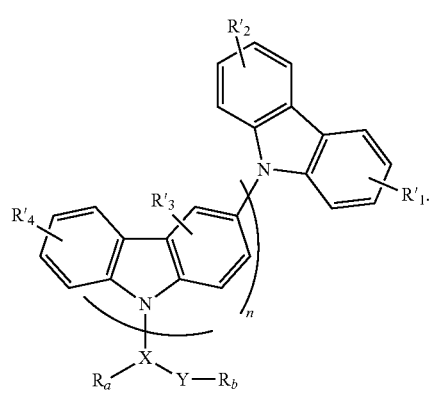

Formula I n is 1-20. Preferably, n is 1, 2, or 3. Most preferably, n is 1. Each of $R'_1$, $R'_2$, $R'_3$, and $R'_4$ independently represent mono, di, tri or tetra substitutions. $R'_1$, $R'_2$, $R'_3$, and $R'_4$ are independently selected from the group consisting of hydrogen, deuterium, alkyl, alkoxy, amino, alkenyl, alkynyl, arylkyl, aryl, and heteroaryl. $R_a$ and $R_b$ independently represent mono, di, tri, or tetra substitutions. $R_a$ and $R_b$ are independently selected from the group consisting of hydrogen, deuterium, alkyl, alkoxy, amino, alkenyl, alkynyl, arylkyl, aryl, and heteroaryl. X is an aryl or heteroaryl linker further substituted with $R_a$. Y is dibenzothiophene, dibenzofuran, dibenzoselenophene, aza-dibenzothiophene, aza-dibenzofuran, or aza-dibenzoselenophene that is further substituted with $R_b$. Preferably, Y is 2-dibenzothiophenyl, 4-dibenzothiophenyl, 2-dibenzofuranyl, or 4-dibenzofuranyl.

In one aspect, X is

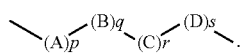

A, B, C and D are independently selected from the group consisting of:

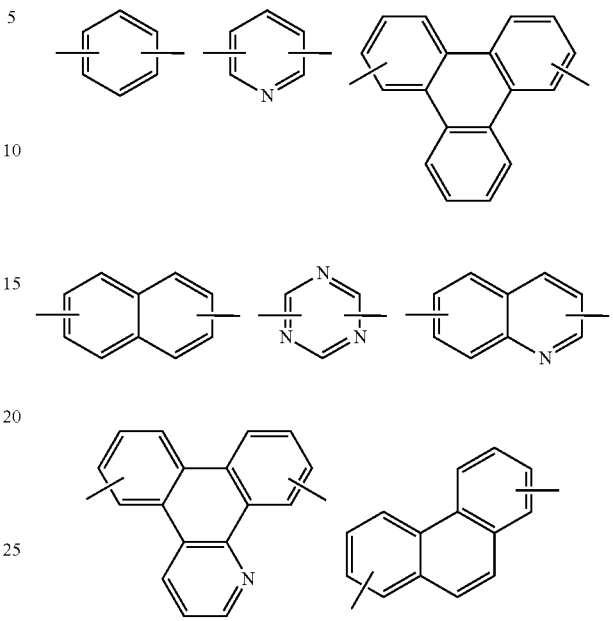

A, B, C and D are optionally further substituted with $R_a$. Each of p, q, r and s are 0, 1, 2, 3, or 4. p+q+r+s is at least 1.

Specific examples of the compounds are provided. In one aspect, the compound is selected from the group consisting of:

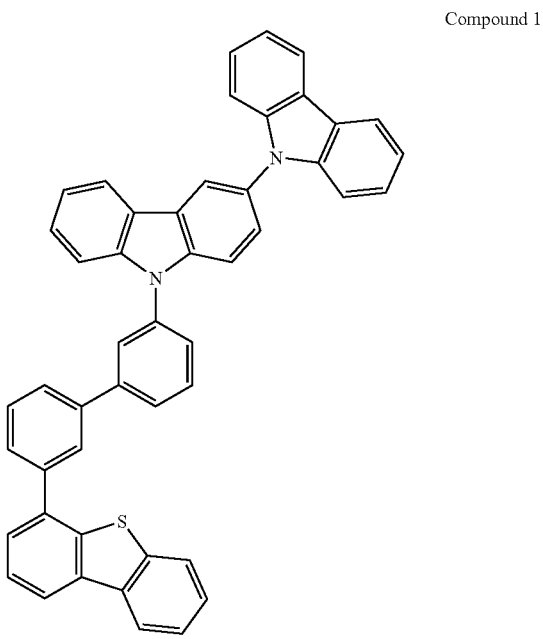

Compound 1

Compound 2
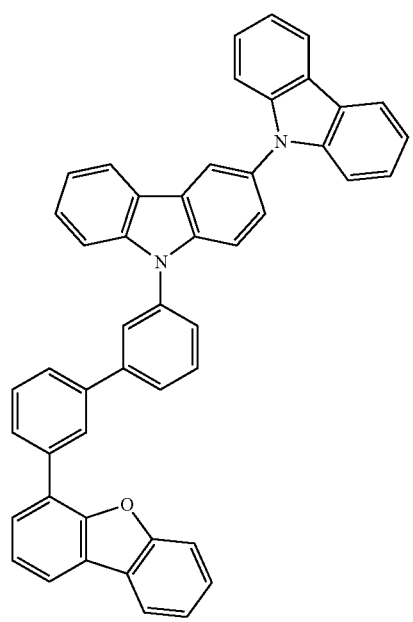
Compound 6
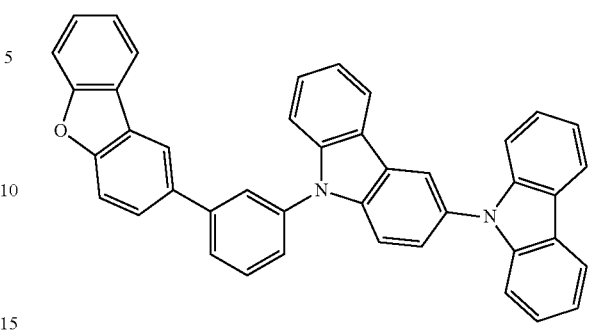
Compound 7
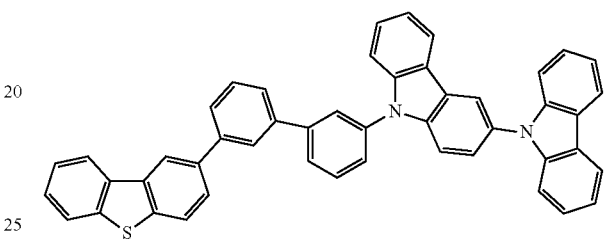
Compound 3
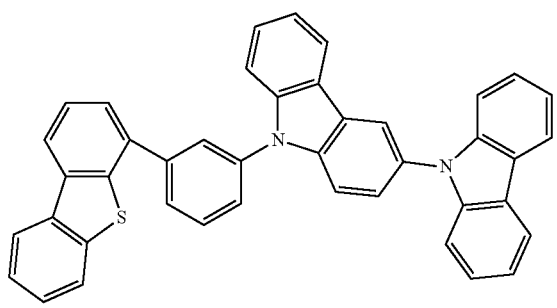
Compound 8
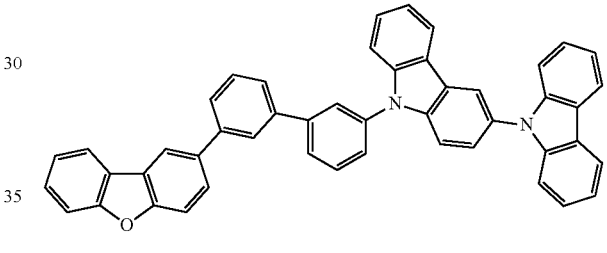
Compound 4
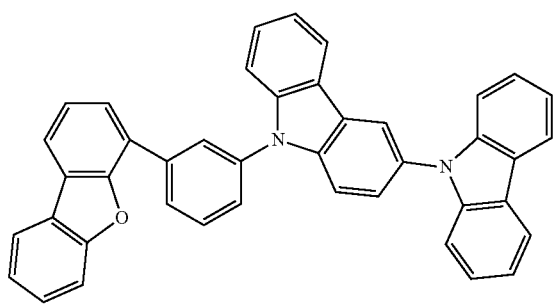
Compound 9
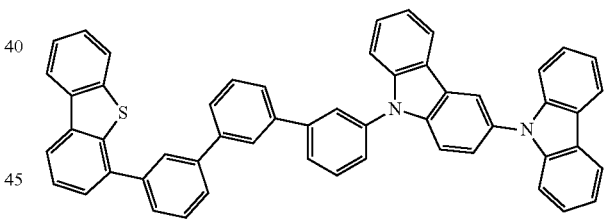
Compound 5
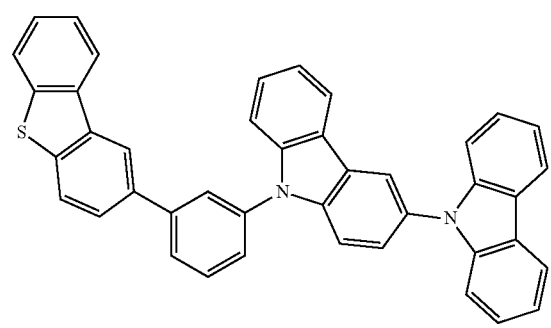
Compound 10
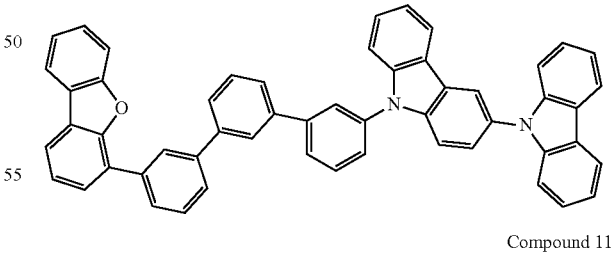
Compound 11
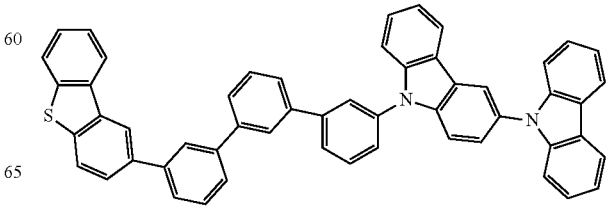

Compound 12
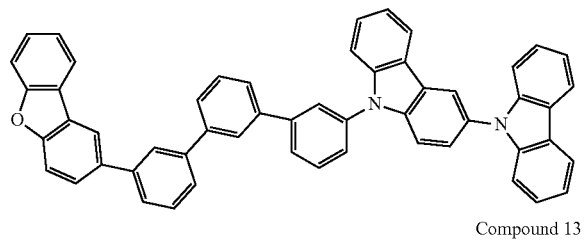
Compound 13
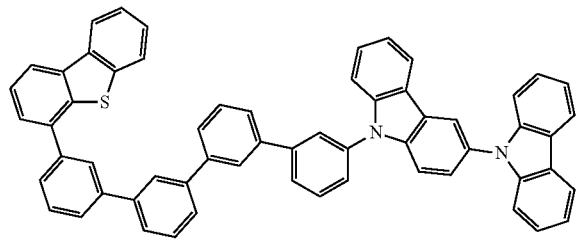
Compound 14
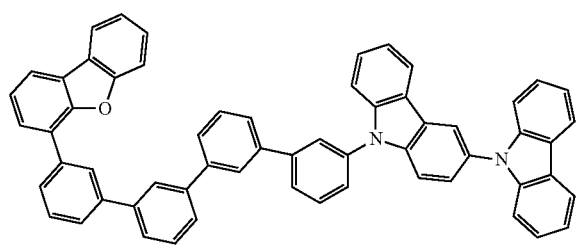
Compound 15
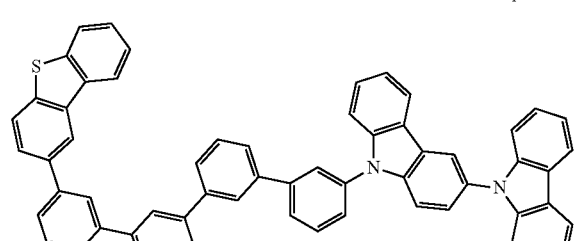
Compound 16
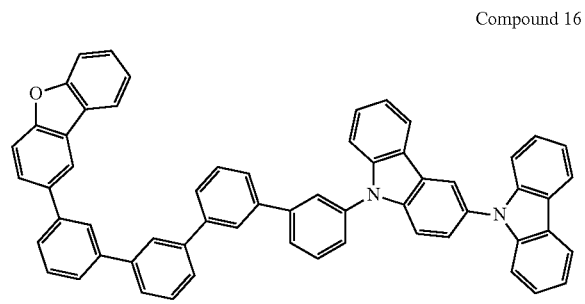
Compound 17
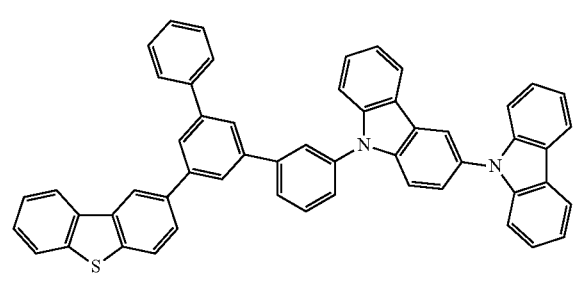
Compound 18
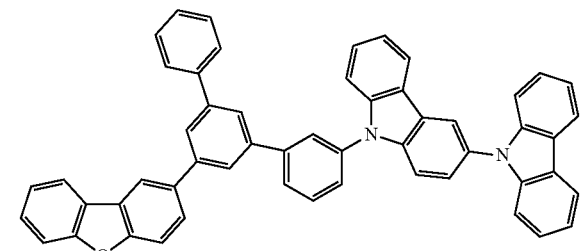
Compound 19
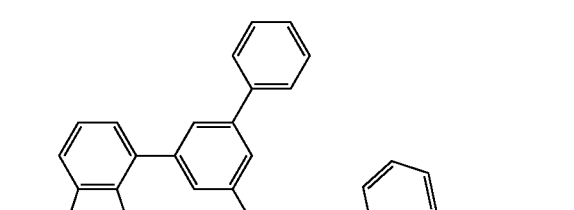
Compound 20
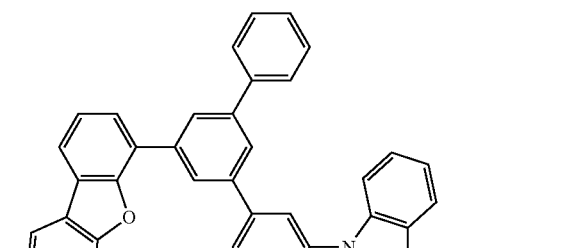
Compound 21
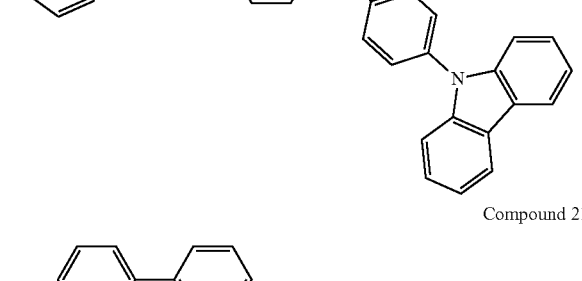
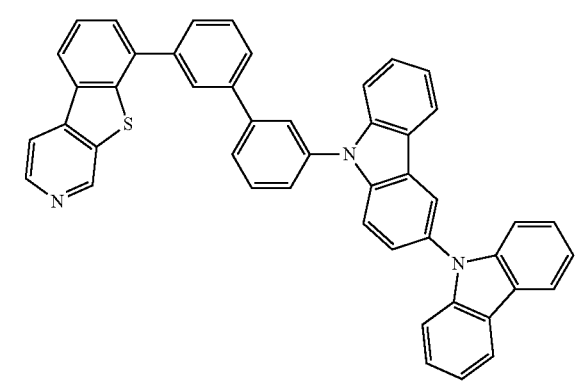

-continued
Compound 22
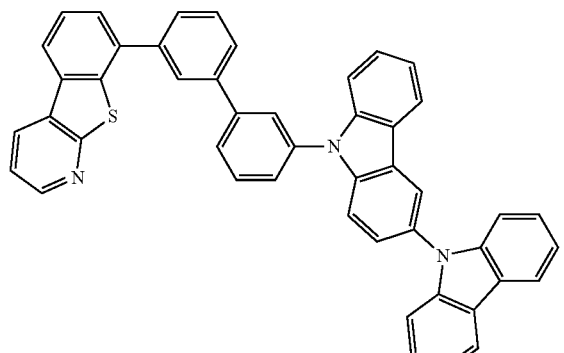
Compound 23
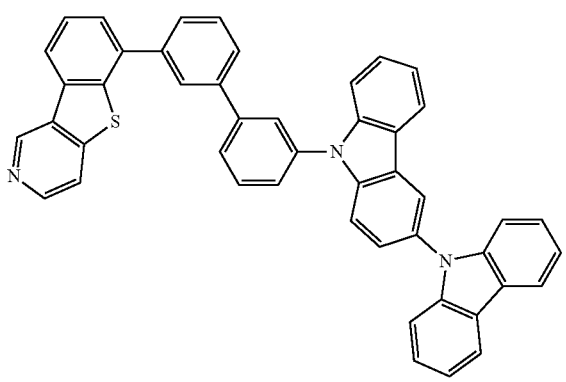
Compound 24
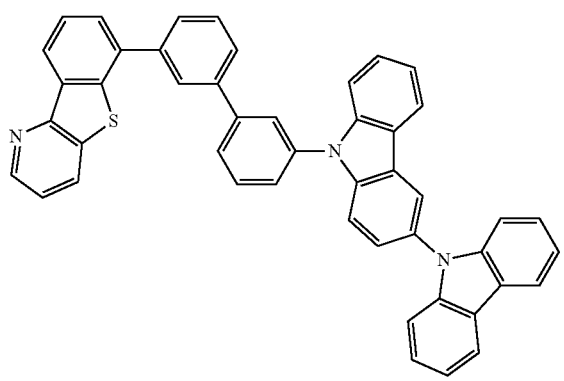
Compound 25
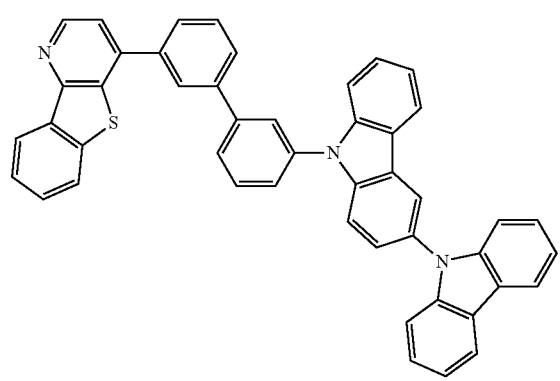
-continued
Compound 26
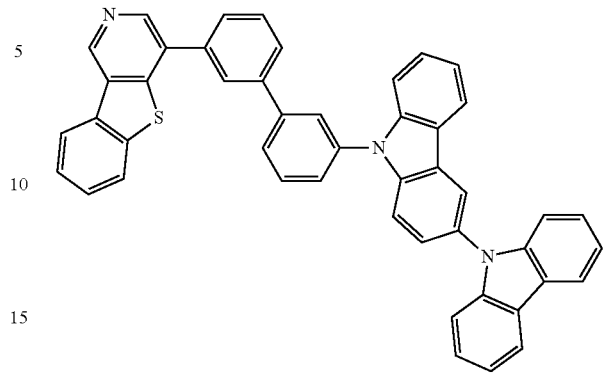
Compound 27
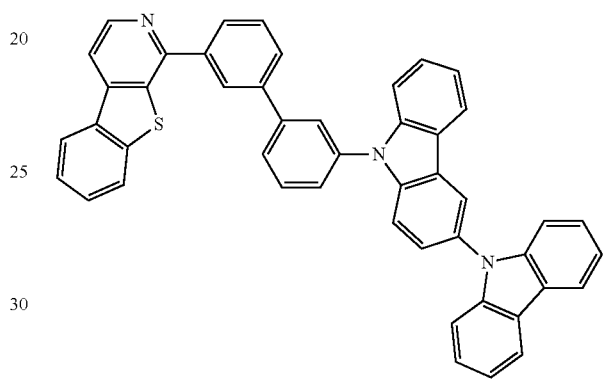
Compound 28
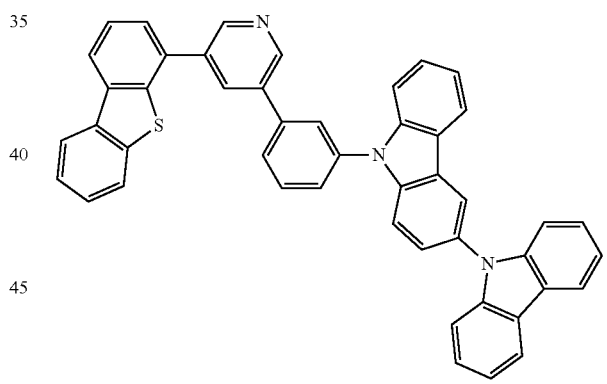
Compound 29

Compound 30
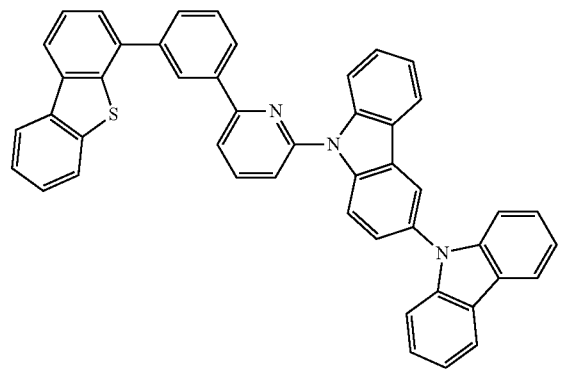
Compound 34
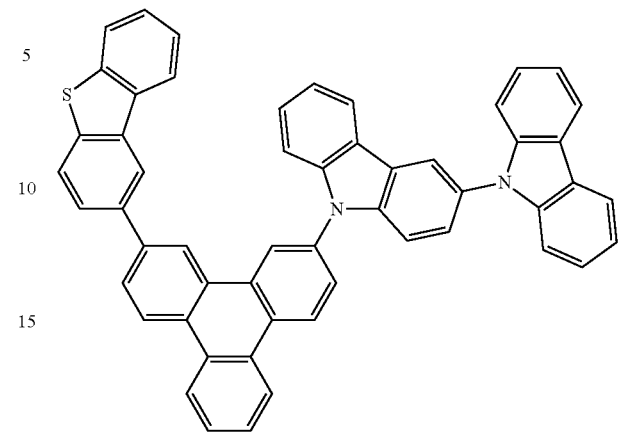
Compound 31
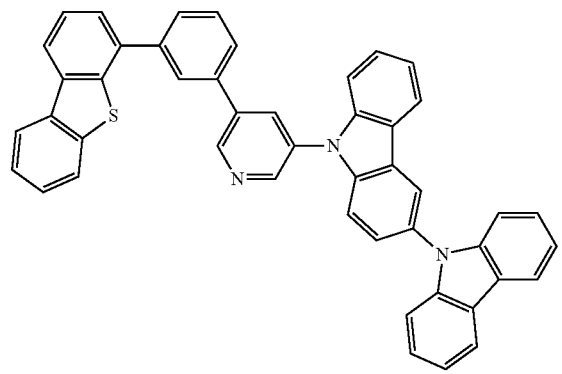
Compound 35
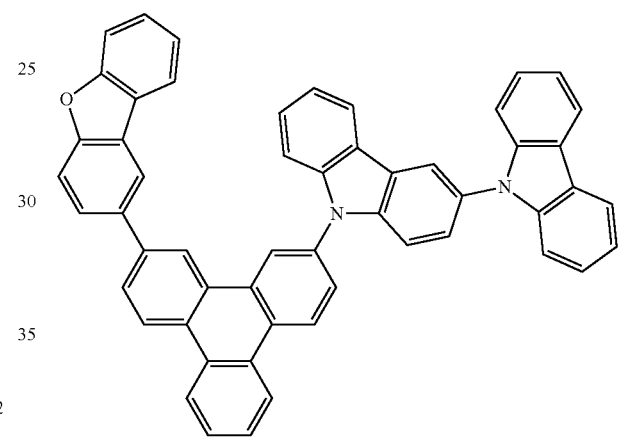
Compound 32
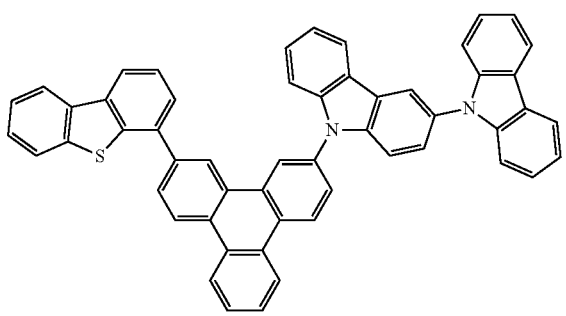
Compound 36
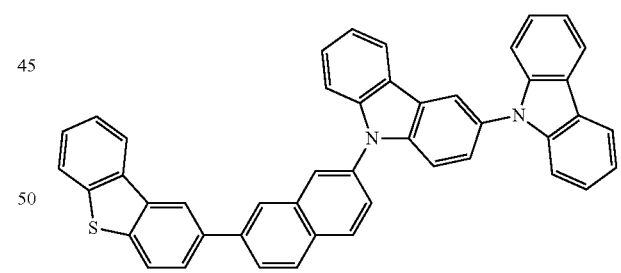
Compound 33
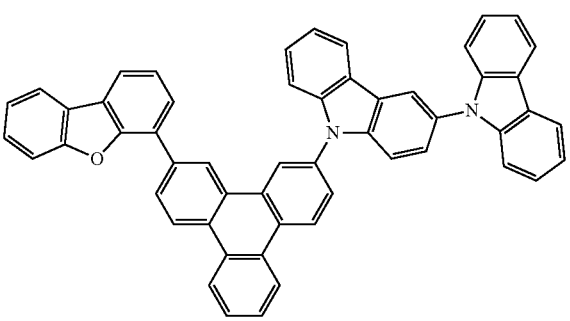
Compound 37
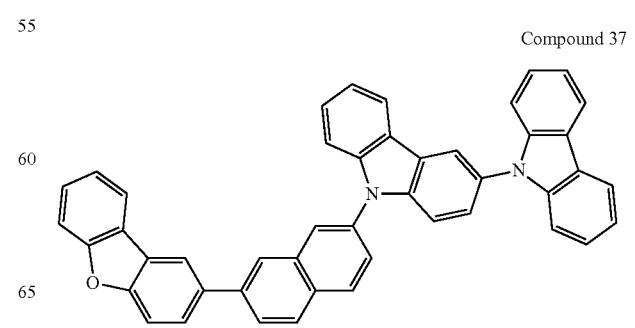

Compound 38
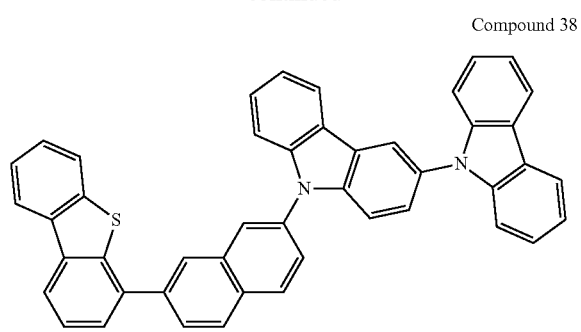
Compound 43
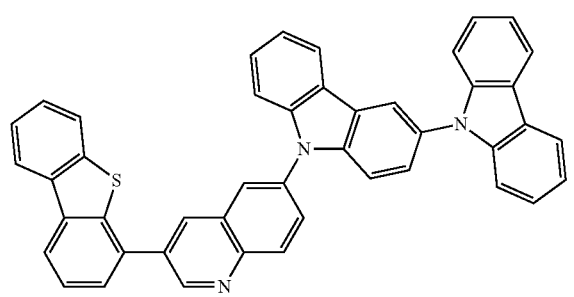
Compound 39
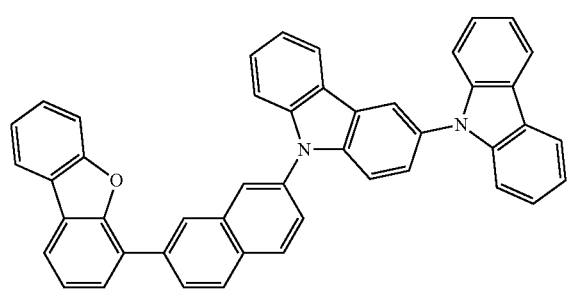
Compound 44
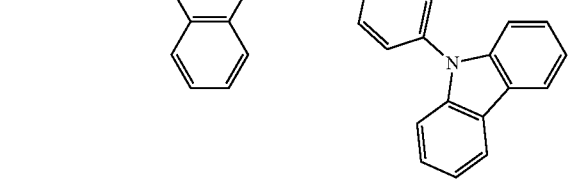
Compound 40
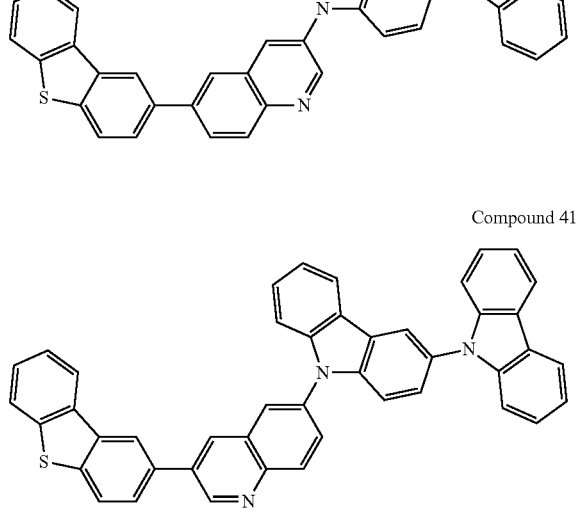
Compound 45
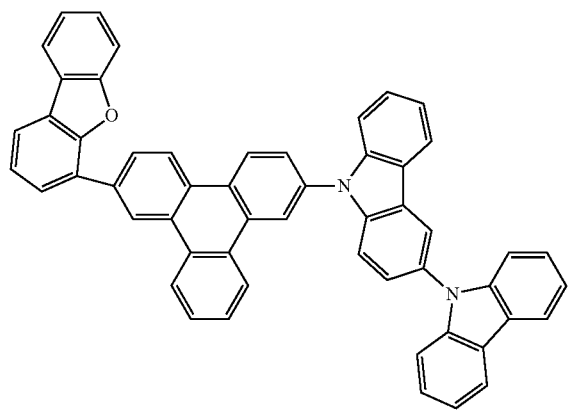
Compound 41
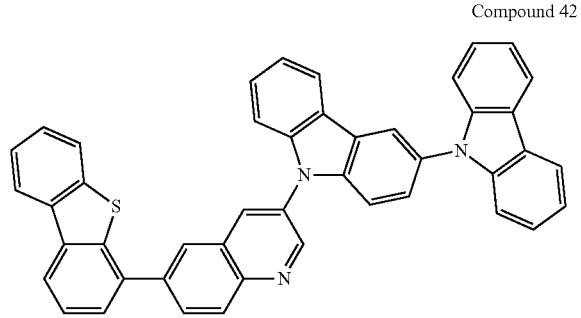
Compound 46
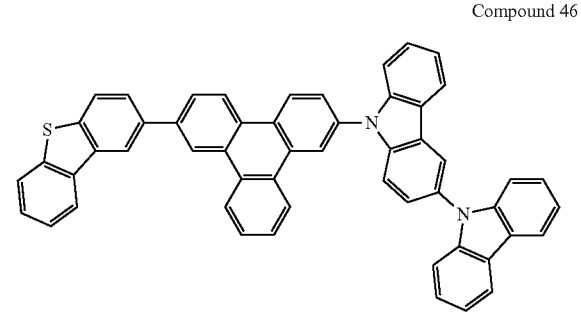
Compound 42

Compound 47
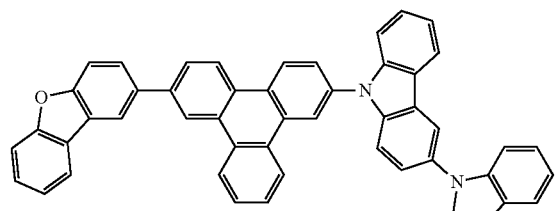
Compound 52
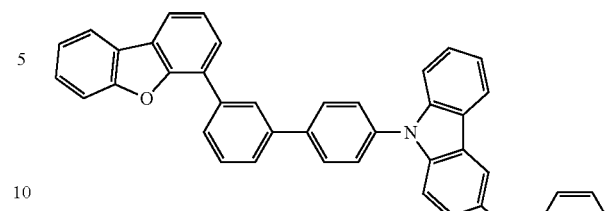
Compound 48
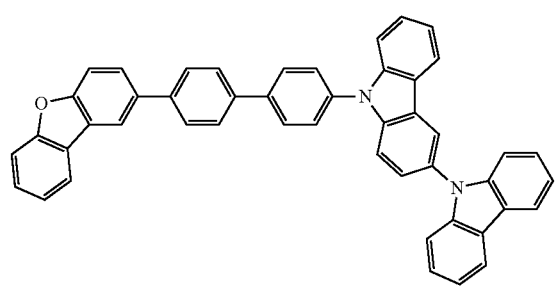
Compound 53
Compound 49
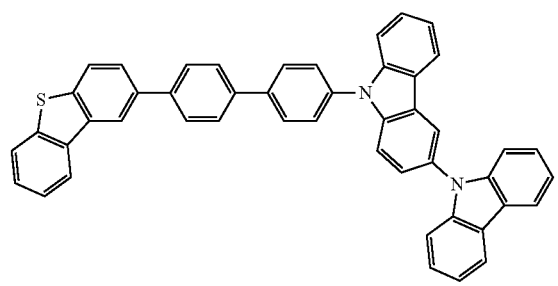
Compound 54
Compound 50
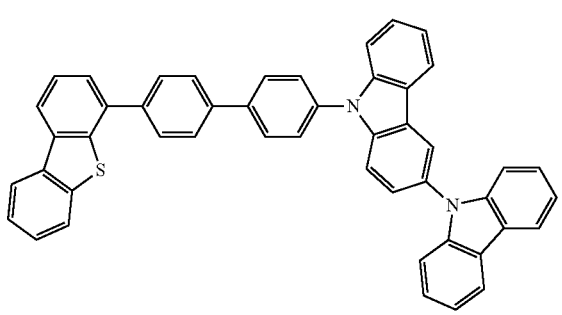
Compound 55
Compound 51
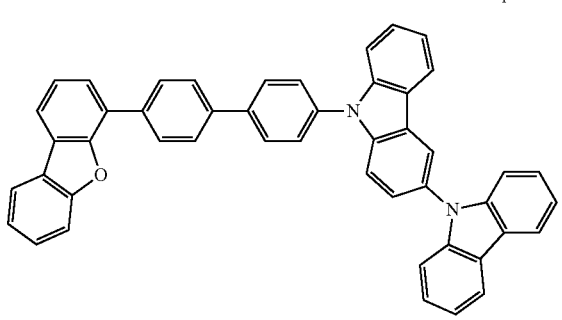
Compound 56

Compound 57
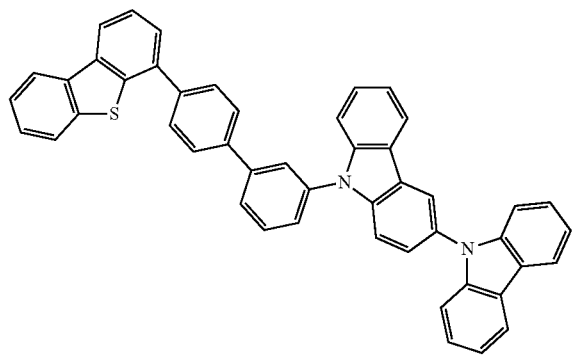
Compound 58
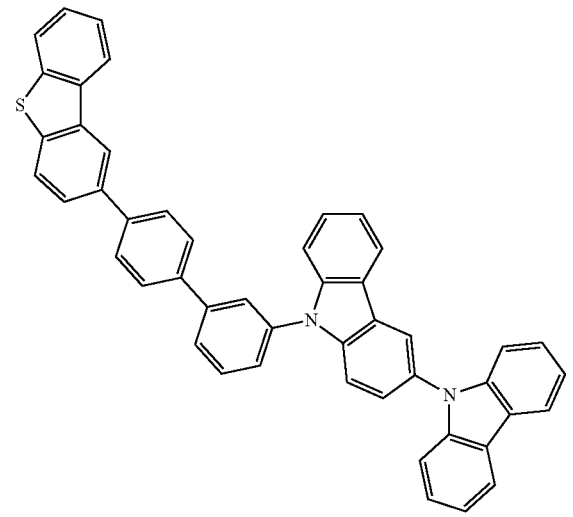
Compound 59
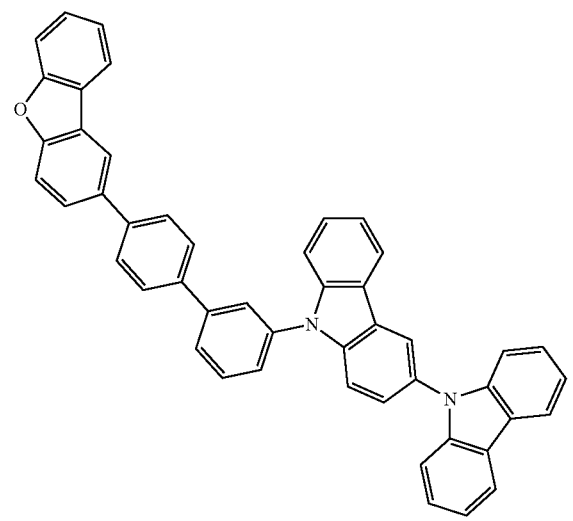
Compound 60
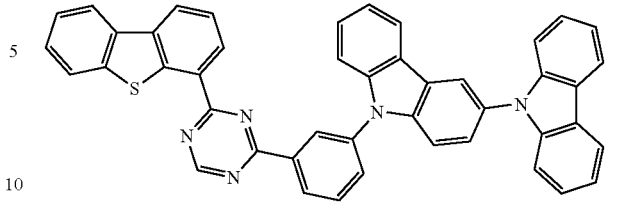
Compound 61
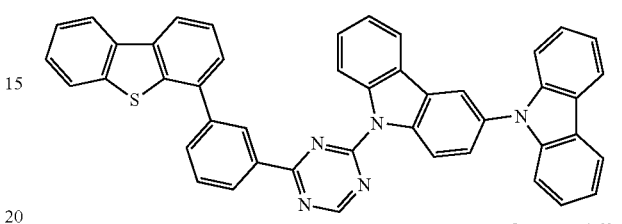
Compound 62
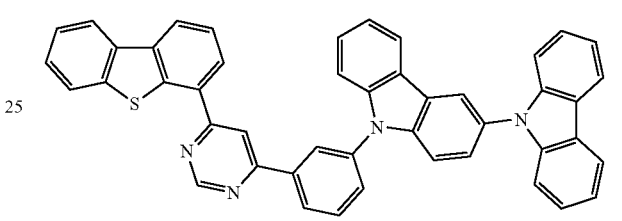
Compound 63
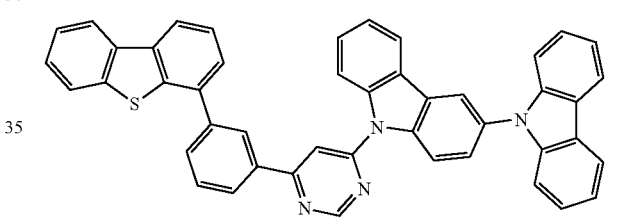
Compound 64
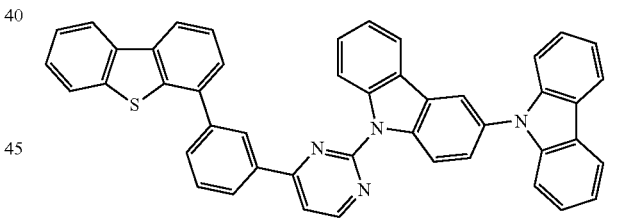
Compound 65
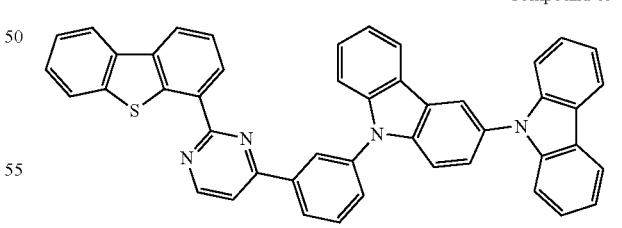
Compound 66
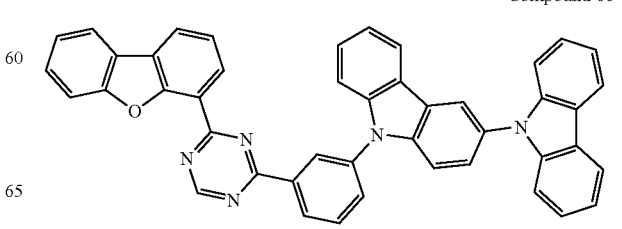

Compound 67
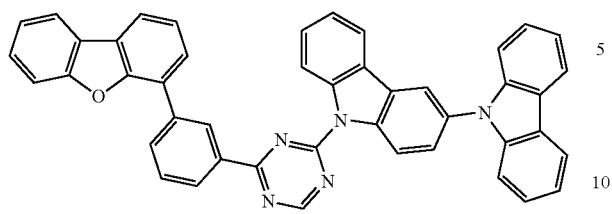
Compound 68
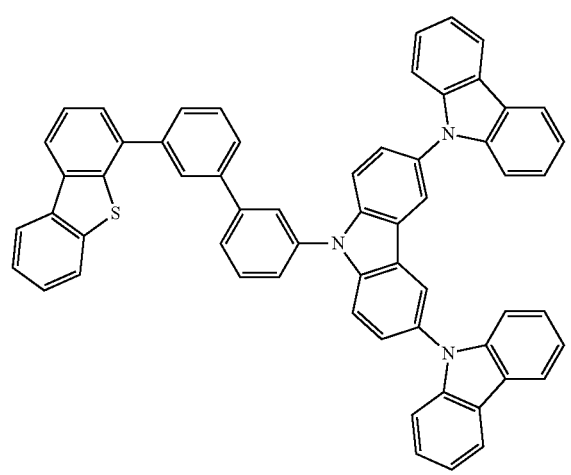
Compound 69
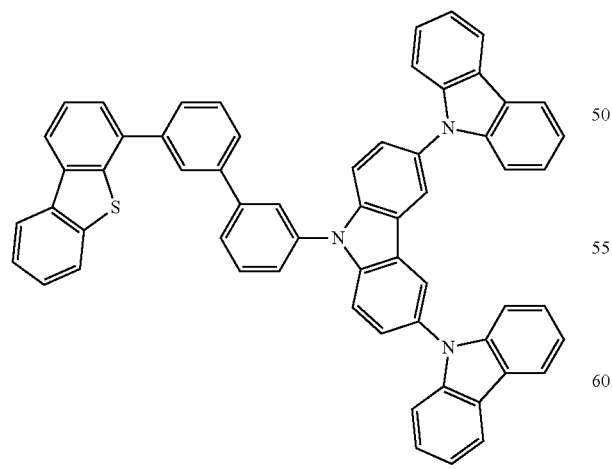
Compound 70
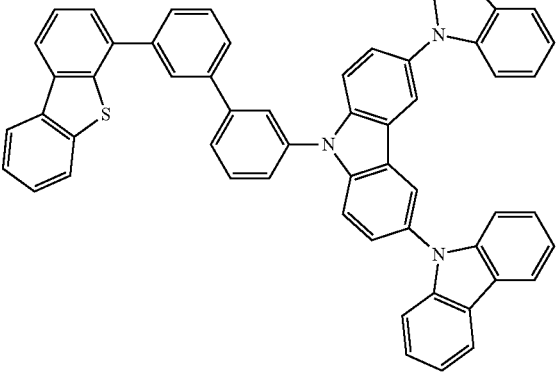
Compound 71
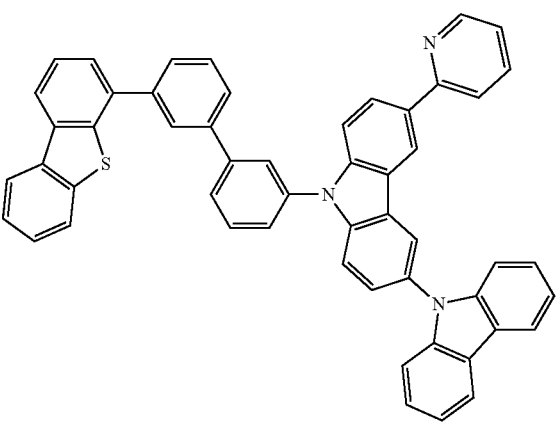
Compound 72
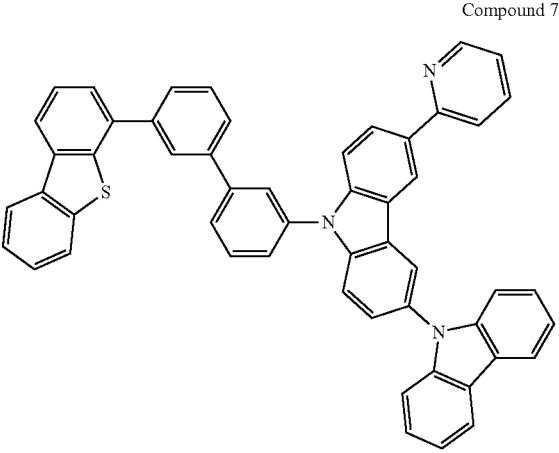

Compound 73
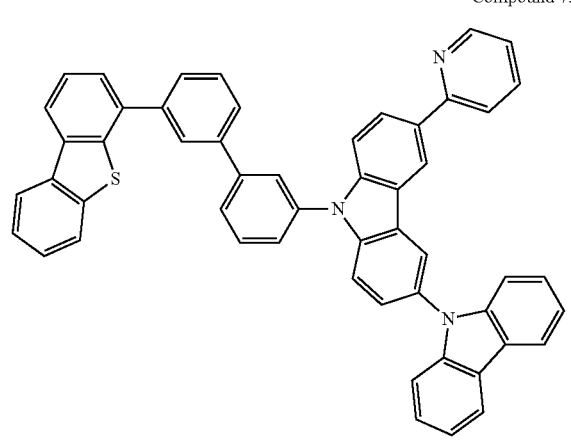
Compound 76
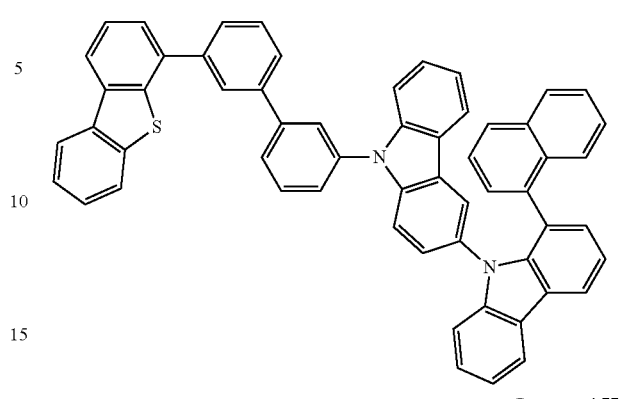
Compound 74
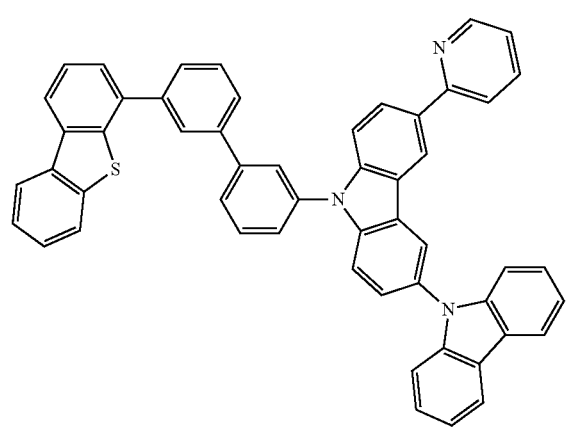
Compound 77
Compound 78
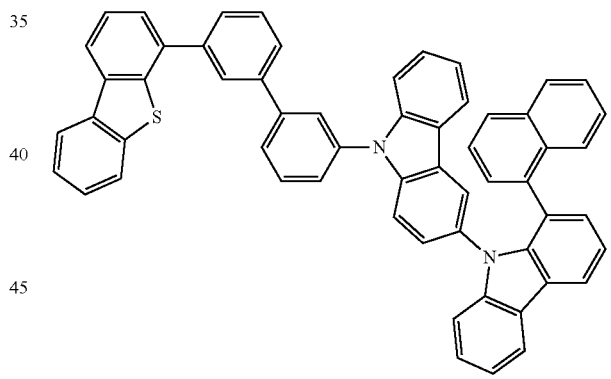
Compound 75
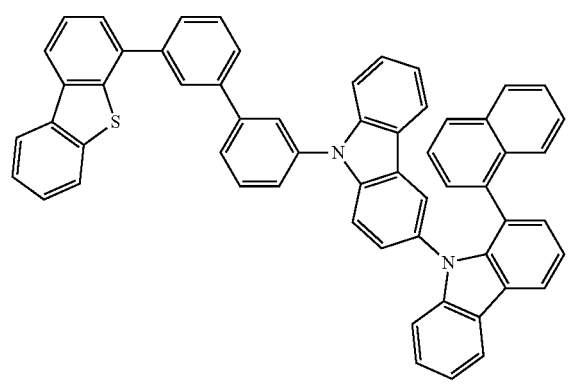
Compound 79
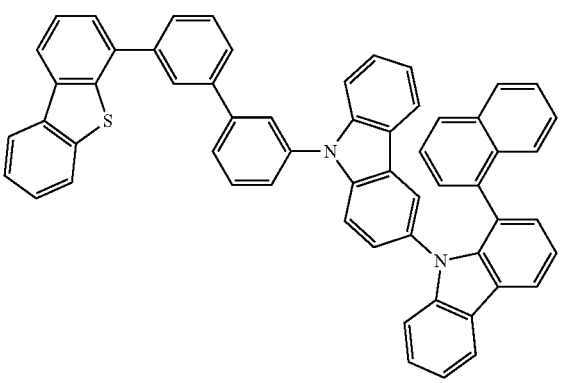

Compound 80

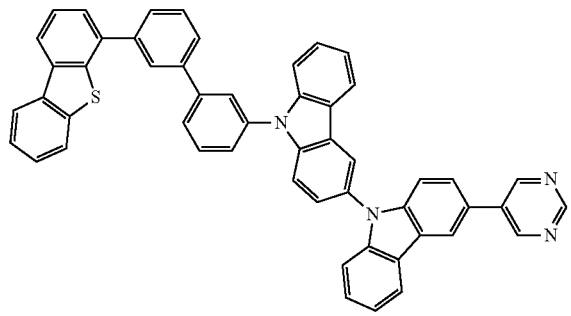

Compound 81

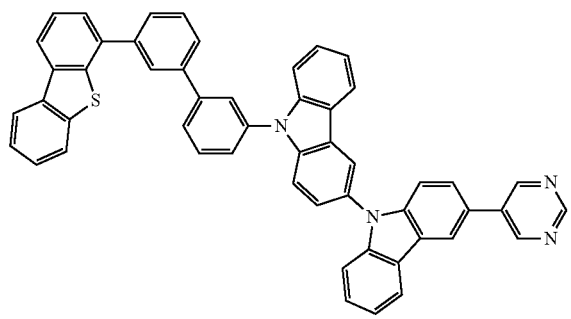

Compound 82

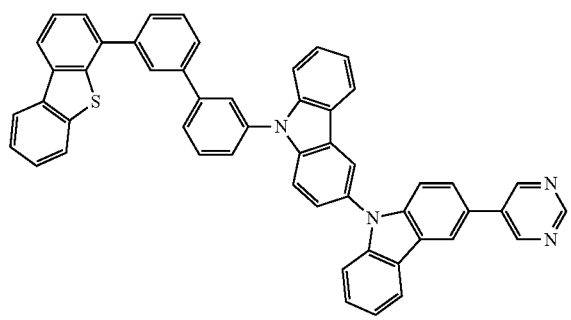

Compound 83

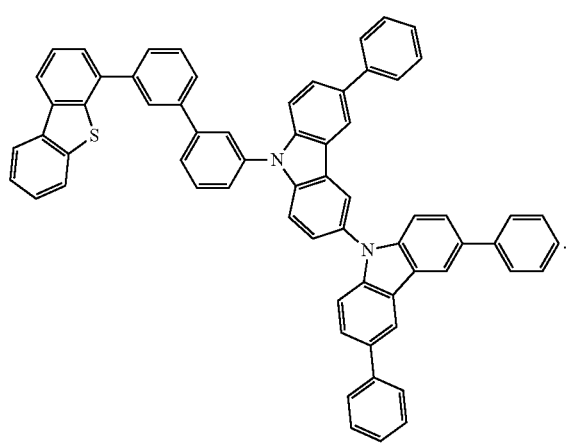

A first device comprising an organic light emitting device is also provided. The organic light emitting device comprises an anode, a cathode, and a first organic layer disposed between the anode and the cathode. The organic layer comprises a compound having the formula:

Formula I

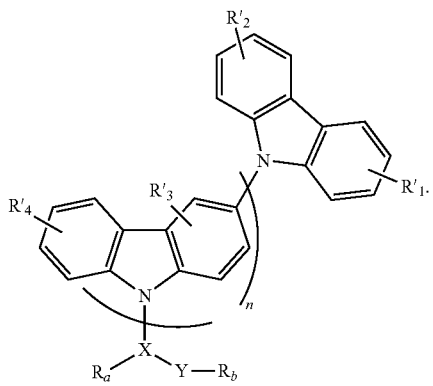

n is 1-20. Preferably, n is 1, 2, or 3. Most preferably, n is 1. Each of $R'_1$, $R'_2$, $R'_3$, and $R'_4$ independently represent mono, di, tri or tetra substitutions. $R'_1$, $R'_2$, $R'_3$, and $R'_4$ are independently selected from the group consisting of hydrogen, deuterium, alkyl, alkoxy, amino, alkenyl, alkynyl, arylkyl, aryl, and heteroaryl. $R_a$ and $R_b$ independently represent mono, di, tri, or tetra substitutions. $R_a$ and $R_b$ are independently selected from the group consisting of hydrogen, deuterium, alkyl, alkoxy, amino, alkenyl, alkynyl, arylkyl, aryl, and heteroaryl. X is an aryl or heteroaryl linker further substituted with $R_a$. Y is dibenzothiophene, dibenzofuran, dibenzoselenophene, aza-dibenzothiophene, aza-dibenzofuran, or aza-dibenzoselenophene that is further substituted with $R_b$. Preferably, Y is 2-dibenzothiophenyl, 4-dibenzothiophenyl, 2-dibenzofuranyl, or 4-dibenzofuranyl.

In one aspect, X is

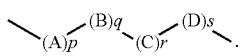

A, B, C and D are independently selected from the group consisting of:

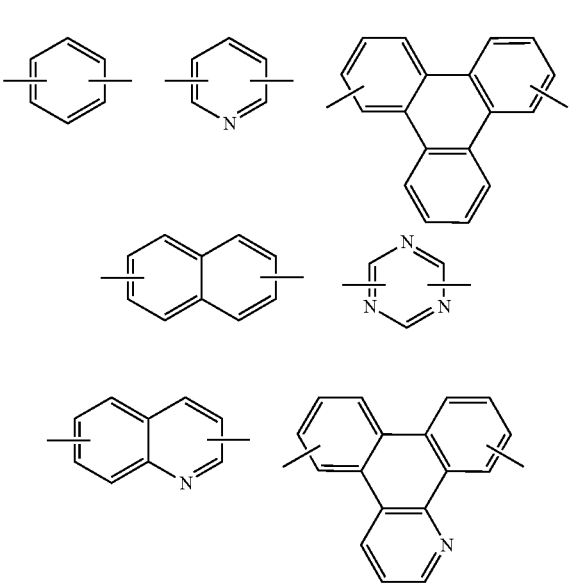

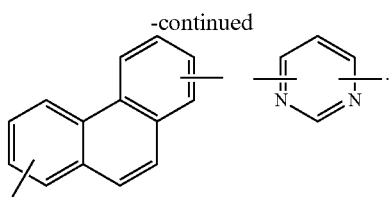

A, B, C and D are optionally further substituted with $R_a$. Each of p, q, r and s are 0, 1, 2, 3, or 4. p+q+r+s is at least 1.

Specific examples of devices comprising the compounds are provided. In one aspect, the compound is selected from the group consisting of Compound 1-Compound 83.

In one aspect, the first organic layer is an emissive layer and the compound having

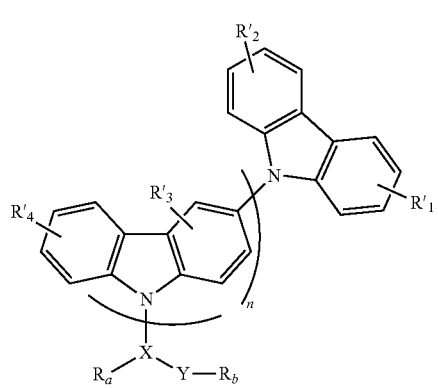

Formula I is a host.

In another aspect, the first organic layer further comprises an emissive dopant having the formula

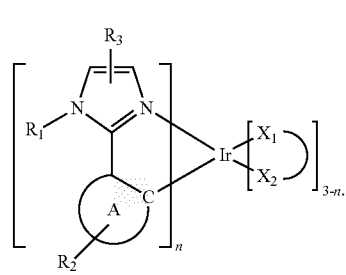

A is a 5 or 6 membered carbocyclic or heterocyclic ring. $R_1$, $R_2$, and $R_3$ independently represent mono, di, tri or tetra substituents. Each of $R_1$, $R_2$, and $R_3$ are independently selected from the group consisting of hydrogen, deuterium, alkyl, alkoxy, amino, alkenyl, alkynyl, arylkyl, aryl, and heteroaryl. n is 1, 2, or 3. X—Y is an ancillary ligand.

In a further aspect, the emissive dopant is selected from the group consisting of:

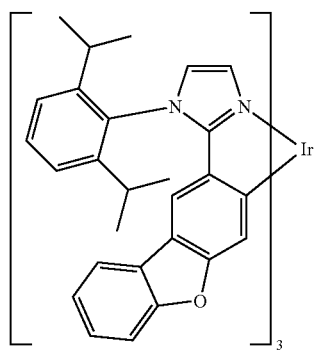

Compound H

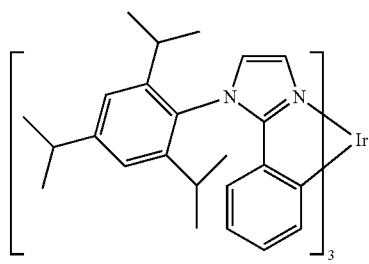

Compound I

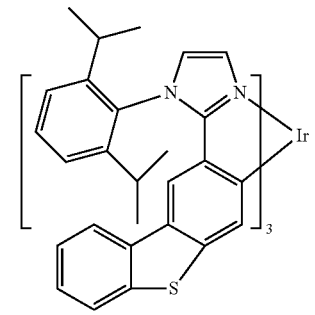

Compound J

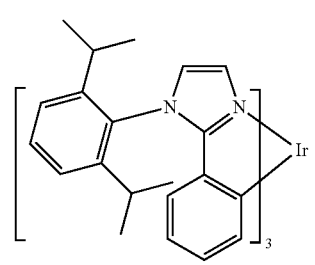

Compound K

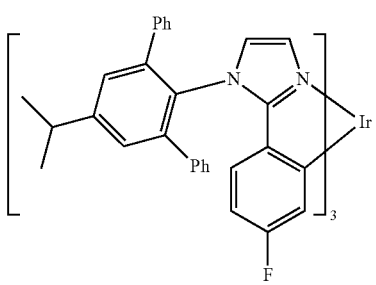

Compound L

-continued

Compound M

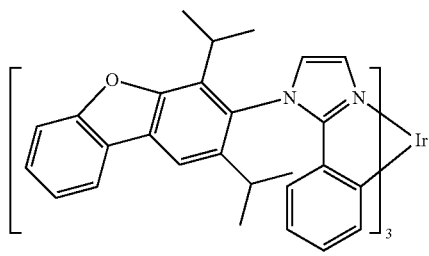

Compound N

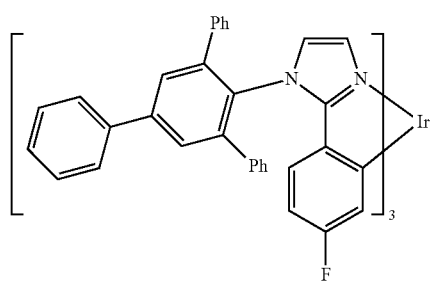

Compound O

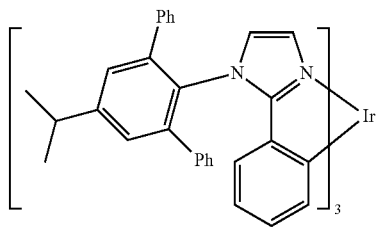

Compound P

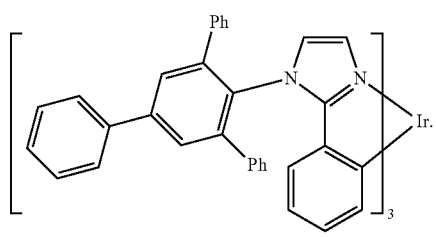

In yet another aspect, the first device further comprises a second organic layer that is a non-emissive layer and the compound having Formula I is a material in the second organic layer.

In one aspect, the second organic layer is an electron transporting layer and the compound having Formula I is an electron transporting material in the second organic layer.

In another aspect, the second organic layer is a blocking layer and the compound having Formula I is a blocking material in the second organic layer.

In one aspect, the first organic layer is disposed using solution processing.

In one aspect, the first device is an organic light emitting device. In another aspect, the first device is a consumer product.

In addition, there are several other embodiments; however, these additional embodiments are less preferred.

Compounds comprising a carbazole or a 3,9-linked oligocarbazole and a dibenzo or aza-dibenzo moiety are provided. The compounds have the formula:

Formula I

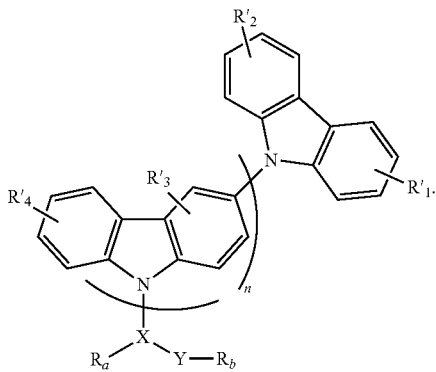

n is 0-20. Preferably, n is 1-20. More preferably, n is 1, 2, or 3. Most preferably, n is 1. Each of $R'_1$, $R'_2$, $R'_3$, and $R'_4$ independently represent mono, di, tri or tetra substitutions. $R'_1$, $R'_2$, $R'_3$, and $R'_4$ are independently selected from the group consisting of hydrogen, deuterium, alkyl, alkoxy, amino, alkenyl, alkynyl, arylkyl, aryl, and heteroaryl. $R_a$ and $R_b$ independently represent mono, di, tri, or tetra substitutions. $R_a$ and $R_b$ are independently selected from the group consisting of hydrogen, deuterium, alkyl, alkoxy, amino, alkenyl, alkynyl, arylkyl, aryl, and heteroaryl. X is an aryl or heteroaryl linker further substituted with $R_a$. Y is dibenzothiophene, dibenzofuran, dibenzoselenophene, aza-dibenzothiophene, aza-dibenzofuran, or aza-dibenzoselenophene that is further substituted with $R_b$. Preferably, Y is 2-dibenzothiophenyl, 4-dibenzothiophenyl, 2-dibenzofuranyl, or 4-dibenzofuranyl. When n is 0, X is an aryl linker comprising at least two phenylene groups and Y is 4-dibenzothiophene.

In one aspect, X is

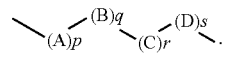

A, B, C and D are independently selected from the group consisting of:

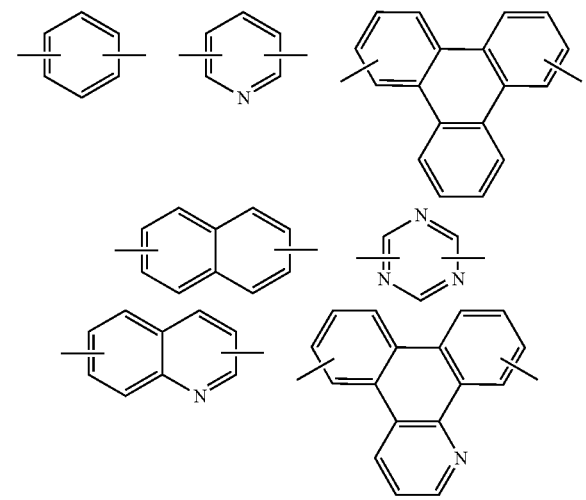

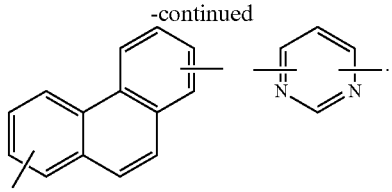

A, B, C and D are optionally further substituted with $R_a$. Each of p, q, r and s are 0, 1, 2, 3, or 4. p+q+r+s is at least 1.

In one aspect, n is 0, X is an aryl linker comprising at least two phenylene groups and Y is 4-dibenzothiophene. In another aspect, X is selected from the group consisting of:

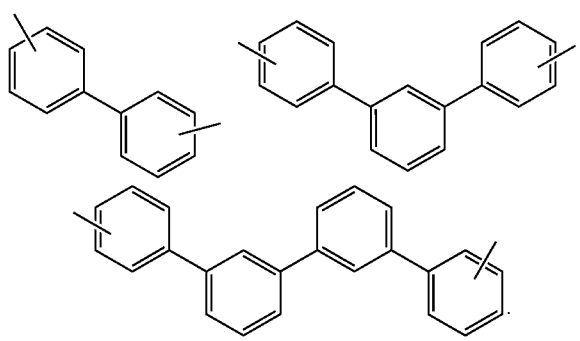

X is further substituted with $R_a$. Without being bound by theory, it is believed that compounds comprising a carbazole and a 4-dibenzothiophene separated by at least two phenylene groups may be used in various organic layers in a device to provide improved device lifetime. For example, a carbazole and a 4-dibenzothiophene separated by two phenylene rings may be a host material, while a carbazole and a 4-dibenzothiophene separated by three phenylene rings may be a blocking material.

Specific examples of the compounds are provided. In one aspect, the compound is selected from the group consisting of:

Compound 1

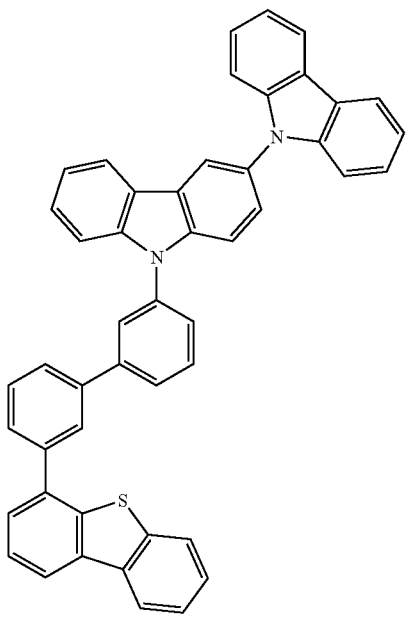

Compound 2

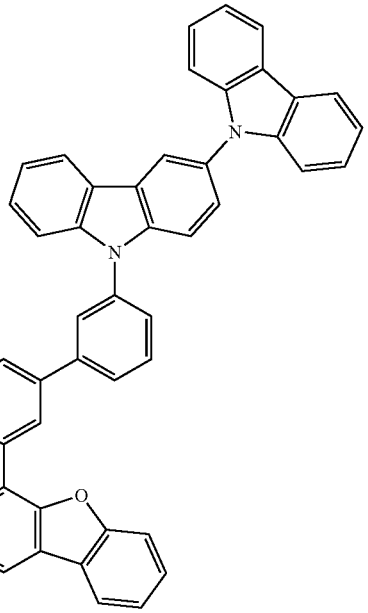

Compound 3

Compound 4

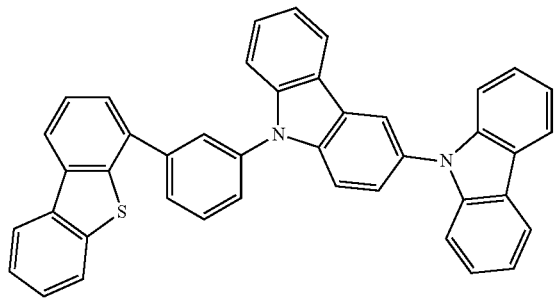

Compound 5

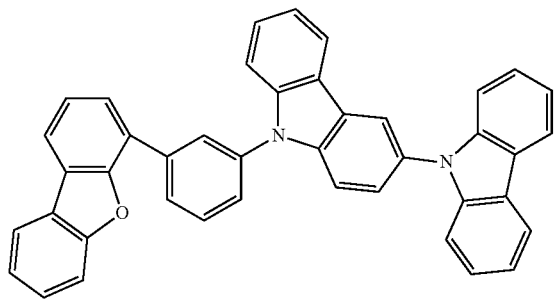

Compound 6
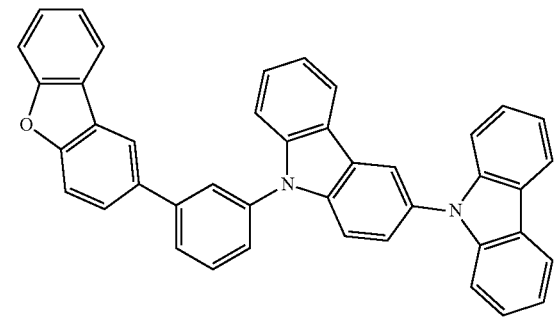
Compound 7
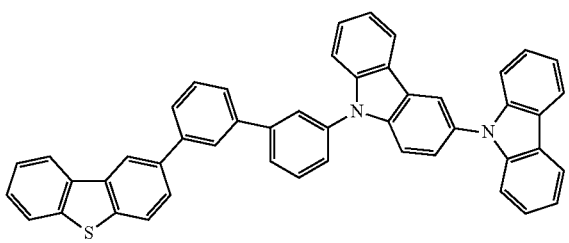
Compound 8
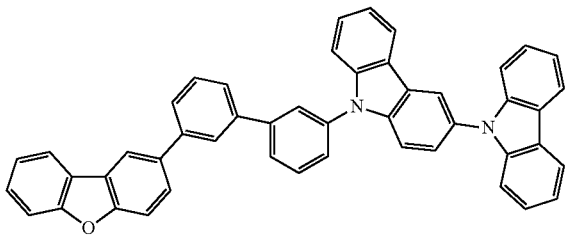
Compound 9
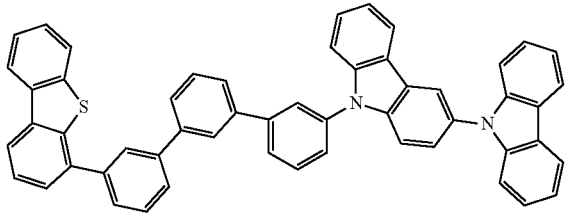
Compound 10
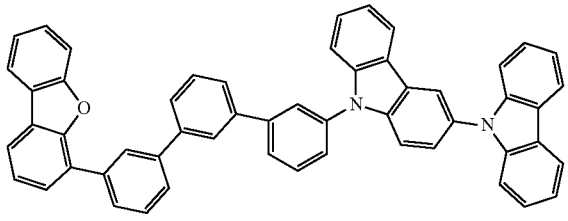
Compound 11
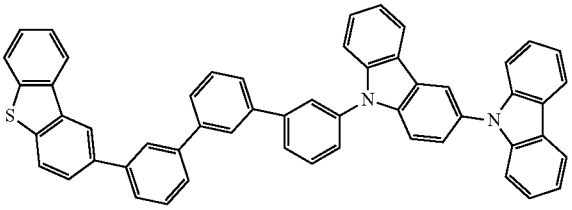
Compound 12
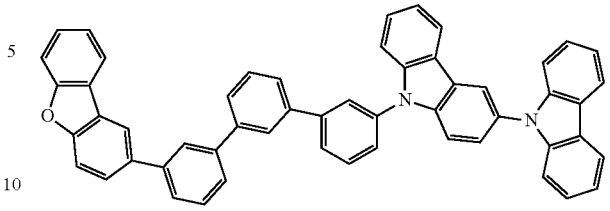
Compound 13
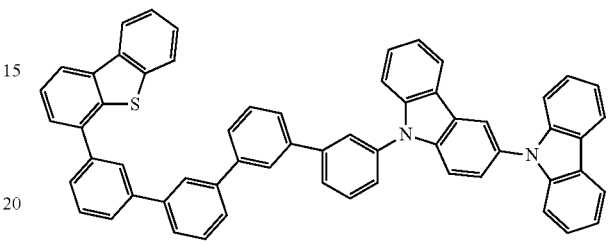
Compound 14
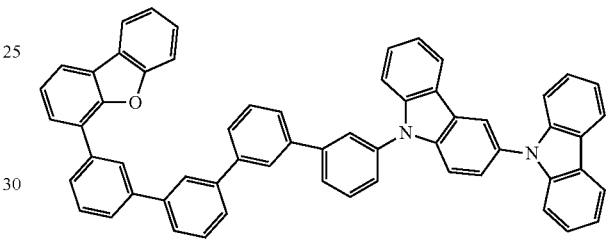
Compound 15
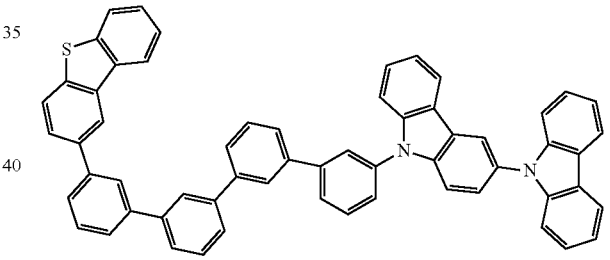
Compound 16
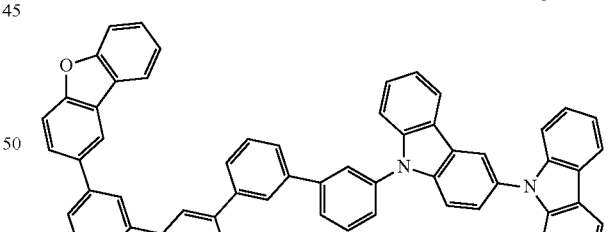
Compound 17
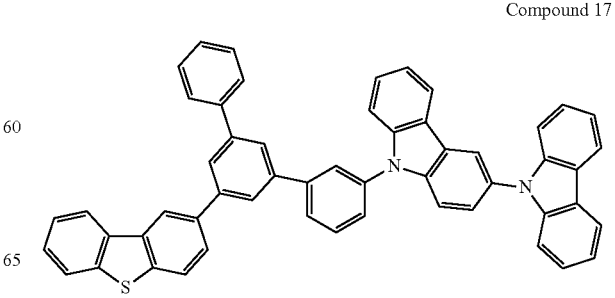

Compound 18
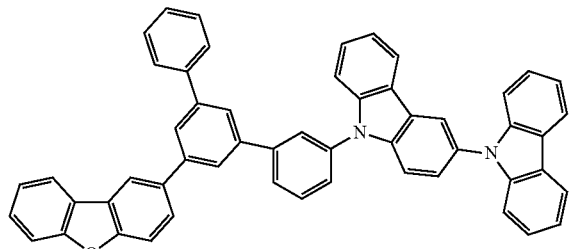
Compound 22
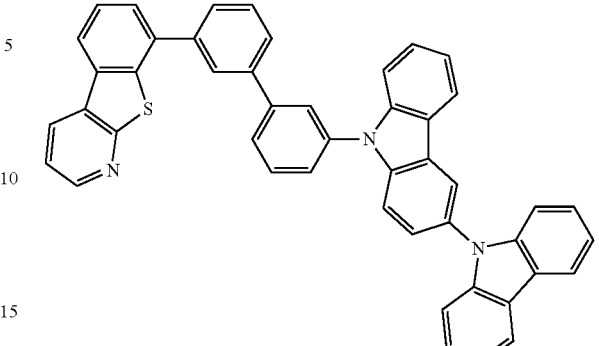
Compound 19
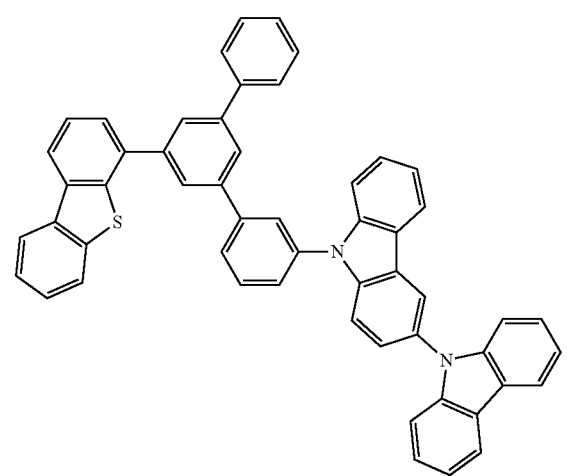
Compound 23
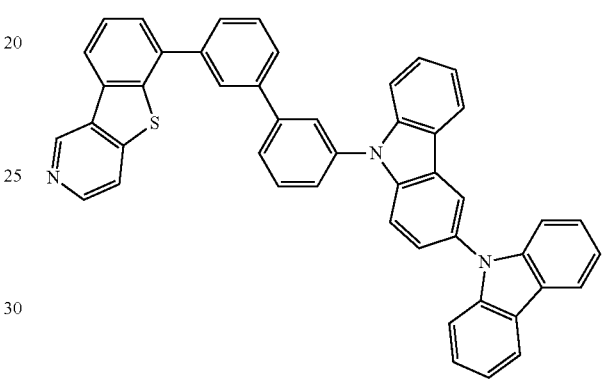
Compound 20
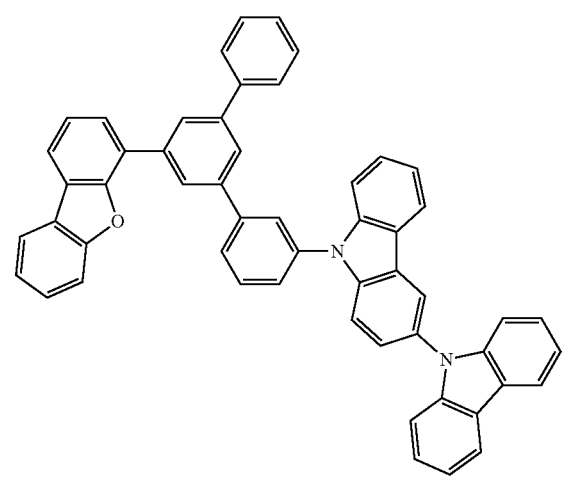
Compound 24
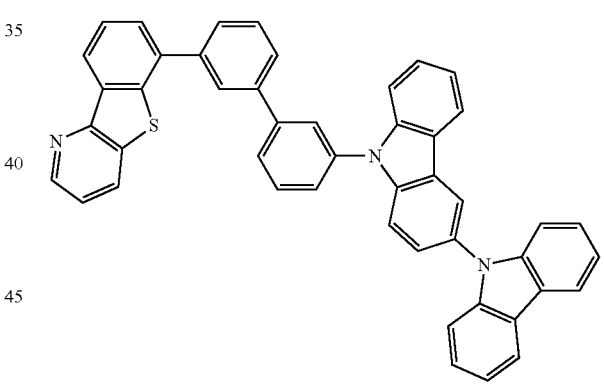
Compound 21
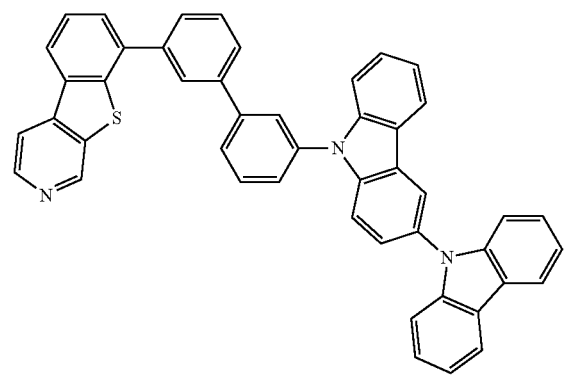
Compound 25
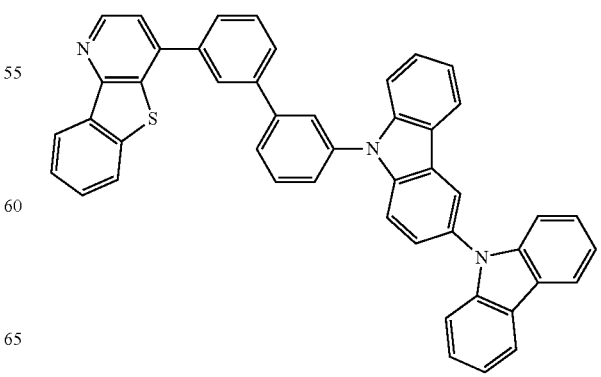

Compound 26
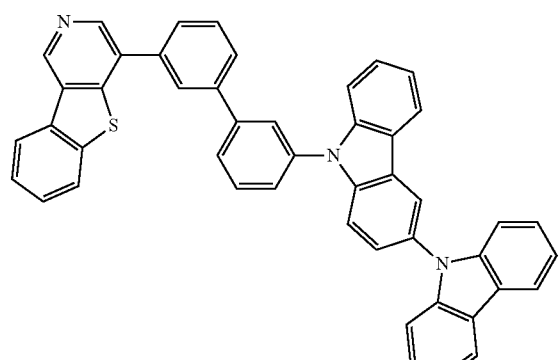
Compound 30
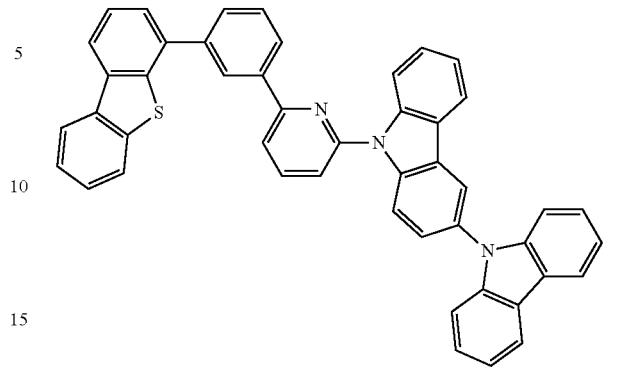
Compound 27
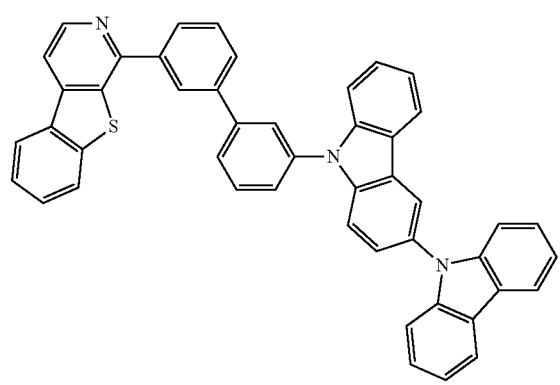
Compound 31
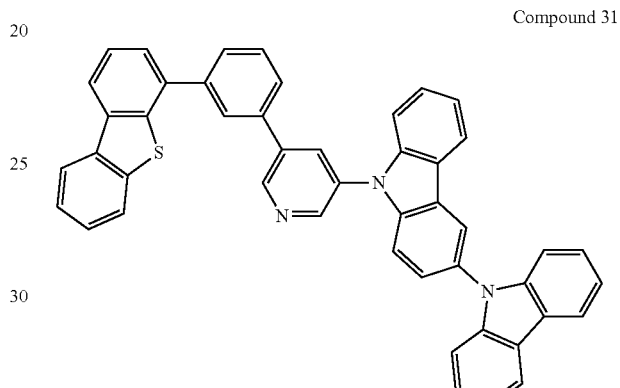
Compound 28
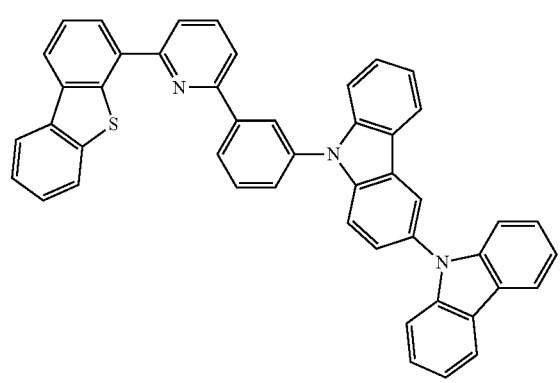
Compound 32
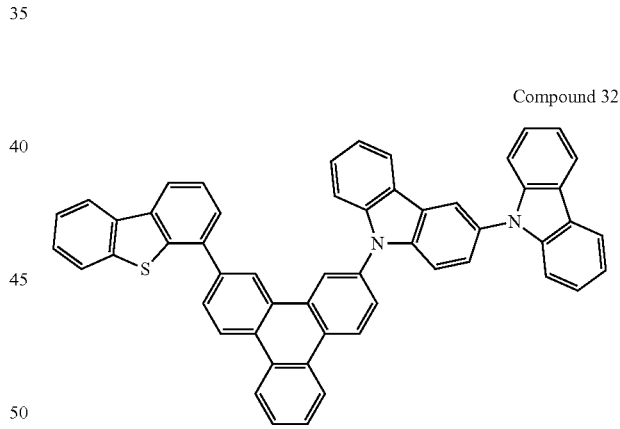
Compound 29
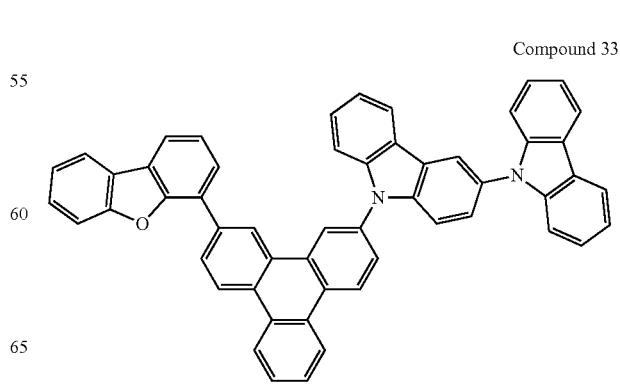
Compound 33

Compound 34
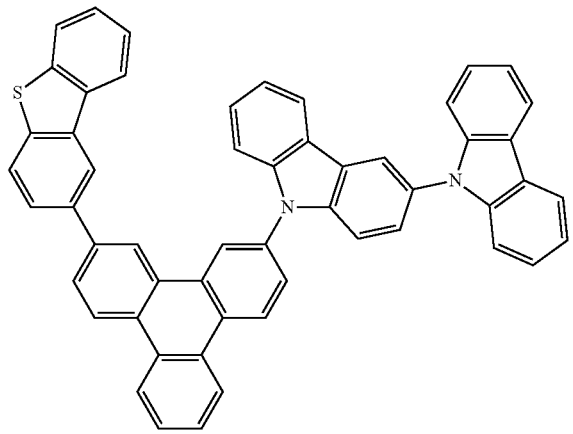
Compound 35
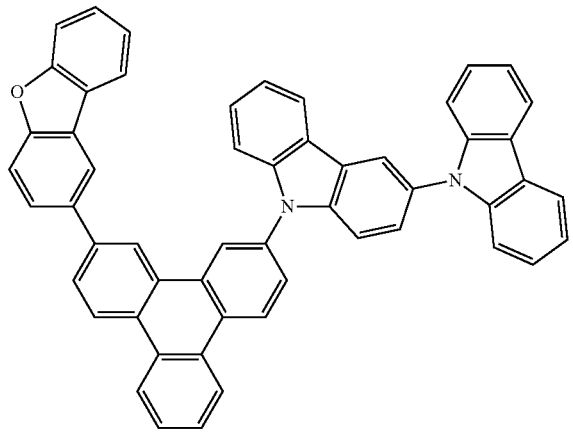
Compound 36
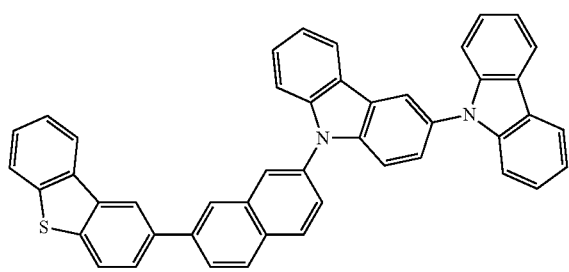
Compound 37
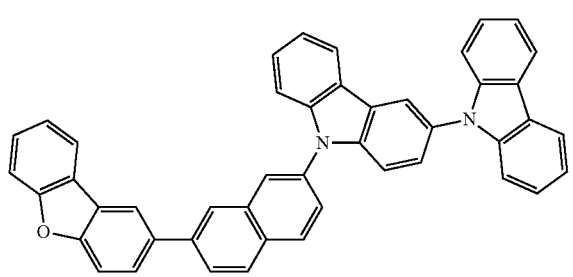
Compound 38
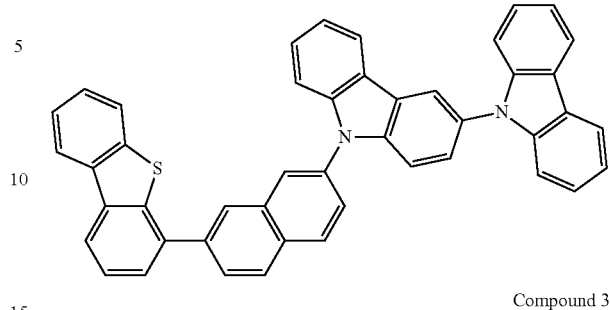
Compound 39
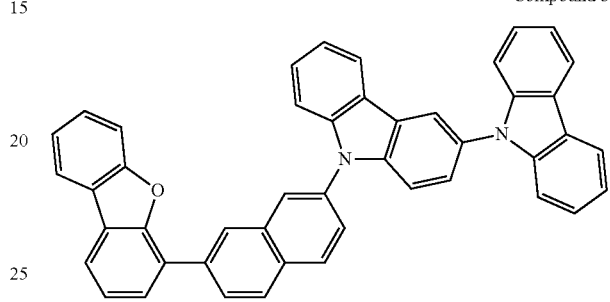
Compound 40
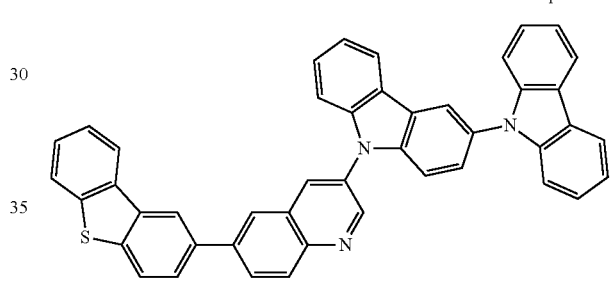
Compound 41
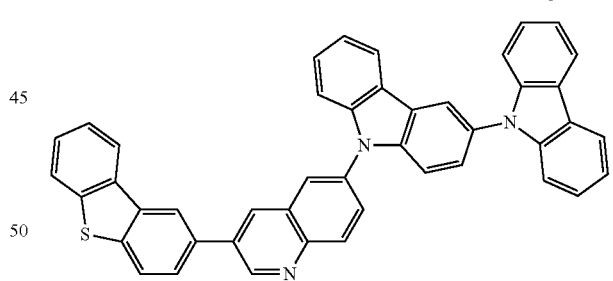
Compound 42
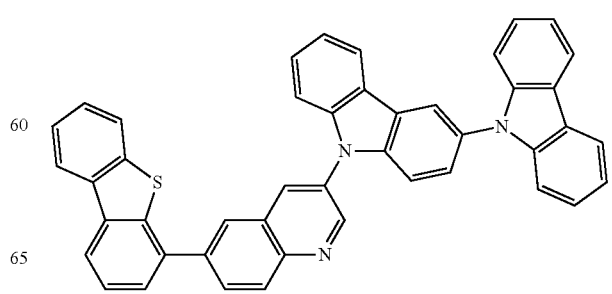

Compound 43
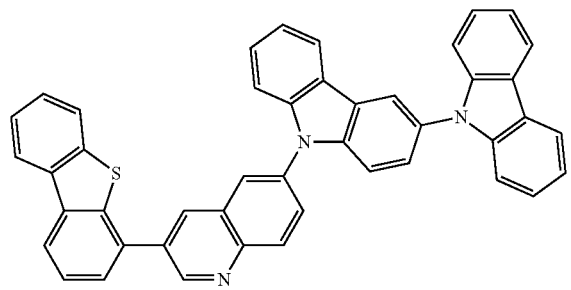
Compound 44
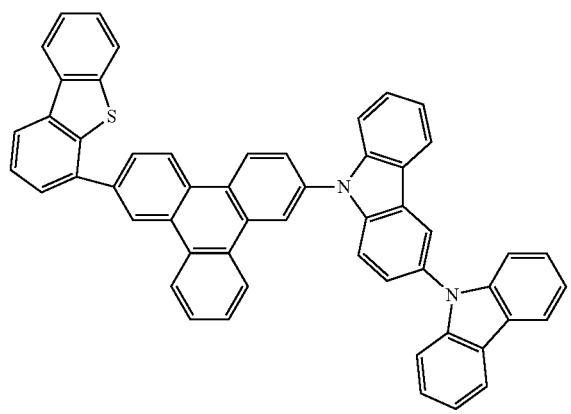
Compound 45
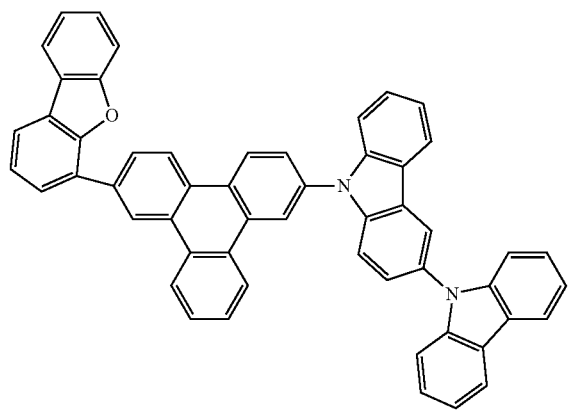
Compound 46
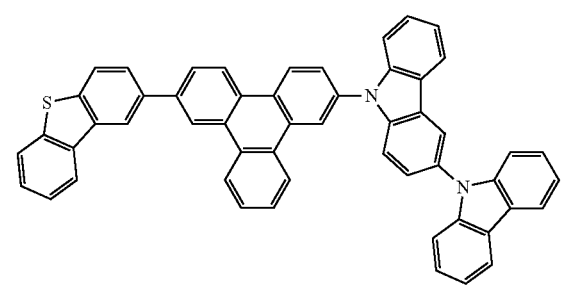
Compound 47
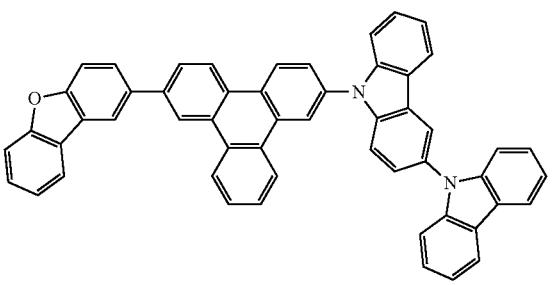
Compound 48
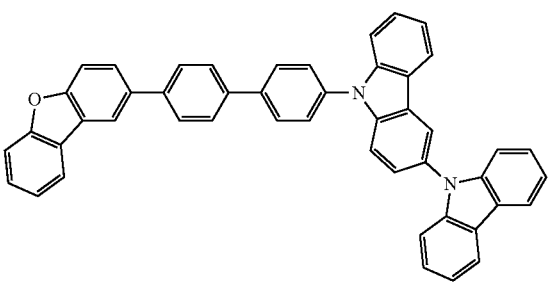
Compound 49
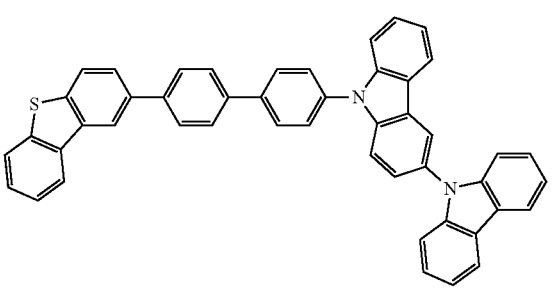
Compound 50
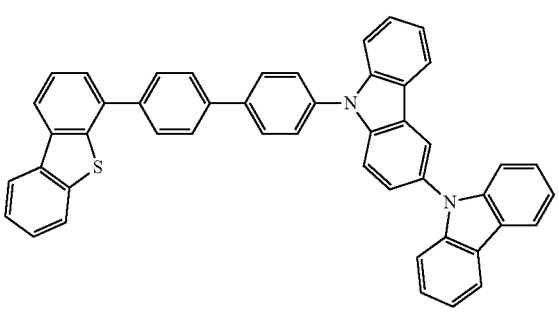
Compound 51
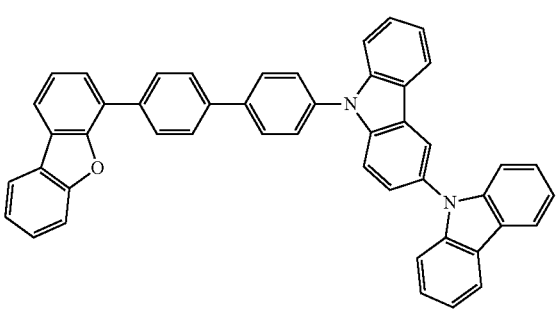

Compound 52
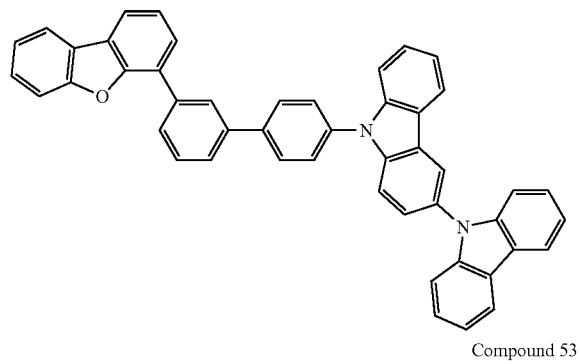
Compound 53
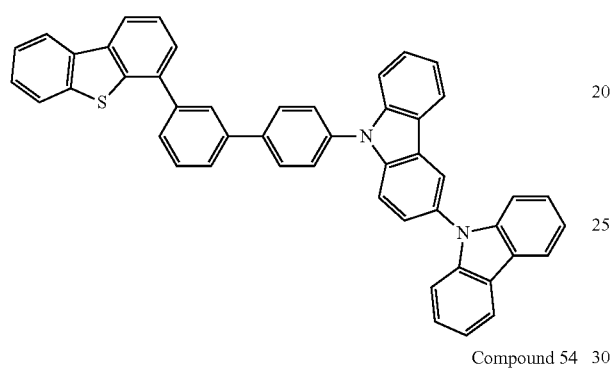
Compound 54
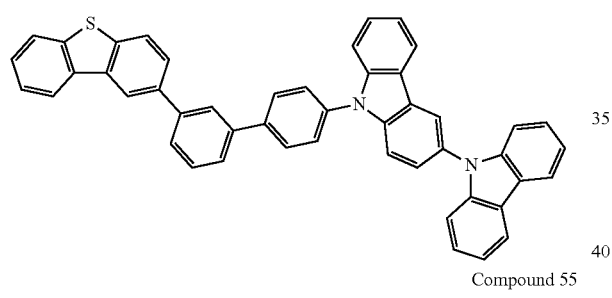
Compound 55
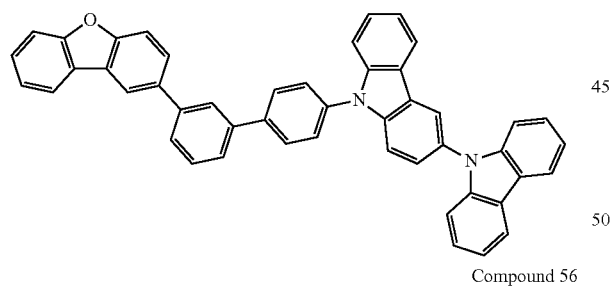
Compound 56
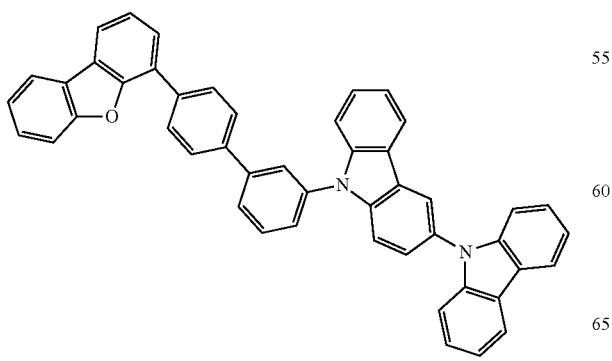
Compound 57
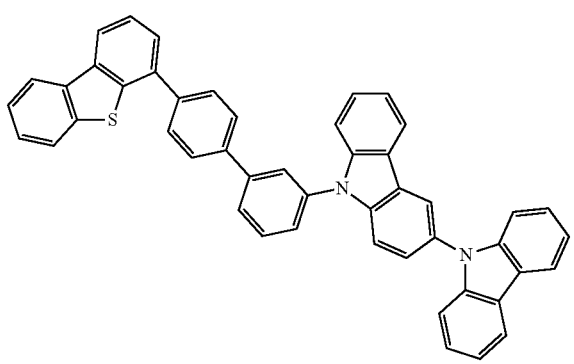
Compound 58
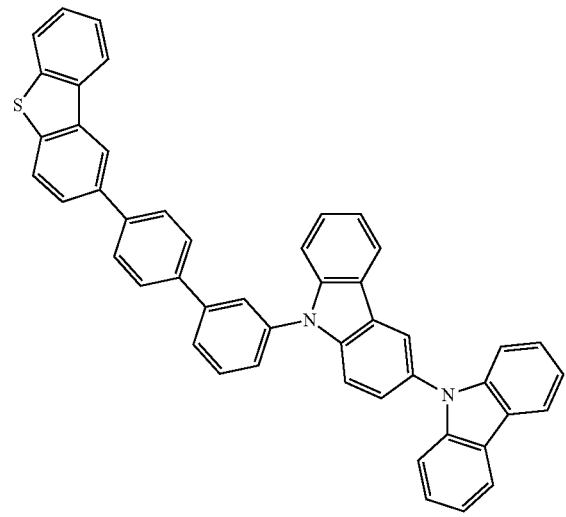
Compound 59

Compound 60
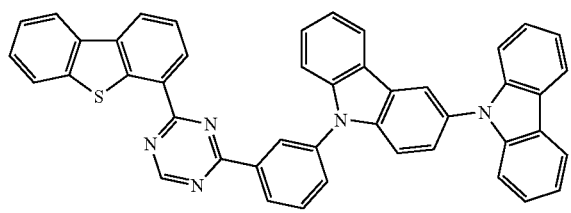
Compound 61
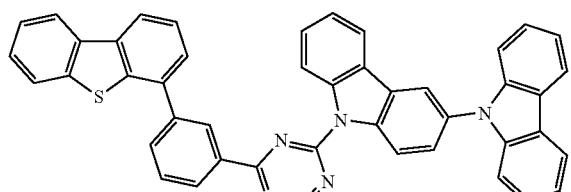
Compound 62
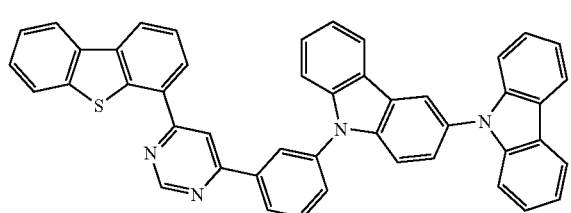
Compound 63
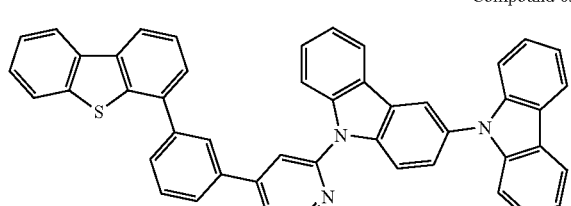
Compound 64
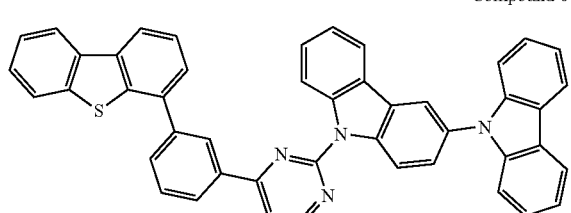
Compound 65
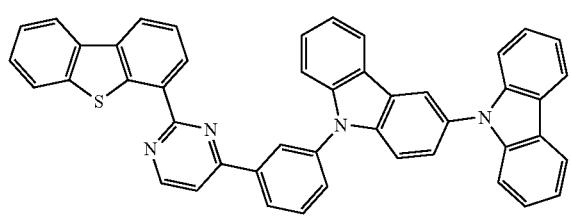
Compound 66
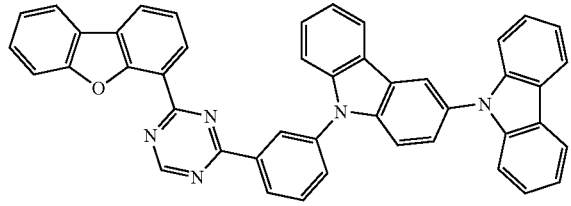
Compound 67
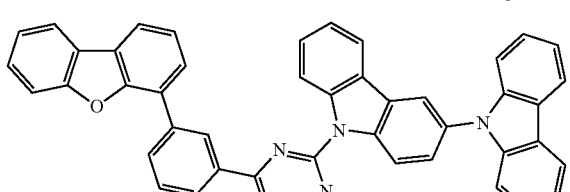
Compound 68
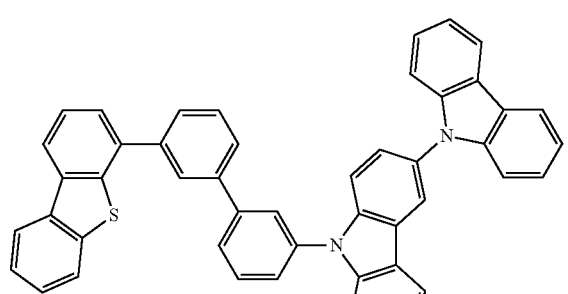
Compound 69

Compound 70
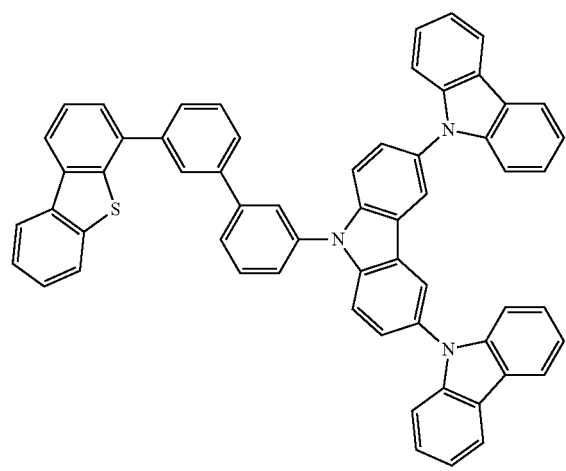
Compound 71
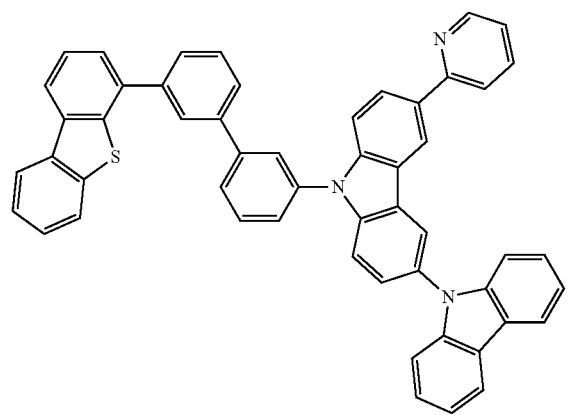
Compound 72
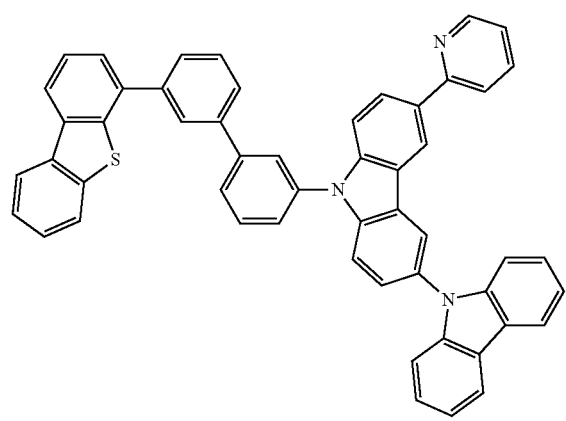
Compound 73
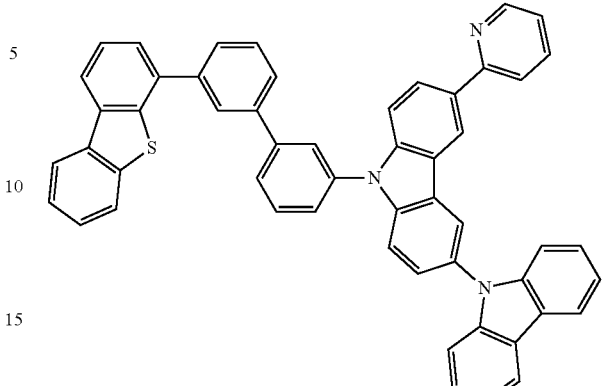
Compound 74
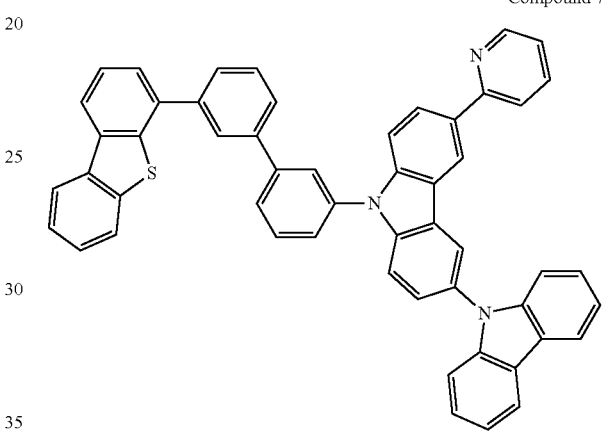
Compound 75
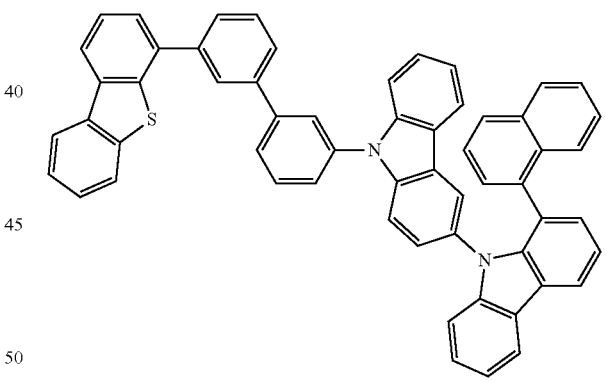
Compound 76
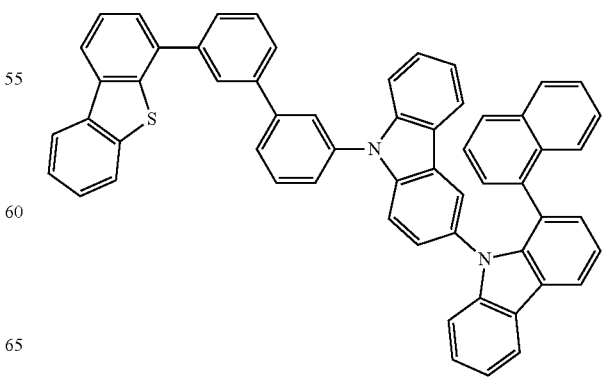

Compound 77
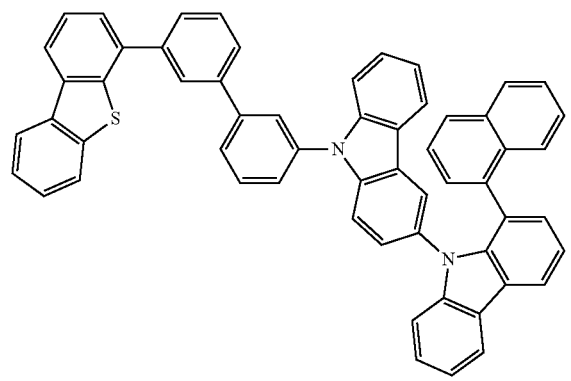
Compound 78
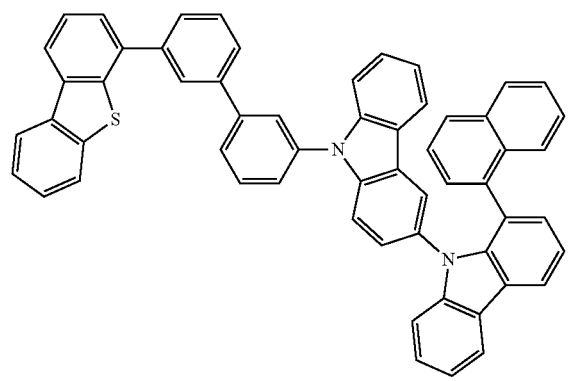
Compound 79
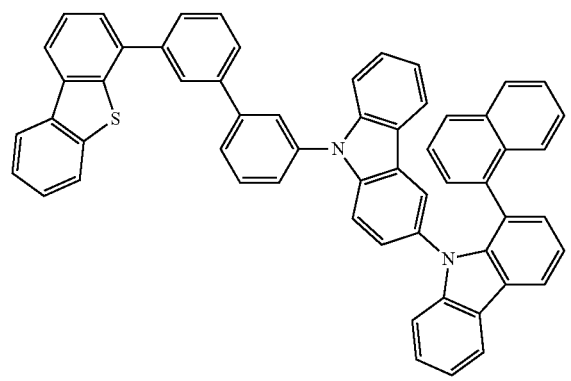
Compound 80
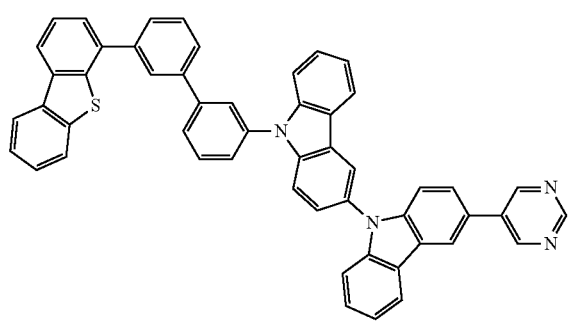
Compound 81
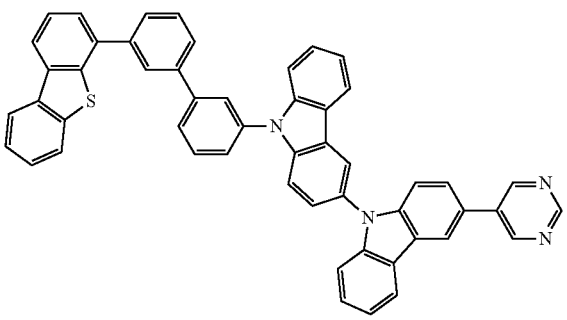
Compound 82
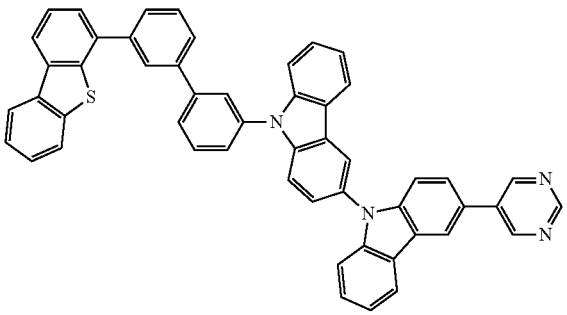
Compound 83
Compound 84
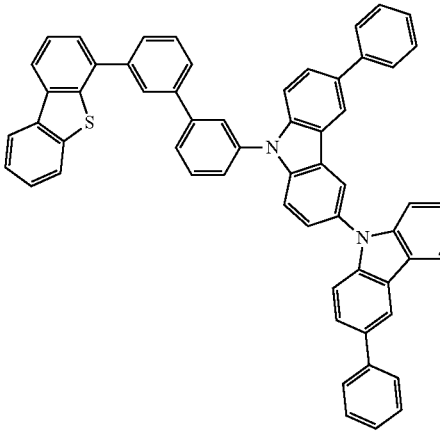

-continued

Compound 85

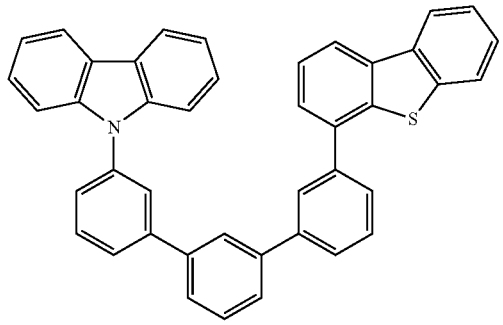

Compound 86

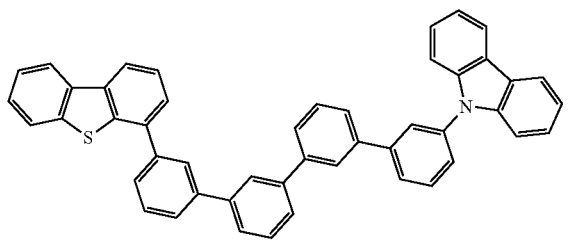

Compound 87

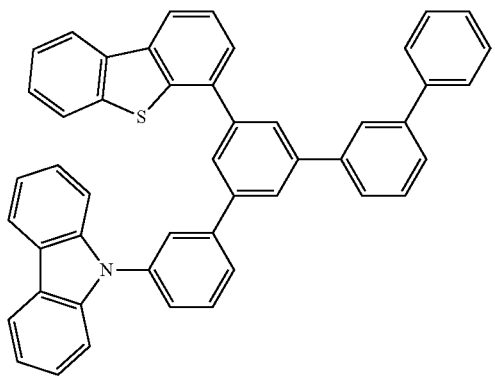

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in embodiments of the present invention is not particularly limited, and any compound may be used as long as the compound is typically used as a hole injecting/transporting material. Examples of the material include, but are not limited to: a phthalocyanine or porphryin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but are not limited to the following general structures:

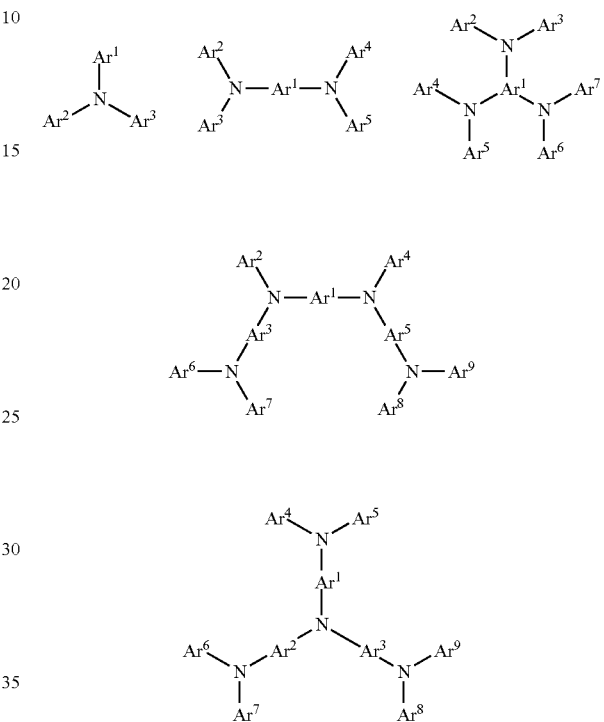

Each of $Ar^1$ to $Ar^9$ is selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, deuterium, alkyl, alkoxy, amino, alkenyl, alkynyl, arylalkyl, heteroalkyl, aryl and heteroaryl.

In one aspect, $Ar^1$ to $Ar^9$ is independently selected from the group consisting of:

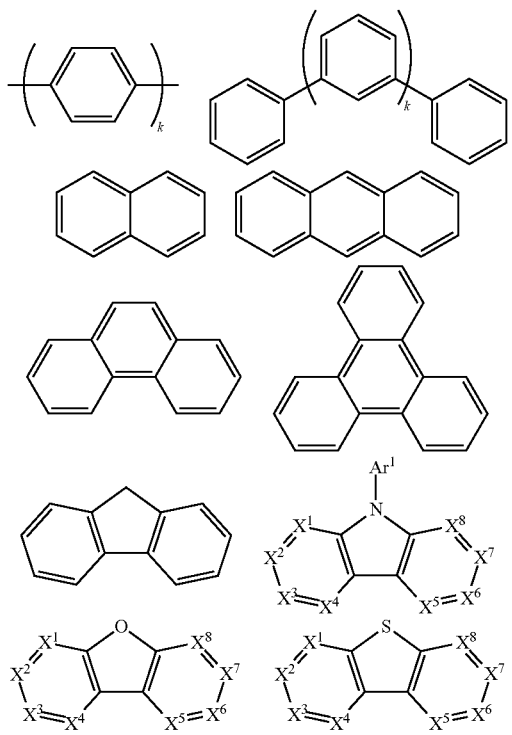

k is an integer from 1 to 20; $X^1$ to $X^8$ is CH or N; $Ar^1$ has the same group defined above.

Examples of metal complexes used in HIL or HTL include, but are not limited to the following general formula:

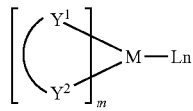

M is a metal, having an atomic weight greater than 40; $(Y^1\text{-}Y^2)$ is a bidentate ligand, Y1 and $Y^2$ are independently selected from C, N, O, P, and S; L is an ancillary ligand; m is an integer value from 1 to the maximum number of ligands that may be attached to the metal; and m+n is the maximum number of ligands that may be attached to the metal.

In one aspect, $(Y^1\text{-}Y^2)$ is a 2-phenylpyridine derivative.

In another aspect, $(Y^1\text{-}Y^2)$ is a carbene ligand.

In another aspect, M is selected from Ir, Pt, Os, and Zn.

In a further aspect, the metal complex has a smallest oxidation potential in solution vs. $Fc^+/Fc$ couple less than about 0.6 V.

Host:

The light emitting layer of the organic EL device of embodiments of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant.

Examples of metal complexes used as host are preferred to have the following general formula:

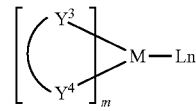

M is a metal; $(Y^3\text{-}Y^4)$ is a bidentate ligand, $Y^3$ and $Y^4$ are independently selected from C, N, O, P, and S; L is an ancillary ligand; m is an integer value from 1 to the maximum number of ligands that may be attached to the metal; and m+n is the maximum number of ligands that may be attached to the metal.

In one aspect, the metal complexes are:

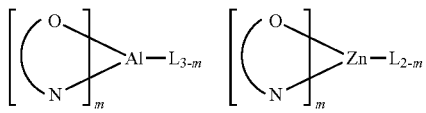

(O—N) is a bidentate ligand, having metal coordinated to atoms O and N.

In another aspect, M is selected from Ir and Pt.

In a further aspect, $(Y^3\text{-}Y^4)$ is a carbene ligand.

Examples of organic compounds used as host are selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each group is further substituted by a substituent selected from the group consisting of hydrogen, deuterium, alkyl, alkoxy, amino, alkenyl, alkynyl, arylalkyl, heteroalkyl, aryl and heteroaryl.

In one aspect, host compound contains at least one of the following groups in the molecule:

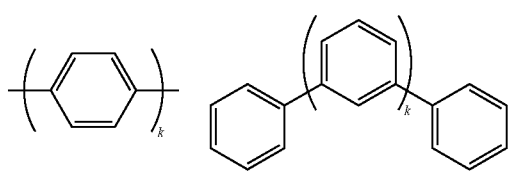

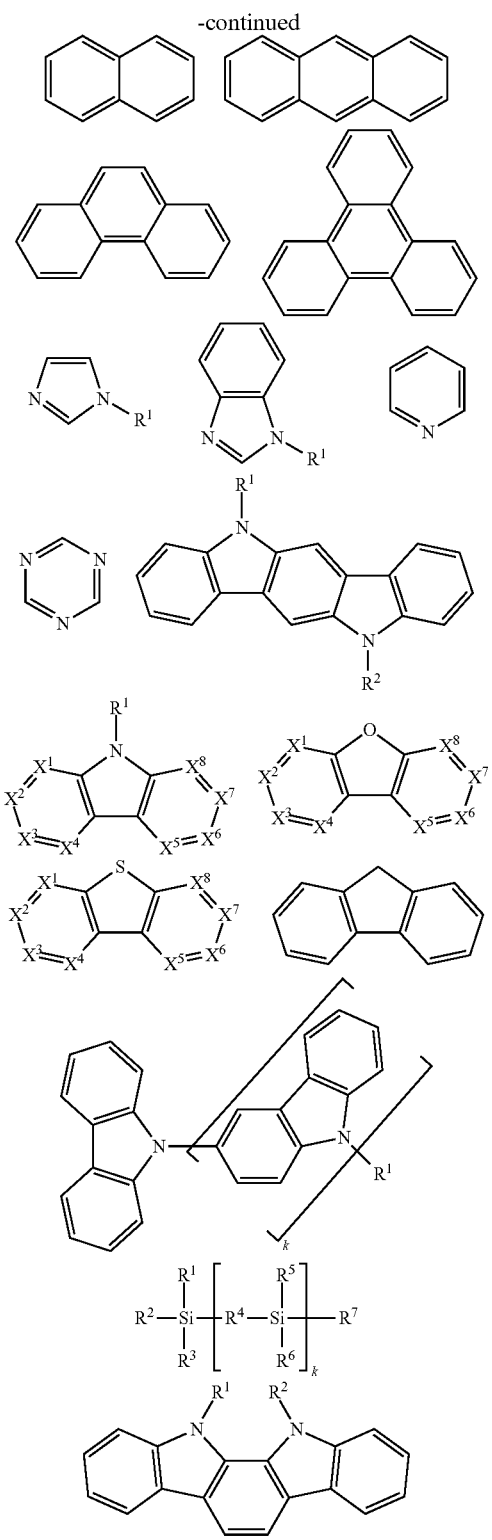

R$^1$ to R$^7$ is independently selected from the group consisting of hydrogen, deuterium, alkyl, alkoxy, amino, alkenyl, alkynyl, arylalkyl, heteroalkyl, aryl and heteroaryl, when it is aryl or heteroaryl, it has the similar definition as Ar's mentioned above.

k is an integer from 0 to 20.

X$^1$ to X$^8$ is selected from CH or N.

HBL:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In one aspect, compound used in HBL contains the same molecule used as host described above.

In another aspect, compound used in HBL contains at least one of the following groups in the molecule:

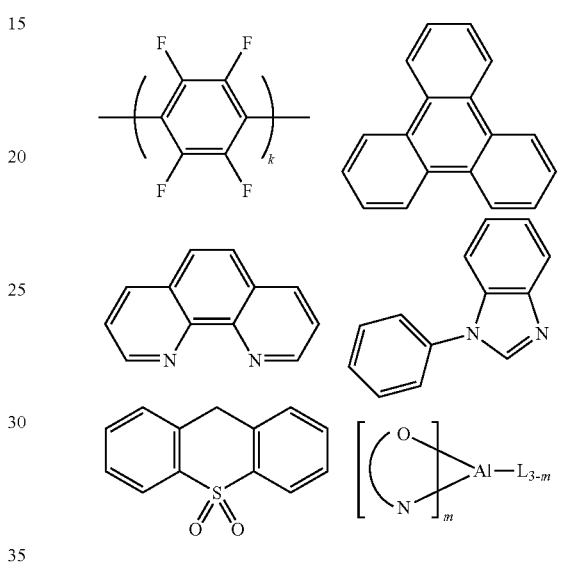

k is an integer from 0 to 20; L is an ancillary ligand, m is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

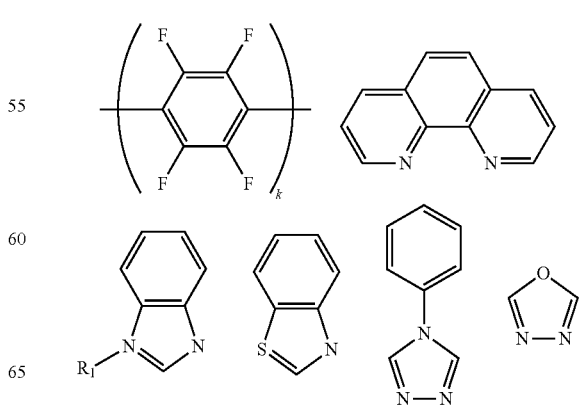

-continued

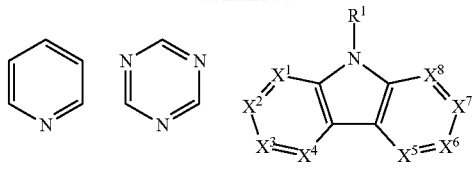

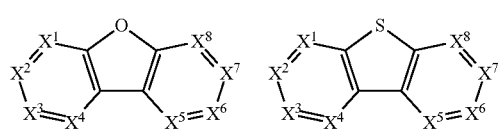

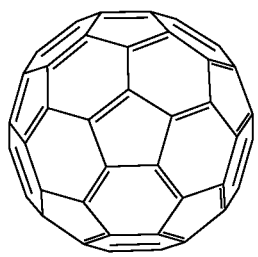

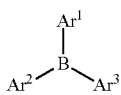

$R^1$ is selected from the group consisting of hydrogen, deuterium, alkyl, alkoxy, amino, alkenyl, alkynyl, arylalkyl, heteroalkyl, aryl and heteroaryl, when it is aryl or heteroaryl, it has the similar definition as Ar's mentioned above.

$Ar^1$ to $Ar^3$ has the similar definition as Ar's mentioned above.

k is an integer from 0 to 20.

$X^1$ to $X^8$ is selected from CH or N.

In another aspect, the metal complexes used in ETL contains, but not limit to the following general formula:

$$\left[\begin{array}{c}O\\ \diagdown\\ N\end{array}\right]_m Al-L_{3-m} \quad \left[\begin{array}{c}O\\ \diagdown\\ N\end{array}\right]_m Be-L_{2-m} \quad \left[\begin{array}{c}O\\ \diagdown\\ N\end{array}\right]_m Zn-L_{2-m}$$

$$\left[\begin{array}{c}N\\ \diagdown\\ N\end{array}\right]_m Zn-L_{2-m}$$

(O—N) or (N—N) is a bidentate ligand, having metal coordinated to atoms O, N or N, N; L is an ancillary ligand; m is an integer value from 1 to the maximum number of ligands that may be attached to the metal.

In any above-mentioned compounds used in each layer of OLED device, the hydrogen atoms can be partially or fully deuterated.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in Table 1 below. Table 1 lists non-limiting classes of materials, non-limiting examples of compounds for each class, and references that disclose the materials.

TABLE 1

| MATERIAL | EXAMPLES OF MATERIAL | PUBLICATIONS |
|---|---|---|
| | Hole injection materials | |
| Phthalocyanine and porphryin compounds | | Appl. Phys. Lett. 69, 2160 (1996) |

TABLE 1-continued

| MATERIAL | EXAMPLES OF MATERIAL | PUBLICATIONS |
| --- | --- | --- |
| Starburst triarylamines | | J. Lumin. 72-74, 985 (1997) |
| CF$_x$ Fluorohydrocarbon polymer | | Appl. Phys. Lett. 78, 673 (2001) |
| Conducting polymers (e.g., PEDOT:PSS, polyaniline, polythiophene) | | Synth. Met. 87, 171 (1997) WO2007002683 |
| Phosphonic acid and silane SAMs | | US20030162053 |
| Triarylamine or polythiophene polymers with conductivity dopants | | EA01725079A1 | and

TABLE 1-continued
| MATERIAL | EXAMPLES OF MATERIAL | PUBLICATIONS |
|---|---|---|
| | 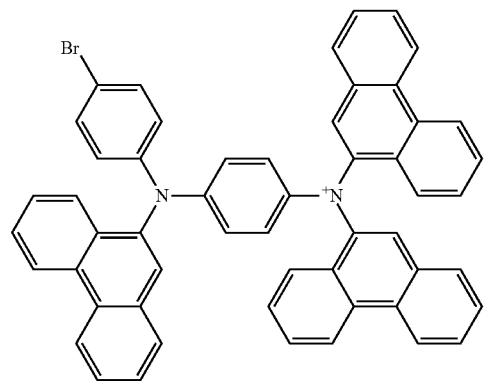 [SMILES: Brc1ccc(N(c2ccc([NH+](c3cc4ccccc4c4ccccc34)c3cc4ccccc4c4ccccc34)cc2)c2cc3ccccc3c3ccccc23)cc1] | |
| | 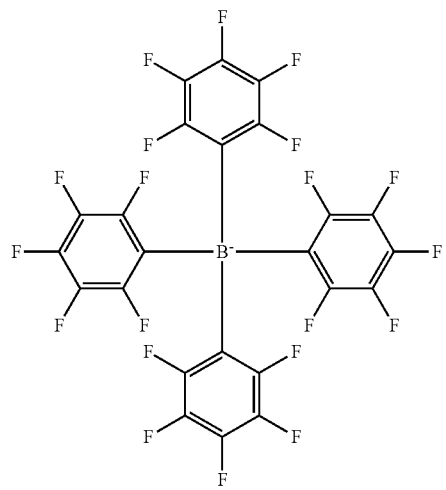 [SMILES: Fc1c(F)c(F)c([B-](c2c(F)c(F)c(F)c(F)c2F)(c2c(F)c(F)c(F)c(F)c2F)c2c(F)c(F)c(F)c(F)c2F)c(F)c1F] | |
| Arylamines complexed with metal oxides such as molybdenum and tungsten oxides | 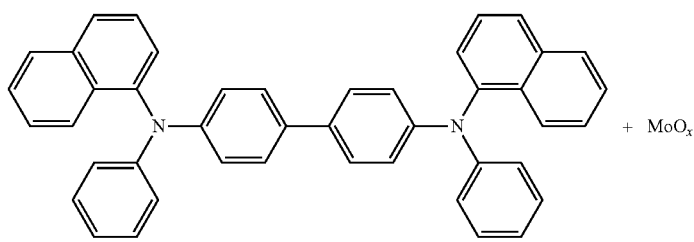 [SMILES: c1ccc(N(c2ccc(-c3ccc(N(c4ccccc4)c4cccc5ccccc45)cc3)cc2)c2cccc3ccccc23)cc1 ; "MoOx"] | SID Symposium Digest, 37, 923 (2006)<br>WO2009018009 |
| p-type semiconducting organic complexes | 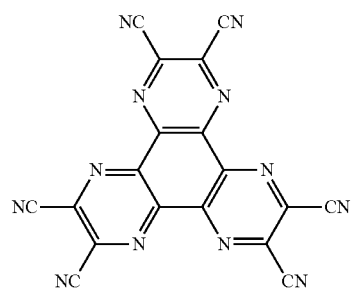 [SMILES: N#Cc1nc2c3nc(C#N)c(C#N)nc3c3nc(C#N)c(C#N)nc3c2nc1C#N] | US20020158242 |

TABLE 1-continued

| MATERIAL | EXAMPLES OF MATERIAL | PUBLICATIONS |
|---|---|---|
| Metal organometallic complexes | | US20060240279 |
| Cross-linkable compounds | | US20080220265 |
| Hole transporting materials | | |
| Triarylamines (e.g., TPD, α-NPD) | | Appl. Phys. Lett. 51, 913 (1987) |
| | | U.S. Pat. No. 5,061,569 |

TABLE 1-continued

| MATERIAL | EXAMPLES OF MATERIAL | PUBLICATIONS |
|---|---|---|
| | | EP650955 |
| | | J. Mater. Chem. 3, 319 (1993) |
| | | Appl. Phys. Lett. 90, 183503 (2007) |

TABLE 1-continued

| MATERIAL | EXAMPLES OF MATERIAL | PUBLICATIONS |
|---|---|---|
|  |  | Appl. Phys. Lett. 90, 183503 (2007) |
| Triaylamine on spirofluorene core |  | Synth. Met. 91, 209 (1997) |
| Arylamine carbazole compounds |  | Adv. Mater. 6, 677 (1994), US20080124572 |
| Triarylamine with (di)benzothiophene/ (di)benzofuran |  | US20070278938, US20080106190 |

TABLE 1-continued

| MATERIAL | EXAMPLES OF MATERIAL | PUBLICATIONS |
| --- | --- | --- |
| Indolo-carbazoles | | Synth. Met. 111, 421 (2000) |
| Isoindole compounds | | Chem. Mater. 15, 3148 (2003) |
| Metal carbene complexes | | US20080018221 |

Phosphorescent OLED host materials

Red hosts

| | | |
| --- | --- | --- |
| Arylcarbazoles | | Appl. Phys. Lett. 78, 1622 (2001) |

TABLE 1-continued

| MATERIAL | EXAMPLES OF MATERIAL | PUBLICATIONS |
|---|---|---|
| Metal 8-hydroxy-quinolates (e.g., Alq₃, BAlq) | | Nature 395, 151 (1998) |
| | | US20060202194 |
| | | WO2005014551 |
| | | WO2006072002 |
| Metal phenoxy-benzothiazole compounds | | Appl. Phys. Lett. 90, 123509 (2007) |
| Conjugated oligomers and polymers (e.g., polyfluorene) | | Org. Electron. 1, 15 (2000) |
| Aromatic fused rings | | WO2009066779, WO2009066778, WO2009063833, US20090045731, US20090045730, WO2009008311, US20090008605, US20090009065 |

TABLE 1-continued
| MATERIAL | EXAMPLES OF MATERIAL | PUBLICATIONS |
|---|---|---|
| Zinc complexes | 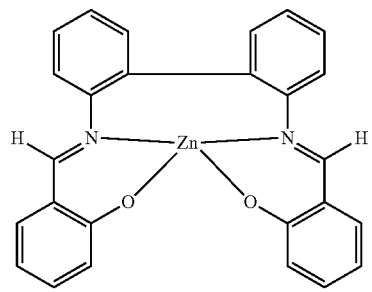 | WO2009062578 |
| Green hosts | | |
| Arylcarbazoles | 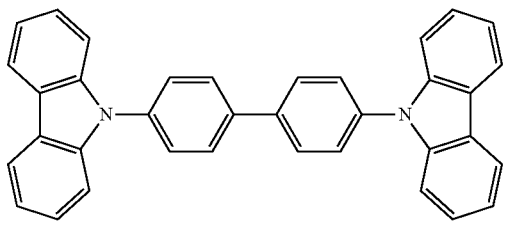 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |
| | 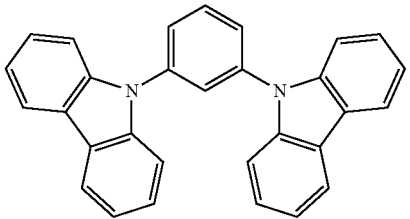 [SMILES: c1cc(-n2c3ccccc3c3ccccc32)cc(-n2c3ccccc3c3ccccc32)c1] | US20030175553 |
| | 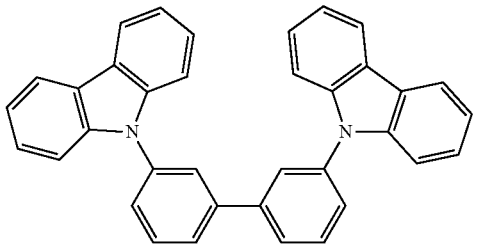 [SMILES: c1cc(-c2cccc(-n3c4ccccc4c4ccccc43)c2)cc(-n2c3ccccc3c3ccccc32)c1] | WO2001039234 |
| Aryltriphenylene compounds | 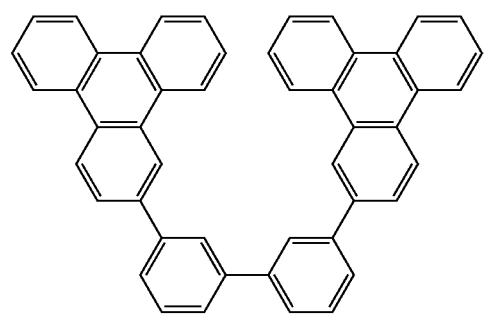 [SMILES: c1cc(-c2cccc(-c3ccc4c5ccccc5c5ccccc5c4c3)c2)cc(-c2ccc3c4ccccc4c4ccccc4c3c2)c1] | US20060280965 |

TABLE 1-continued
| MATERIAL | EXAMPLES OF MATERIAL | PUBLICATIONS |
|---|---|---|
| | 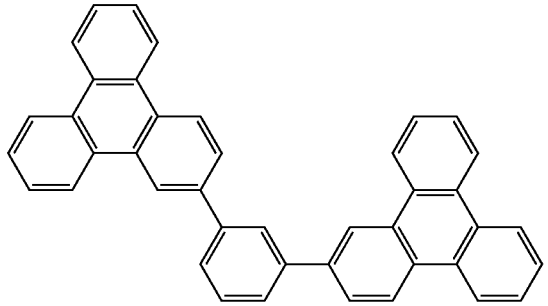 [SMILES: c1cc(-c2ccc3c4ccccc4c4ccccc4c3c2)cc(-c2ccc3c4ccccc4c4ccccc4c3c2)c1] | US20060280965 |
| | 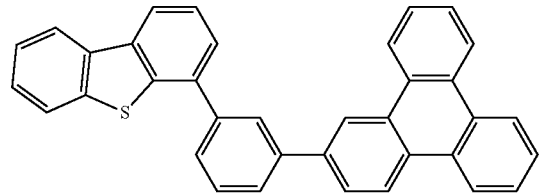 [SMILES: c1cc(-c2ccc3c4ccccc4c4ccccc4c3c2)cc(-c2cccc3c2sc2ccccc23)c1] | WO2009021126 |
| Donor acceptor type molecules | 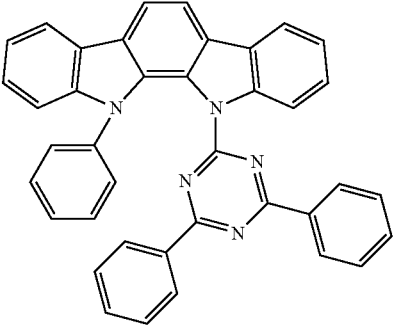 [SMILES: c1ccc(-c2nc(-c3ccccc3)nc(-n3c4ccccc4c4ccc5c6ccccc6n(-c6ccccc6)c5c43)n2)cc1] | WO2008056746 |
| Aza-carbazole/ DBT/DBF | 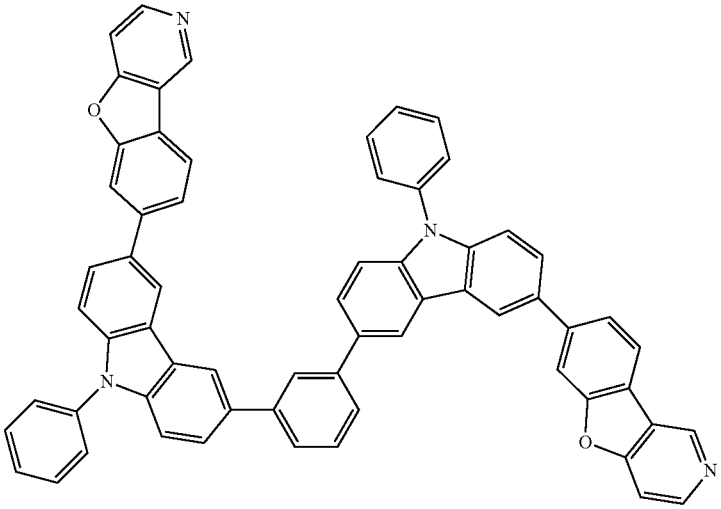 [SMILES: c1ccc(-n2c3ccc(-c4cccc(-c5ccc6c(c5)c5cc(-c7ccc8c(c7)oc7ccncc78)ccc5n6-c5ccccc5)c4)cc3c3cc(-c4ccc5c(c4)oc4ccncc45)ccc32)cc1] | JP2008074939 |
| Polymers (e.g., PVK) | 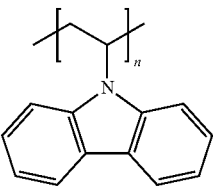 | Appl. Phys. Lett. 77, 2280 (2000) |

TABLE 1-continued

| MATERIAL | EXAMPLES OF MATERIAL | PUBLICATIONS |
|---|---|---|
| Spirofluorene compounds | | WO2004093207 |
| Metal phenoxy-benzooxazole compounds | | WO2005089025 |
| | | WO2006132173 |
| | | JP200511610 |
| Spirofluorene-carbazole compounds | | JP2007254297 |

TABLE 1-continued

| MATERIAL | EXAMPLES OF MATERIAL | PUBLICATIONS |
|---|---|---|
| | | JP2007254297 |
| Indolo-carbazoles | | WO2007063796 |
| | | WO2007063754 |
| 5-member ring electron deficient heterocycles (e.g., triazole, oxadiazole) | | J. Appl. Phys. 90, 5048 (2001) |
| | | WO2004107822 |

TABLE 1-continued

| MATERIAL | EXAMPLES OF MATERIAL | PUBLICATIONS |
|---|---|---|
| Tetraphenylene complexes | | US20050112407 |
| Metal phenoxypyridine compounds | | WO2005030900 |
| Metal coordination complexes (e.g., Zn, Al with N^N ligands) | | US20040137268, US20040137267 |

Blue hosts

| | | |
|---|---|---|
| Arylcarbazoles | | Appl. Phys. Lett, 82, 2422 (2003) |
| | | US20070190359 |

TABLE 1-continued
| MATERIAL | EXAMPLES OF MATERIAL | PUBLICATIONS |
|---|---|---|
| Dibenzo-thiophene/ Dibenzofuran-carbazole compounds | 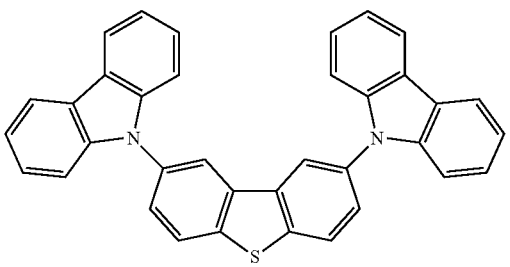 [SMILES: c1ccc2c(c1)c1ccccc1n2-c1ccc2sc3ccc(-n4c5ccccc5c5ccccc54)cc3c2c1] | WO2006114966, US20090167162 |
| | 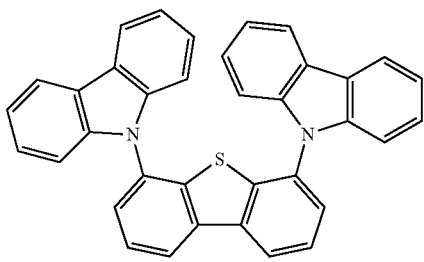 [SMILES: c1cc(-n2c3ccccc3c3ccccc32)c2sc3c(-n4c5ccccc5c5ccccc54)cccc3c2c1] | US20090167162 |
| | 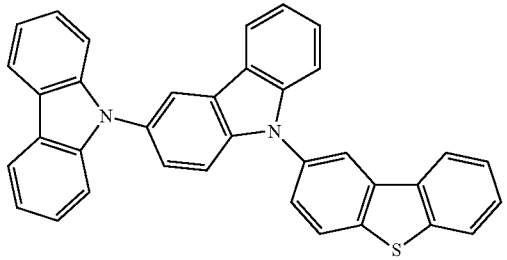 [SMILES: c1ccc2c(c1)sc1ccc(-n3c4ccccc4c4cc(-n5c6ccccc6c6ccccc65)ccc43)cc12] | WO2009086028 |
| | 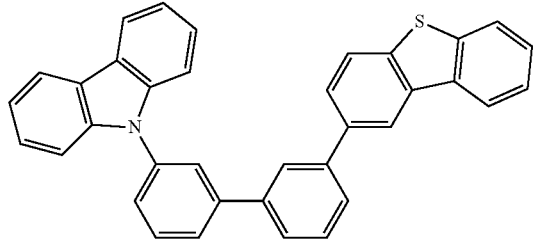 [SMILES: c1cc(-c2cccc(-n3c4ccccc4c4ccccc43)c2)cc(-c2ccc3sc4ccccc4c3c2)c1] | US20090030202, US20090017330 |
| Silicon aryl compounds | 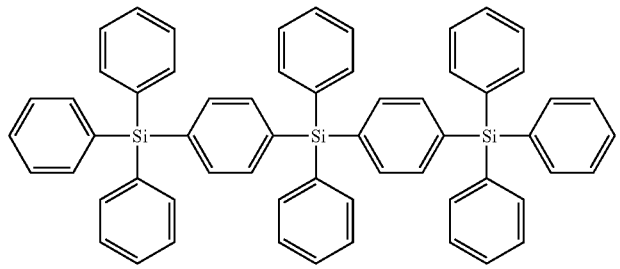 [SMILES: c1ccc([Si](c2ccccc2)(c2ccccc2)c2ccc([Si](c3ccccc3)(c3ccccc3)c3ccc([Si](c4ccccc4)(c4ccccc4)c4ccccc4)cc3)cc2)cc1] | US20050238919 |
| | 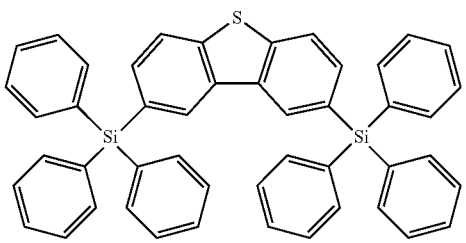 [SMILES: c1ccc([Si](c2ccccc2)(c2ccccc2)c2ccc3sc4ccc([Si](c5ccccc5)(c5ccccc5)c5ccccc5)cc4c3c2)cc1] | WO2009003898 |

TABLE 1-continued

| MATERIAL | EXAMPLES OF MATERIAL | PUBLICATIONS |
|---|---|---|
| Silicon/ Germanium aryl compounds | | EP2034538A |
| Aryl benzoyl ester | | WO2006100298 |
| High triplet metal organometallic complex | | U.S. Pat. No. 7,154,114 |

Phosphorescent dopants
Red dopants

| | | |
|---|---|---|
| Heavy metal porphyrins (e.g., PtOEP) | | Nature 395, 151 (1998) |
| Iridium(III) organometallic complexes | | Appl. Phys. Lett. 78, 1622 (2001) |

TABLE 1-continued

| MATERIAL | EXAMPLES OF MATERIAL | PUBLICATIONS |
|---|---|---|
| | | US2006835469 |
| | | US2006835469 |
| | | US20060202194 |
| | | US20060202194 |
| | | US20070087321 |

TABLE 1-continued

| MATERIAL | EXAMPLES OF MATERIAL | PUBLICATIONS |
|---|---|---|
| | | US20070087321 |
| | | Adv. Mater. 19, 739 (2007) |
| | | WO2009100991 |
| | | WO2008101842 |
| Platinum(II) organometallic complexes | | WO2003040257 |

TABLE 1-continued
| MATERIAL | EXAMPLES OF MATERIAL | PUBLICATIONS |
| --- | --- | --- |
| Osminum(III) complexes | 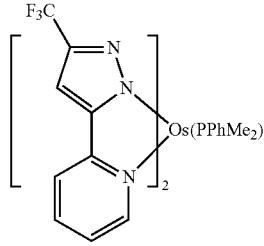 | Chem. Mater. 17, 3532 (2005) |
| Ruthenium(II) complexes | 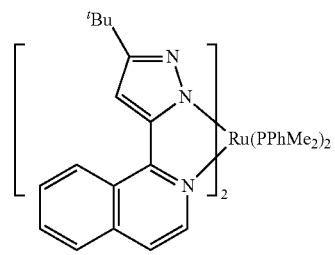 | Adv. Mater. 17, 1059 (2005) |
| Rhenium (I), (II), and (III) complexes | 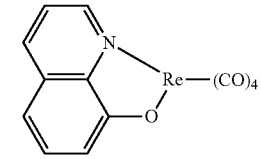 | US20050244673 |
Green dopants
| | | |
| --- | --- | --- |
| Iridium(III) organometallic complexes | 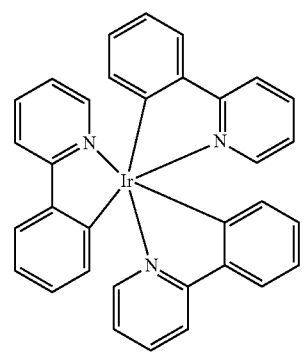
and its derivatives | Inorg. Chem. 40, 1704 (2001) |
| | 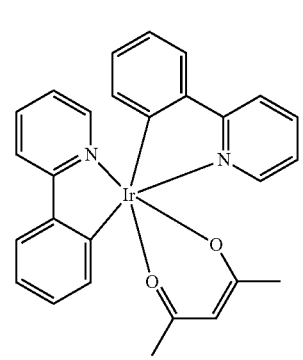 | US2002034656 |

TABLE 1-continued

| MATERIAL | EXAMPLES OF MATERIAL | PUBLICATIONS |
|---|---|---|
| | | U.S. Pat. No. 7,332,232 |
| | | US20090108737 |
| | | US20090039776 |
| | | U.S. Pat. No. 6,921,915 |

TABLE 1-continued

| MATERIAL | EXAMPLES OF MATERIAL | PUBLICATIONS |
|---|---|---|
| | | U.S. Pat. No. 6,687,266 |
| | | Chem. Mater. 16, 2480 (2004) |
| | | US20070190359 |
| | | US20060008670<br>JP2007123392 |
| | | Adv. Mater. 16, 2003 (2004) |

TABLE 1-continued

| MATERIAL | EXAMPLES OF MATERIAL | PUBLICATIONS |
|---|---|---|
| | | Angew. Chem. Int. Ed. 2006, 45, 7800 |
| | | WO2009050290 |
| | | US20090165846 |
| | | US20080015355 |
| Monomer for polymeric metal organometallic compounds | | U.S. Pat. No. 7,250,226, U.S. Pat. No. 7,396,598 |

TABLE 1-continued
| MATERIAL | EXAMPLES OF MATERIAL | PUBLICATIONS |
|---|---|---|
| Pt(II) organometallic complexes, including polydentated ligands | 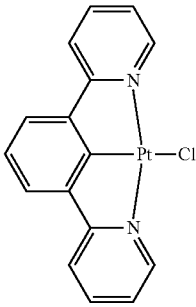 | Appl. Phys. Lett. 86, 153505 (2005) |
| | 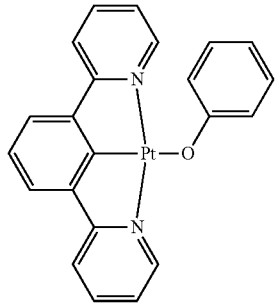 | Appl. Phys. Lett. 86, 153505 (2005) |
| | 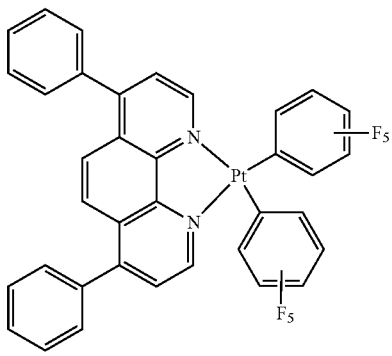 | Chem. Lett. 34, 592 (2005) |
| | 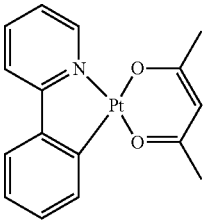 | WO2002015645 |
| | 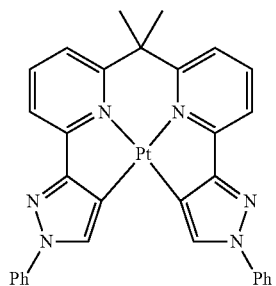 | US20060263635 |

TABLE 1-continued

| MATERIAL | EXAMPLES OF MATERIAL | PUBLICATIONS |
|---|---|---|
| Cu complexes | | WO2009000673 |
| Gold complexes | | Chem. Commun. 2906 (2005) |
| Rhenium(III) complexes | | Inorg. Chem. 42, 1248 (2003) |
| Deuterated organometallic complexes | | US20030138657 |

| MATERIAL | EXAMPLES OF MATERIAL | PUBLICATIONS |
|---|---|---|
| Organometallic complexes with two or more metal centers | 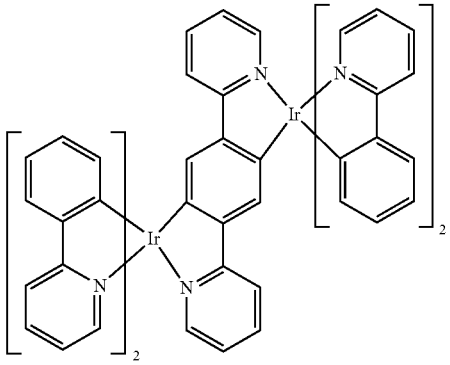 | US20030152802 |
| | 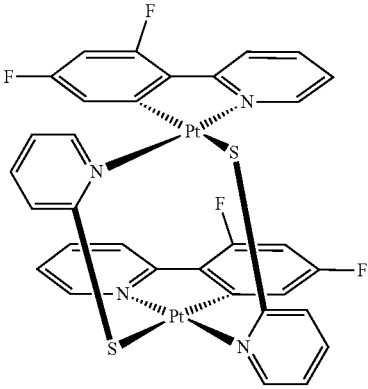 | U.S. Pat. No. 7,090,928 |
| Blue dopants | | |
| Iridium(III) organometallic complexes | 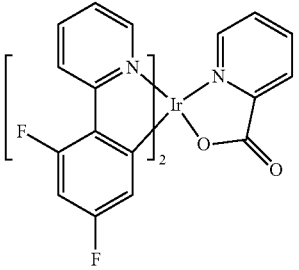 | WO2002002714 |
| | 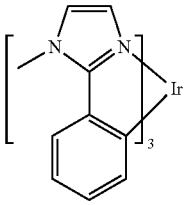 | WO2006009024 |
| | 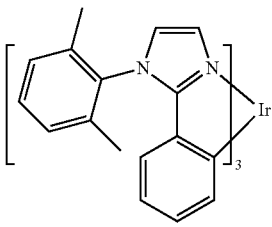 | US20060251923 |

TABLE 1-continued

| MATERIAL | EXAMPLES OF MATERIAL | PUBLICATIONS |
|---|---|---|
| | | U.S. Pat. No. 7,393,599, WO2006056418, US20050260441, WO2005019373 |
| | | U.S. Pat. No. 7,534,505 |
| | | U.S. Pat. No. 7,445,855 |
| | | US20070190359, US20080297033 |
| | | U.S. Pat. No. 7,338,722 |
| | | US20020134984 |

TABLE 1-continued

| MATERIAL | EXAMPLES OF MATERIAL | PUBLICATIONS |
|---|---|---|
| | | Angew. Chem. Int. Ed. 47, 1 (2008) |
| | | Chem. Mater. 18, 5119 (2006) |
| | | Inorg. Chem. 46, 4308 (2007) |
| | | WO2005123873 |
| | | WO2005123873 |

| MATERIAL | EXAMPLES OF MATERIAL | PUBLICATIONS |
|---|---|---|
| | 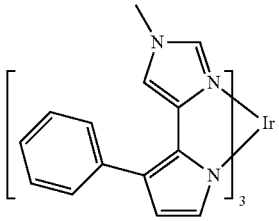 | WO2007004380 |
| | 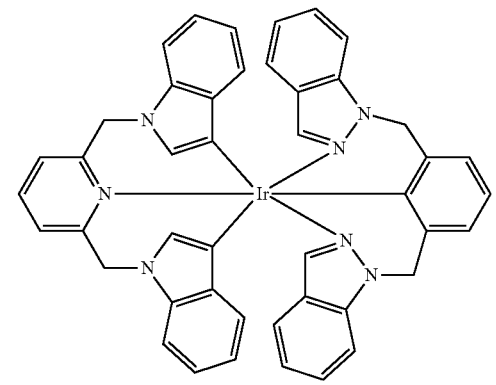 | WO2006082742 |
| Osmium(II) complexes | 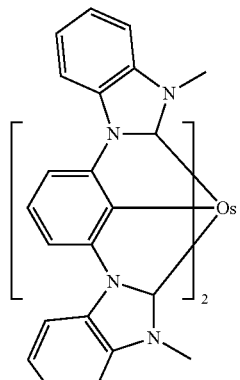 | U.S. Pat. No. 7,279,704 |
| | 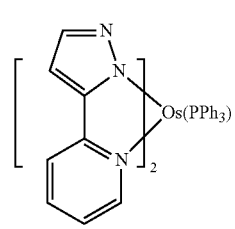 | Organometallics 23, 3745 (2004) |
| Gold complexes | 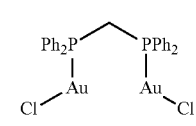 | Appl. Phys. Lett. 74, 1361 (1999) |
| Platinum(II) complexes | 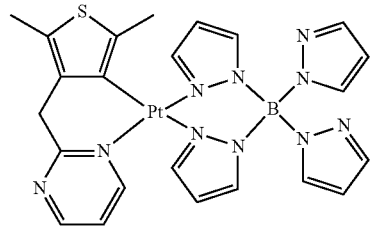 | WO2006098120, WO20062103874 |

TABLE 1-continued

| MATERIAL | EXAMPLES OF MATERIAL | PUBLICATIONS |
|---|---|---|
| Exciton/hole blocking layer materials | | |
| Bathocuprine compounds (e.g., BCP, BPhen) | 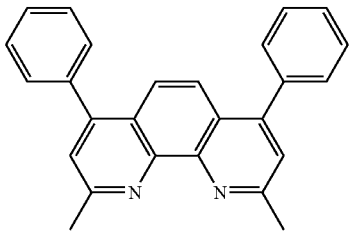 [SMILES: Cc1cc(-c2ccccc2)c2ccc3c(-c4ccccc4)cc(C)nc3c2n1] | Appl. Phys. Lett. 75, 4 (1999) |
| | 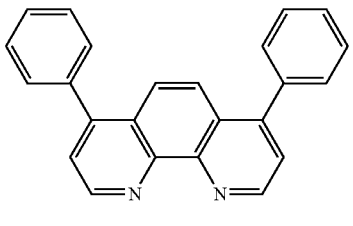 [SMILES: c1ccc(-c2ccnc3c2ccc2c(-c4ccccc4)ccnc23)cc1] | Appl. Phys. Lett. 79, 449 (2001) |
| Metal 8-hydroxy-quinolates (e.g., BAlq) | 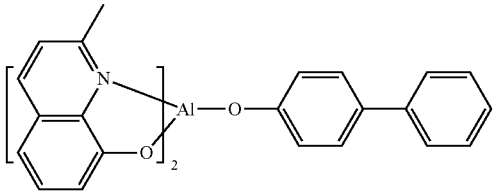 | Appl. Phys. Lett. 81, 162 (2002) |
| 5-member ring electron deficient heterocycles such as triazole, oxadiazole, imidazole, benzoimidazole | 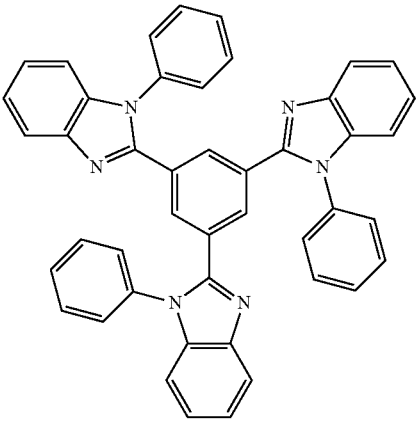 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 81, 162 (2002) |
| Triphenylene compounds | 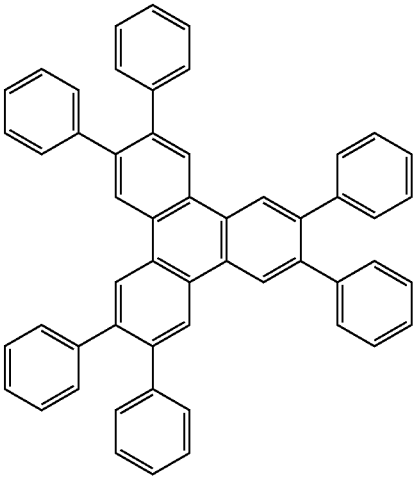 [SMILES: c1ccc(-c2cc3c4cc(-c5ccccc5)c(-c5ccccc5)cc4c4cc(-c5ccccc5)c(-c5ccccc5)cc4c3cc2-c2ccccc2)cc1] | US20050025993 |

TABLE 1-continued
| MATERIAL | EXAMPLES OF MATERIAL | PUBLICATIONS |
|---|---|---|
| Fluorinated aromatic compounds | 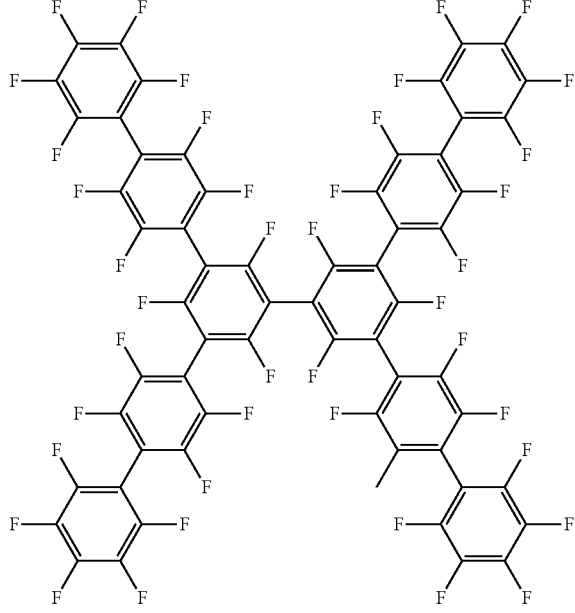 [SMILES: Cc1c(F)c(-c2c(F)c(-c3c(F)c(F)c(-c4c(F)c(F)c(F)c(F)c4F)c(F)c3F)c(F)c(-c3c(F)c(-c4c(F)c(F)c(-c5c(F)c(F)c(F)c(F)c5F)c(F)c4F)c(F)c(-c4c(F)c(F)c(-c5c(F)c(F)c(F)c(F)c5F)c(F)c4F)c3F)c2F)c(F)c(F)c1-c1c(F)c(F)c(F)c(F)c1F] | Appl. Phys. Lett. 79, 156 (2001) |
| Phenothiazine-S-oxide | 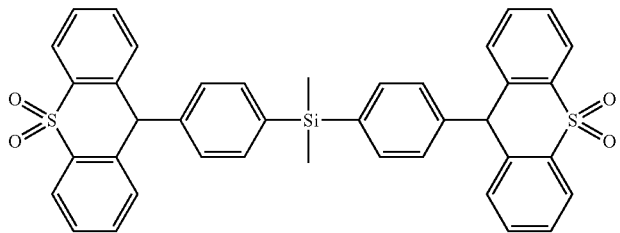 [SMILES: C[Si](C)(c1ccc(C2c3ccccc3S(=O)(=O)c3ccccc32)cc1)c1ccc(C2c3ccccc3S(=O)(=O)c3ccccc32)cc1] | WO20081232085 |
Electron transporting materials
| | | |
|---|---|---|
| Anthracene-benzoimidazole compounds | 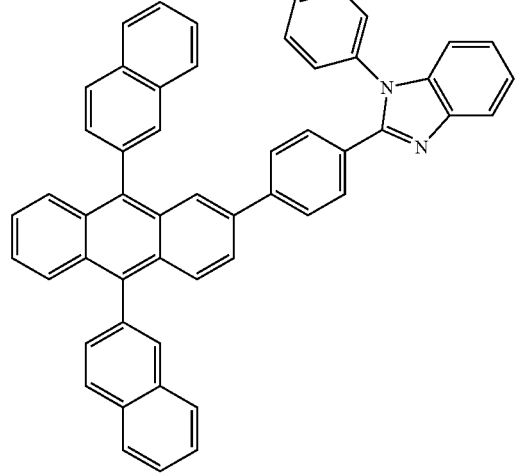 | WO2003060956 |

TABLE 1-continued
| MATERIAL | EXAMPLES OF MATERIAL | PUBLICATIONS |
|---|---|---|
| | 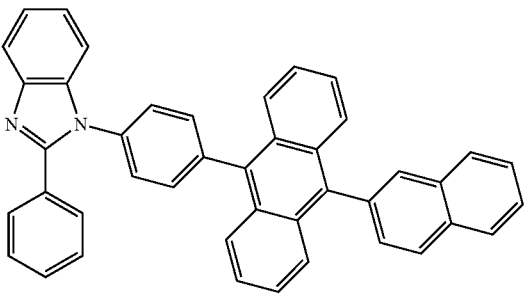 [SMILES: c1ccc(-c2nc3ccccc3n2-c2ccc(-c3c4ccccc4c(-c4ccc5ccccc5c4)c4ccccc34)cc2)cc1] | US20090179554 |
| Aza triphenylene derivatives | 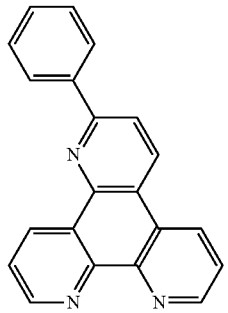 [SMILES: c1ccc(-c2ccc3c4cccnc4c4ncccc4c3n2)cc1] | US20090115316 |
| Anthracene-benzothiazole compounds | 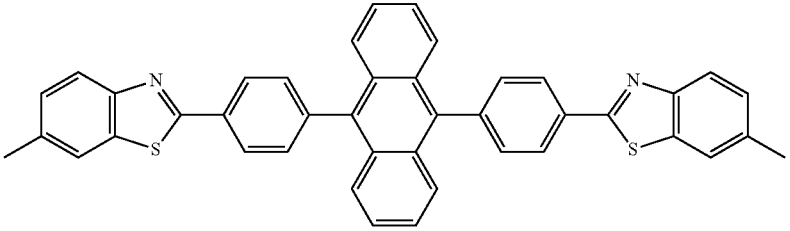 | Appl. Phys. Lett. 89, 063504 (2006) |
| Metal 8-hydroxy-quinolates (e.g., Alq$_3$, Zrq$_4$) | 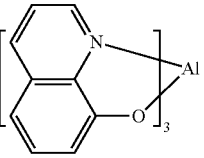 | Appl. Phys. Lett. 51, 913 (1987) U.S. Pat. No. 7,230,107 |
| Metal hydroxy-benoquinolates | 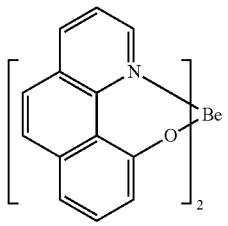 | Chem. Lett. 5, 905 (1993) |
| Bathocuprine compounds such as BCP, BPhen, etc | 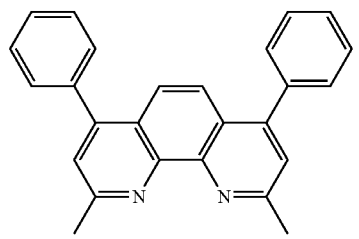 [SMILES: Cc1cc(-c2ccccc2)c2ccc3c(-c4ccccc4)cc(C)nc3c2n1] | Appl. Phys. Lett. 91, 263503 (2007) |

TABLE 1-continued
| MATERIAL | EXAMPLES OF MATERIAL | PUBLICATIONS |
|---|---|---|
|  | 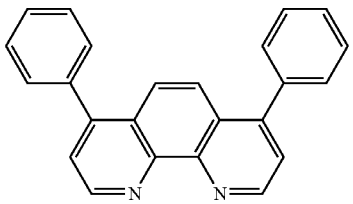 [SMILES: c1ccc(-c2ccnc3c2ccc2c(-c4ccccc4)ccnc23)cc1] | Appl. Phys. Lett. 79, 449 (2001) |
| 5-member ring electron deficient heterocycles (e.g., triazole, oxadiazole, imidazole, benzo-imidazole) | 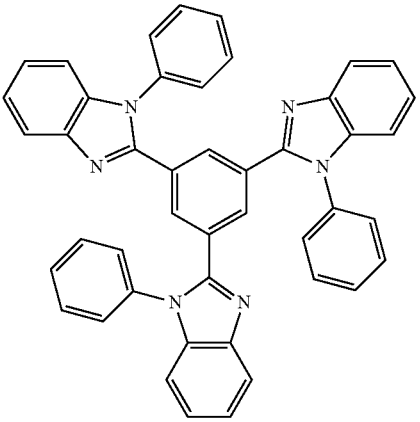 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 74, 865 (1999) |
|  | 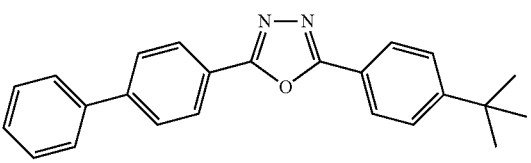 [SMILES: CC(C)(C)c1ccc(-c2nnc(-c3ccc(-c4ccccc4)cc3)o2)cc1] | Appl. Phys. Lett. 55, 1489 (1989) |
|  | 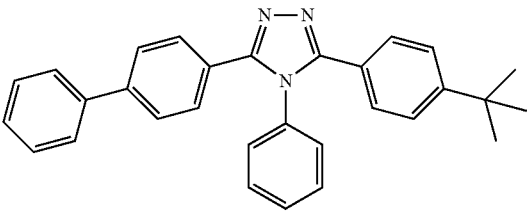 [SMILES: CC(C)(C)c1ccc(-c2nnc(-c3ccc(-c4ccccc4)cc3)n2-c2ccccc2)cc1] | Jpn. J. Apply. Phys. 32, L917 (1993) |
| Silole compounds | 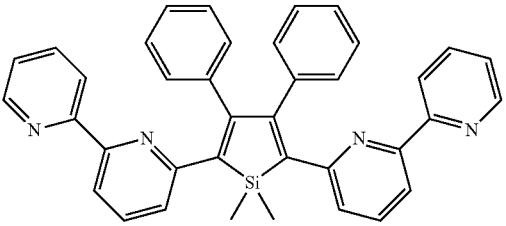 [SMILES: C[Si]1(C)C(c2cccc(-c3ccccn3)n2)=C(c2ccccc2)C(c2ccccc2)=C1c1cccc(-c2ccccn2)n1] | Org. Electron 4, 113 (2003) |
| Arylborane compounds | 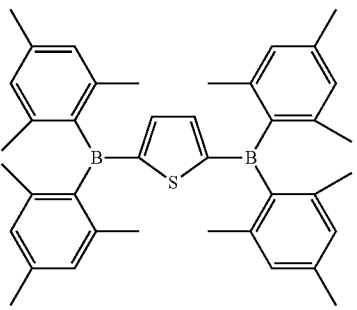 | J. Am. Chem. Soc. 120, 9714 (1998) |

TABLE 1-continued

| MATERIAL | EXAMPLES OF MATERIAL | PUBLICATIONS |
|---|---|---|
| Fluorinated aromatic compounds | 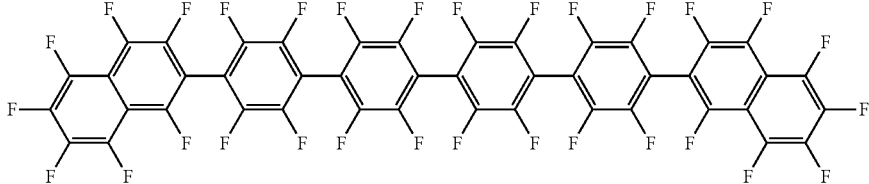 [SMILES: Fc1c(F)c(-c2c(F)c(F)c(-c3c(F)c(F)c4c(F)c(F)c(F)c(F)c4c3F)c(F)c2F)c(F)c(F)c1-c1c(F)c(F)c(-c2c(F)c(F)c(-c3c(F)c(F)c4c(F)c(F)c(F)c(F)c4c3F)c(F)c2F)c(F)c1F] | J. Am. Chem. Soc. 122, 1832 (2000) |
| Fullerene (e.g., C60) | 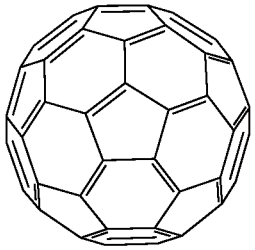 [SMILES: c1cc2c3ccc4c5ccc6c7ccc8c9ccc%10c1c1c2c2c3c4c3c5c6c4c7c8c5c9c%10c1c1c2c3c4c51] | US20090101870 |
| Triazine complexes | 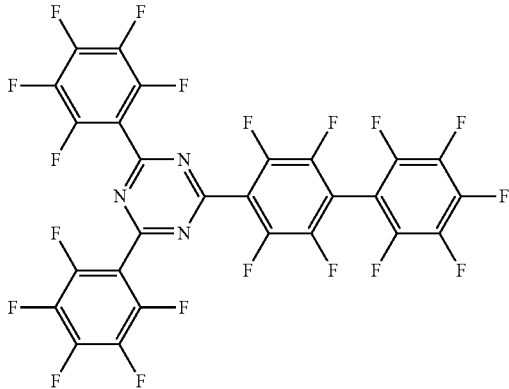 [SMILES: Fc1c(F)c(F)c(-c2nc(-c3c(F)c(F)c(F)c(F)c3F)nc(-c3c(F)c(F)c(-c4c(F)c(F)c(F)c(F)c4F)c(F)c3F)n2)c(F)c1F] | US20040036077 |
| Zn (N^N) complexes | 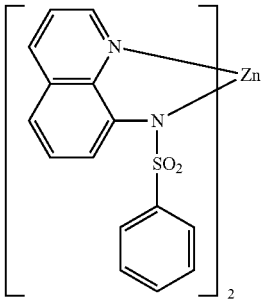 | U.S. Pat. No. 6,528,187 |

Experimental

Compound Examples

Synthesis of Compound 1

Step 1

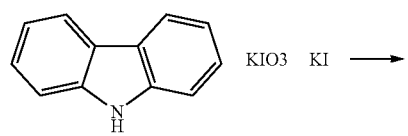 KIO3  KI ⟶

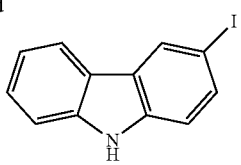

Step 1. The solution of carbazole and potassium iodide in 550 mL of acetic acid was heated up to 120° C. to dissolve the reactants and then allowed to cool back to 100° C. Potassium iodate was added slowly at this temperature and reaction was stirred at 100° C. for 2 h. The reaction then was allowed to cool down to 60° C. and 500 mL of water were added, result ing formation of grey precipitate. The solid material was filtered and washed with hot water. Then it was dissolved in CH$_2$Cl$_2$; this solution was carefully washed with NaHCO$_3$ aq., NaHSO$_3$ aq., brine, then dried over sodium sulfate. The volume was reduced to form slurry mixture, then cool down and kept for at least 30 minutes at room temperature, solid material was filtered, washed fast once with minimum amount of CH$_2$Cl$_2$ and dried. It was placed in a 500 mL flask, added 100 mL EtOAc, rotated at the rotavap at 60° C. for 20 minutes without vacuum, then started to pump out solvent to form a slurry mixture, then added 200 mL of hexanes and keep at 55° C. for 15 minutes without vacuum. Then cooled down to room temperature, kept for 30 minutes, briefly sonicated for 3 minutes, filtered solid material and washed it with a lot of hexane. Material was dried in vacuum, providing 24 g (40% yield) of pure.

0.14 mol) was added and stirred upon complete solubilization; followed by slow addition of tosyl chloride (22.8 g, 0.12 mol). The reaction was heated to reflux for 3 h. Reaction mixture was cooled down to 60-70° C. and poured into water while stirred at a constant speed; stirring was continued for a while after pouring all amount. A product precipitated on the glass wall; after 30 minutes, water was decanted, the precipitate was washed with water, then with EtOH twice. The residual material was dissolved in CH$_2$Cl$_2$, and partially evaporated to see the solid formation, added big volume of EtOH, and continued to evaporate all CH$_2$Cl$_2$ (repeated several times). Stirred at 60° C. for 10 minutes then cooled down, kept at 20° C. and filtered, the precipitate was washed with EtOH and dried, providing 40 g (90% yield) of pure 3-Iodo-9-tosyl-9H-carbazole.

Step 3

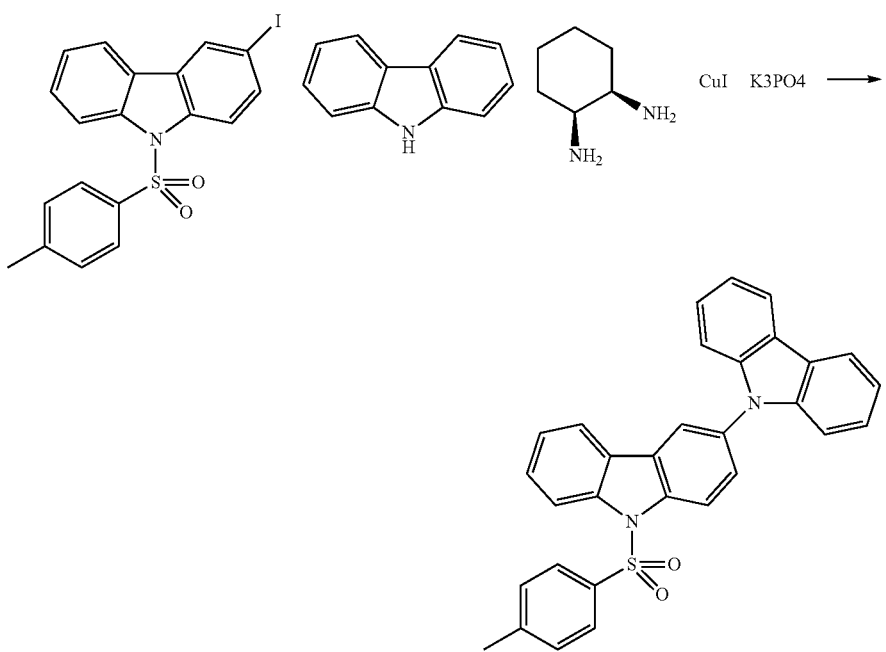

Step 2

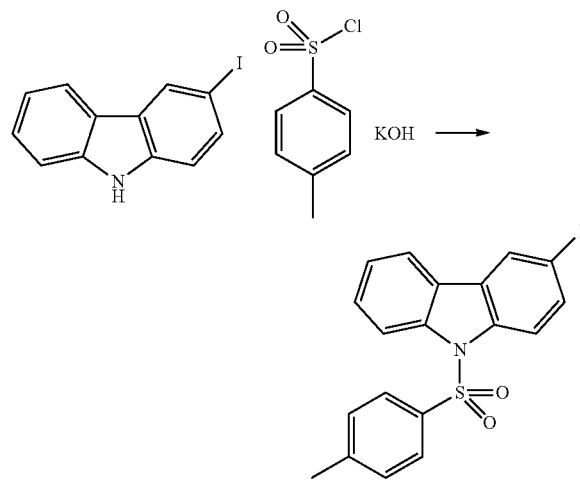

Step 2. 2-Iodocarbazole (29.2 g, 0.1 mol) was dissolved in 200 mL of dry acetone, then potassium hydroxide (7.84 g, Step 3. 3-Iodo-9-tosyl-9H-carbazole (31.29 g, 0.07 mol), Cu(I) iodide (1.33 g, 0.007 mol), potassium phosphate (29.7 g, 0.14 mol) and carbazole (14.03 g. 0.084 mol) were combined in 3-neck flask, degassed 4 times and cyclohexane-1,3-diamine (1.14 g, 0.01 mol) in 400 mL of anhydrous toluene was added. Degassed again, fill reaction flask with N$_2$ and heated to reflux overnight (20 h). The reaction was cooled down to 20° C., filtered through a plug of silica gel toped with celite, washed with toluene; the plug was washed with CH$_2$Cl$_2$, combined organic fractions were evaporated. The residue was dissolved in 100 mL of CH$_2$Cl$_2$ and 300 mL of EtOH were added; then CH$_2$Cl$_2$ was evaporated. The residue in EtOH was at 70° C. for 20 minutes, then was cooled down to 20° C., kept for 2 h and filtered. The solid material was washed with ethanol and dried, providing 30 g (88% yield) of the product.

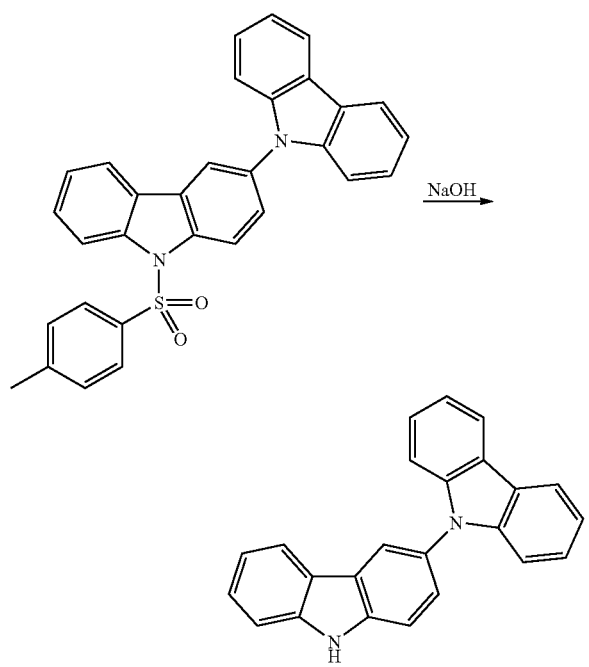

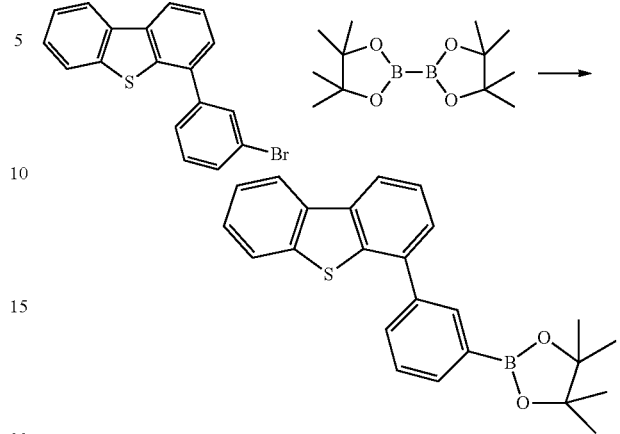

Step 4. The solution of sodium hydroxide (27.4 g) in 150 mL of water was added to 32 g of 9-tosyl-9H-3,9'-bicarbazole, dissolved in 300 mL of THF and 150 mL of methanol. The reaction was allowed to reflux overnight. Then organic solvents were evaporated, added 100 mL of brine and extracted with 3×200 mL of ethyl acetate, combined organic layers, dried over Na₂SO₄ and evaporated. The residue was dissolved in 200 mL of CH₂Cl₂ and absorbed on silica gel. Purified by column chromatography, eluting with gradient mixture of ethyl acetate:hexane from 10:90 to 15:85. The solid was crystallized from ethyl acetate/hexane mixture, providing 17 g (78% yield) of pure material.

Step 5

Step 6. 4-(3-Bromophenyl)dibenzo[b,d]thiophene (14.14 g, 41.7 mmol) was dissolved in dioxane (200 mL) to give a colorless solution. 4,4,4',4',5,5,5',5'-Octamethyl-2,2'-bi(1,3,2-dioxaborolane) (12.70 g, 50.0 mmol) was added as one portion, followed by potassium acetate (8.18 g, 83 mmol), Pd₂(dba)₃ (0.382 g, 0.417 mmol) and 1,1'-bis(diphenylphosphino)ferrocene (dppf, 0.254 g, 0.834 mmol), then reaction mixture was degassed. Refluxed overnight under N₂, cooled down, diluted with ethyl acetate (150 mL), washed with brine, NaHSO₃ and LiCl 10% aq.sol. Filtered, evaporated, the residue was purified by column chromatography (silica 250 g, hex/dcm 9:1), providing 2-(3-(dibenzo[b,d]thiophen-4-yl)phenyl)-4,4,5,5-tetramethyl-1,3,2-dioxaborolane as white solid, 12.8 g (80% yield).

Step 7

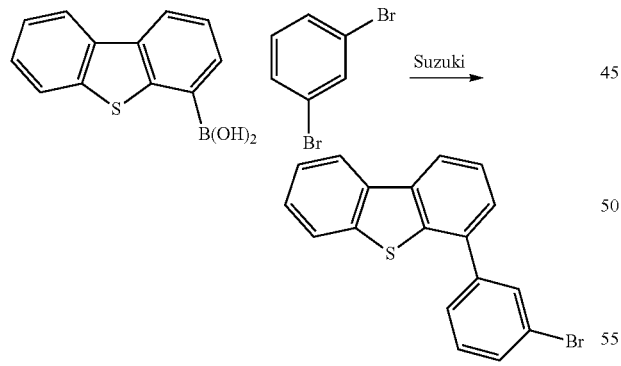

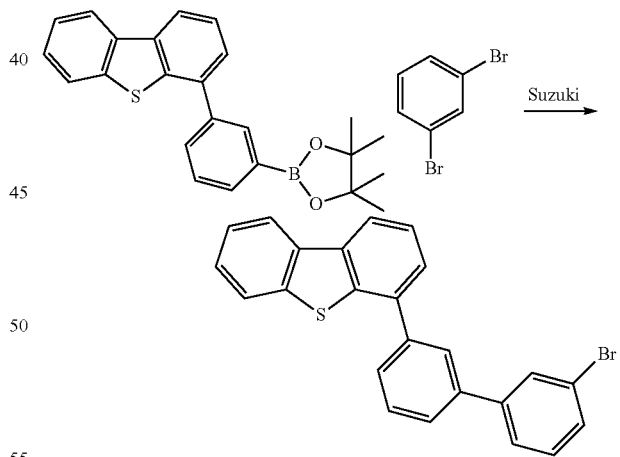

Step 5. Potassium carbonate (18.18 g, 132 mmol) was dissolved in water (75 mL), sonicated, and solution was added to the solution of dibenzo[b,d]thiophen-4-ylboronic acid (10.00 g, 43.8 mmol) and 1,3-dibromobenzene (13.79 ml, 114 mmol) in Toluene (200 mL). Added catalyst (1.013 g, 0.877 mmol), degassed, heated to reflux for 24 h under N₂ atmosphere. Cooled down, evaporated, purified by chromatography on silica gel (250 g), eluting with hexane/CH₂Cl₂ 99/1. Chromatographed material was then crystallized from hexane, providing white solid, 10.5 g (67% yield).

Step 7. 2-(3-(dibenzo[b,d]thiophen-4-yl)phenyl)-4,4,5,5-tetramethyl-1,3,2-dioxaborolane (14.50 g, 37.5 mmol), 1,3-dibromobenzene (26.6 g, 113 mmol) were dissolved in 200 mL of toluene, added K₂CO₃ aq. solution (16 g in 100 mL), followed by the tetrakis (triphenylphosphine)palladium (0) (0.434 g). Reaction was degassed, filled with N₂, refluxed under N₂ atm. overnight. Organic layer was separated, dried over sodium sulfate, filtered and evaporated. The residue was purified by column chromatography on silica column (200 g, eluted with hexane/CH₂Cl₂ 95:5), then crystallized from hexane, providing white solid, 10.1 g (65% yield).

Step 8

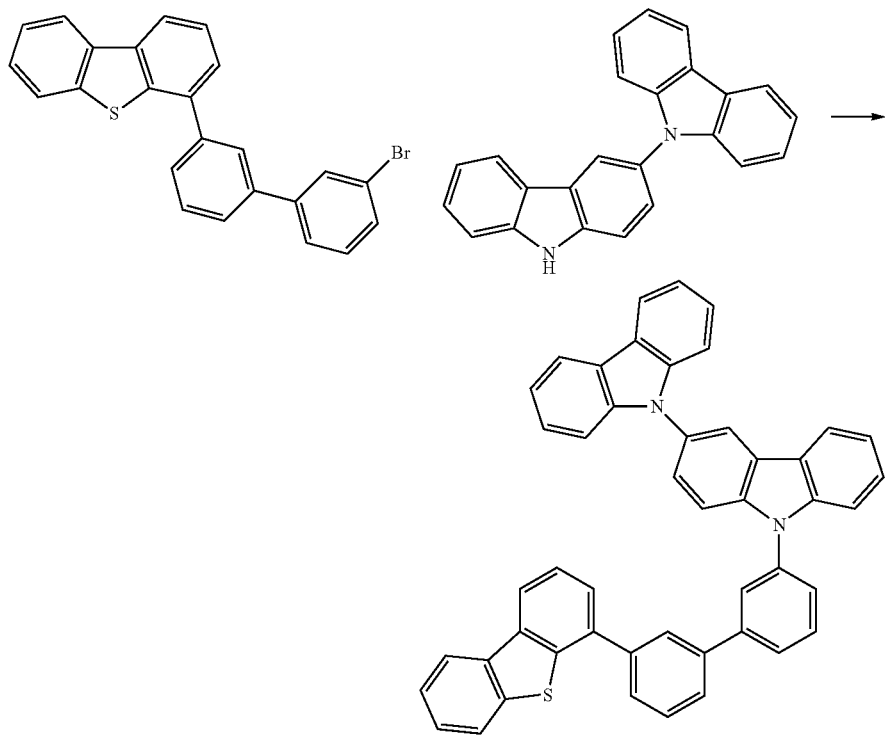

Compound 1

Step 8. 4-(3'-bromo-[1,1'-biphenyl]-3-yl)dibenzo[b,d]thiophene (6.20 g, 14.93 mmol), 9H-3,9'-bicarbazole (4.96 g, 14.93 mmol) were suspended in xylene (dry, 200 ml), added Pd₂ dba₃ (0.273 g, 0.299 mmol), dicyclohexyl(2',6'-dimethoxy-[1,1'-biphenyl]-3-yl)phosphine (0.245 g, 0.597 mmol) and sodium 2-methylpropan-2-olate (2.87 g, 29.9 mmol), degassed, heated to reflux upon vigorous stirring under N₂ atm. for 24 h. Hot reaction mixture was filtered through celite plug, concentrated and loaded on silica column (250 g). Eluted with hexane/CH₂Cl₂ 4:1, concentrated fractions, pure by TLC and HPLC. White solid precipitated, it was washed with hexane and crystallized from ethyl acetate, providing Compound 1 as white solid (8.5 g, 85% yield).

Device Examples

Several devices comprising the inventive compounds were fabricated. The anode electrode is ~800 Å of indium tin oxide (ITO). The cathode consisted of 10 Å of LiF followed by 1,000 Å of Al. All devices were encapsulated with a glass lid sealed with an epoxy resin in a nitrogen glove box (<1 ppm of H₂O and O₂) and a moisture getter was incorporated inside the package.

As used herein, the following compounds have the following structures:

Compound A

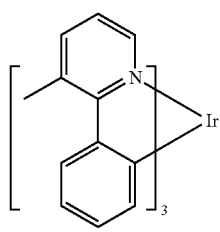

-continued

Compound B

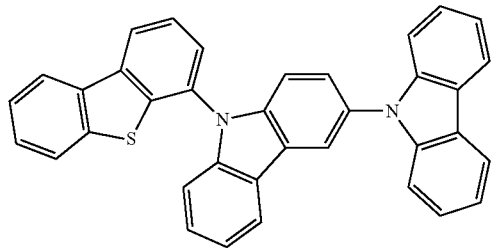

Compound C

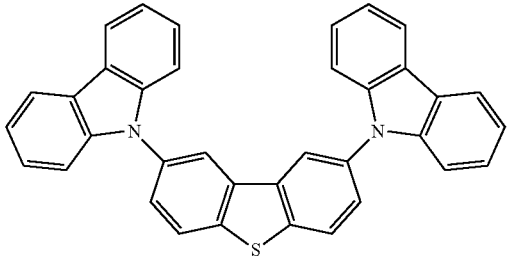

Compound D
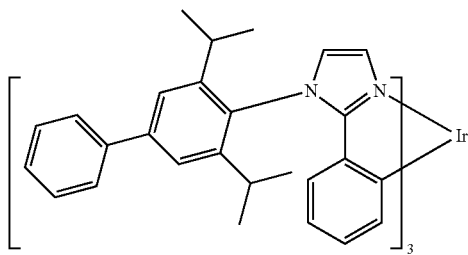
Compound E
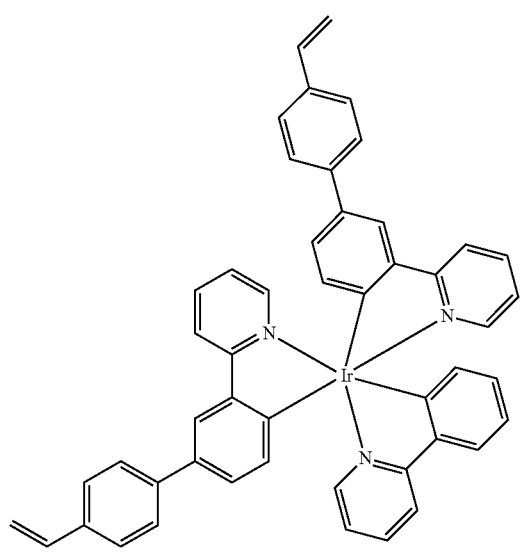
Compound F
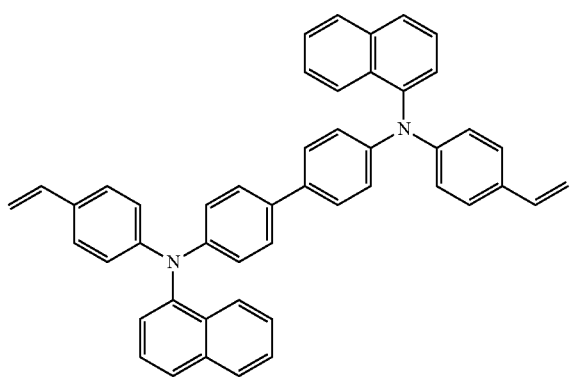
Compound G
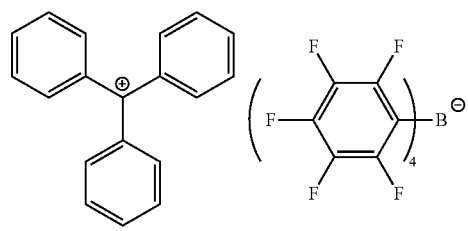
Compound H
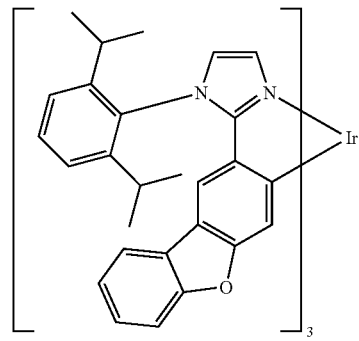
Compound I
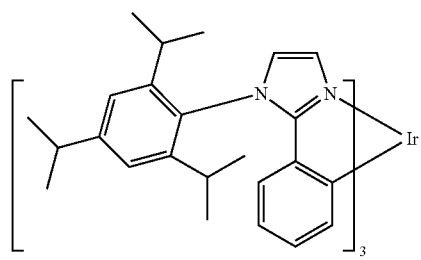
Compound J
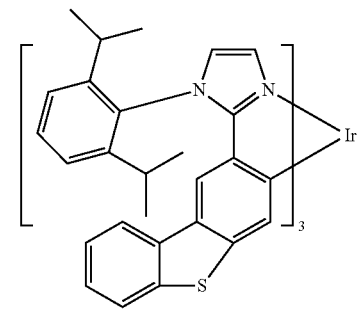
Compound K
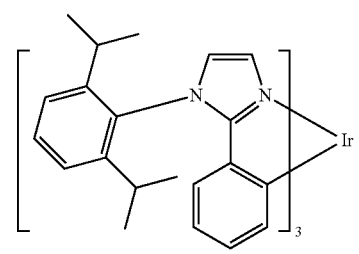
Compound L
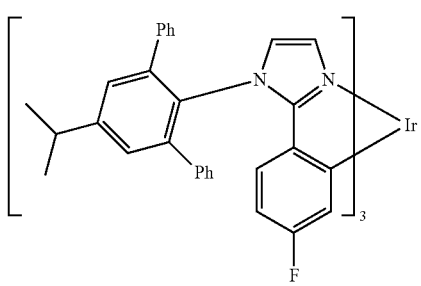

-continued

Compound M

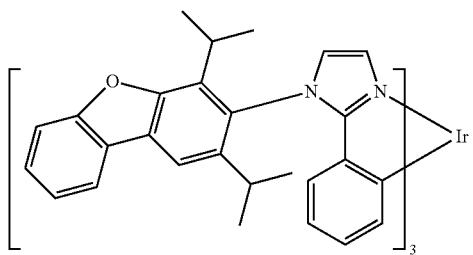

Compound N

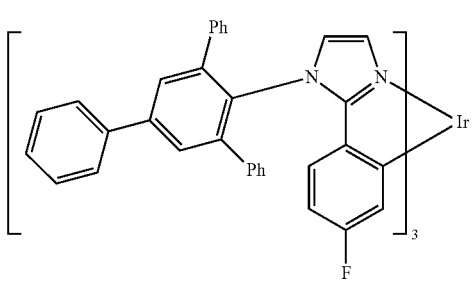

Compound O

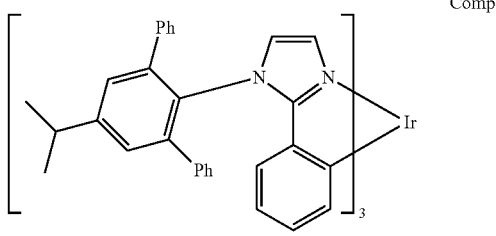

Compound P

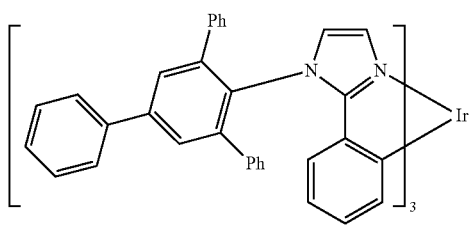

Compound I

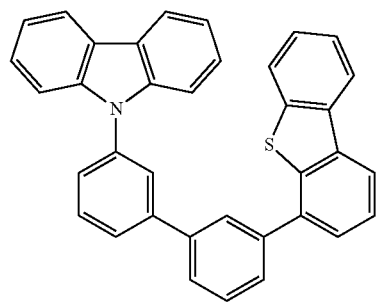

-continued

Compound II

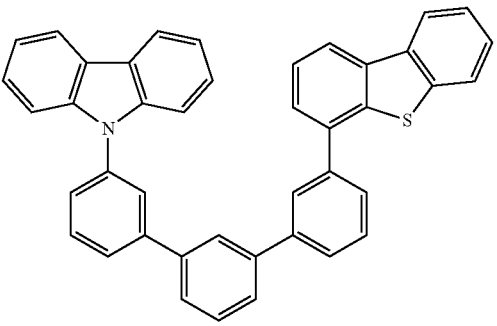

Compound III

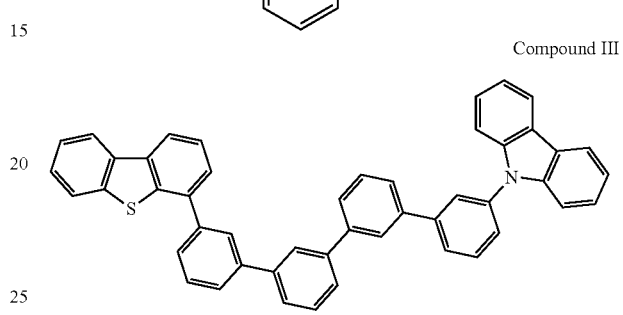

Compound IV

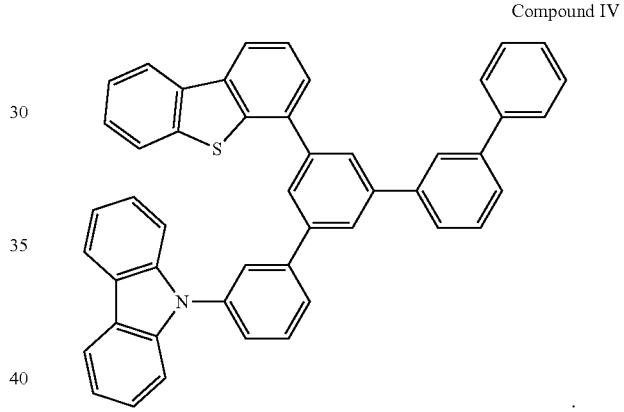

Solution Processed Devices:

Device Example 1 was fabricated as described below. Compound E and Compound G were dissolved in cyclohexanone. The amount of Compound G in the solution was 10 wt % relative to HIL-1. The total concentration of Compound E and Compound G was 0.5 wt % in cyclohexanone. To form the hole injection layer (HIL), the solution was spin-coated at 4000 rpm for 60 seconds onto a patterned indium tin oxide (ITO) electrode. The resulting film was baked for 30 minutes at 250° C. The film became insoluble after baking. On top of the HIL, a hole transporting layer (HTL) and then emissive layer (EML) were also formed by spin-coating. The HTL was made by spin-coating a 0.5 wt % solution of Compound F in toluene at 4000 rpm for 60 seconds. The HTL film was baked at 200° C. for 30 minutes. After baking, the HTL became an insoluble film. To form the EML, a toluene solution containing 80% of Compound 1 and 20% of Compound D (net concentration of 1 wt % in toluene) was spin-coated on top of the insoluble HTL at 1000 rpm for 60 seconds, and then baked at 80° C. for 60 minutes to remove solvent residues. Then a 50 Å thick layer of Compound C was deposited by vacuum thermal evaporation as the blocking layer (BL). Then a 200 Å thick layer of Alq$_3$ was deposited by vacuum thermal evaporation as the electron transporting layer (ETL).

Comparative Device Example 1 was fabricated similarly except the host was Compound C instead of Compound 1. The device data is shown in Table 2.

TABLE 2

| Example | Host | Dopant (conc.) | ETL2 | At 10 mA/cm² 1931 CIE | Voltage (V) | LE (cd/A) | At $L_0$ = 2000 cd/m² $LT_{80}$ (h) |
|---|---|---|---|---|---|---|---|
| Device Example 1 | Cmpd 1 | 20% | Cmpd C | (0.18, 0.38) | 10 | 14.4 | 153 |
| Comparative Device Example 1 | Cmpd C | 20% | Cmpd C | (0.18, 0.38) | 9.5 | 19.1 | 39 |

Vacuum Thermal Evaporation Devices:

Device examples 2 and 3 and Comparative Device examples 2-9 were fabricated by high vacuum (<10⁻⁷ Torr) thermal evaporation. The organic stack of the Device Examples 2 and 3 and Comparative Device Examples 2-9 in Table 3 consists of sequentially, from the ITO surface, 100 Å of Compound D as the hole injection layer (HIL), 300 Å of α-NPD as the hole transporting layer (HTL), 300 Å of Compound 1, Compound B or Compound C doped with 15 wt % of Compound D as the emissive layer (EML), 50 Å of Compound 1, Compound B, Compound C, Compound III, or Compound IV as the blocking layer (BL) and 400 Å of Alq₃ as the electron transporting layer (ETL). The device structure and result are shown in Table 3.

Table 2 summarizes the data of the solution processed devices. Device Example 1 has significantly higher operation stability over Comparative Device Example 1. $LT_{80}$ (defined as the time required for the initial luminance, $L_0$, to drop from 100% to 90% under constant current density at room temperature) of Device Example 1 is 153 h, whereas that of Comparative Device Example 1 is 39 h. Although the luminance efficiency (LE) at J=10 mA/cm² of Comparative Device Example 1 is higher (19.1 cd/A), Device Example 1 is still quite efficient (14.4 cd/A).

TABLE 3

| Examples | Host | Dopant (conc.) | BL | 1931 CIE x | 1931 CIE y | $\lambda_{max}$ (nm) | $LT_{80}$ (h) | At 1000 cd/m² LE (cd/A) | EQE (%) | PE (lm/W) | At $L_0$ = 2000 cd/m² $LT_{80}$ (h) |
|---|---|---|---|---|---|---|---|---|---|---|---|
| Device Example 2 | Cmpd 1 | 15% | Cmpd C | 0.183 | 0.407 | 474 | 7.2 | 38 | 16.2 | 16.6 | 1063* |
| Device Example 3 | Cmpd 1 | 15% | Cmpd 1 | 0.183 | 0.409 | 474 | 7.8 | 36.6 | 15.6 | 14.8 | 861* |
| Comparative Device Example 2 | Cmpd C | 15% | Cmpd C | 0.180 | 0.397 | 474 | 7.1 | 36.6 | 15.9 | 16.3 | 600* |
| Comparative Device Example 3 | Cmpd B | 15% | Cmpd B | 0.180 | 0.387 | 474 | 6.8 | 35.7 | 15.8 | 16.5 | 604 |
| Comparative Device Example 4 | Cmpd I | 15% | Cmpd C | 0.181 | 0.397 | 474 | 7.5 | 33.8 | 14.7 | 14.1 | 530* |
| Comparative Device Example 5 | Cmpd II | 15% | Cmpd C | 0.181 | 0.407 | 474 | 7.7 | 35 | 14.9 | 14.4 | 750 |
| Comparative Device Example 6 | Cmpd III | 15% | Cmpd C | 0.183 | 0.409 | 474 | 7.5 | 37.1 | 15.8 | 15.5 | 596* |
| Comparative Device Example 7 | Cmpd III | 15% | Cmpd III | 0.183 | 0.409 | 474 | 8.1 | 36 | 15.4 | 13.9 | 532* |
| Comparative Device Example 8 | Cmpd IV | 15% | Cmpd C | 0.185 | 0.411 | 474 | 7.6 | 36 | 15.4 | 14 | 457* |
| Comparative Device Example 9 | Cmpd IV | 15% | Cmpd IV | 0.185 | 0.414 | 474 | 8 | 35.5 | 15 | 14.8 | 407* |

*calculated based on lifetest at J = 20 mA/cm².

Table 3 summarizes the data of the vacuum thermal evaporation devices. Device Example 2 and Comparative Device Example 2 have the same structure except Device Example 2 has Compound 1 as the host, whereas Comparative Device Example 2 has Compound C as the host. The two devices have similar efficiency (~16% EQE). However, Device Example 2 is significantly more stable compared to Comparative Device Example 2. $LT_{80}$ of Device Example 2 is 1063 h, whereas that of Comparative Device Example 2 is 600 h. Device Example 3 and Comparative Device Example 3 have the same structure except Device Example 3 has Compound 1 as the host and BL, whereas Comparative Device Example 3 has Compound B as the host and BL. The two devices have similar efficiency (~16% EQE). However, Device Example 3 is significantly more stable compared to Comparative Device Example 3.

LT$_{80}$ of Device Example 3 is 861 h whereas that of Comparative Device Example 1 is 604 h. Device Example 2 and Comparative Device Example 4 have the same structure except Device Example 2 has Compound 1 as the host, whereas Comparative Device Example 4 has Compound I as the host. Not only does Device Example 2 has a higher efficiency, it is significantly more stable compared to Comparative Device Example 4. LT$_{80}$ of Device Example 2 is 1063 h, whereas that of Comparative Device Example 4 is 530 h.

The data suggests two superior features of compounds having Formula I. First, Compound 1, with a 3,9-linked oligocarbazole moiety and a dibenzothiophene moiety linked by an aromatic group, results in high device stability compared to compounds with 3,9-linked oligocarbazole moiety and dibenzothiophene moiety directly connected. It is believed that the presence of an aromatic linker has an effect on the conjugation, thus improving the device stability. Second, compounds with carbazole and dibenzothiophene moieties are inferior to compounds with 3,9-linked oligocarbazole and dibenzothiophene moieties, even with an aromatic linker. 3,9-linked oligocarbazole, the main HOMO contributor in the compounds provided herein, is more electron-rich than carbazole. The oxidation and reduction potentials of Compound 1 are 0.74 V and −2.73 V (vs Fc/Fc$^+$), respectively. The oxidation and reduction potentials of Compound C are 0.91 V and −2.84 V, respectively. The higher HOMO level of Compound 1 may increase hole injection from the HTL and hole transport in the EML. This may result in better device charge balance and/or location of charge recombination, leading to improved device lifetime.

The oxidation and reduction potentials of Compound B are 0.74 V and −2.78 V, respectively. While the HOMO levels of Compound 1 and Compound B are similar, the LUMO level of Compound 1 is slightly lower presumably due to the extra π-system provided by the biphenyl linker. Generally, in compounds containing a 3,9-linked oligocarbazole moiety and a dibenzothiophene moiety with an aromatic linker, the control over π-conjugation, thermal properties and further structural/electronic modification by substituents is better than in corresponding compounds without an aromatic linker. In addition to difference in electronic properties, it is believed that the Compound 1 provides better morphology and morphological stability compared to Compound B and Compound C, leading to improved device lifetime. In particular, materials having an asymmetrical structure, such as the 3,9-linked oligocarbazole structure, may offer improved film formation. The improved film formation is believed to be a result of reduced crystallization due to the asymmetrical structure of the compound. This has been evidenced by unexpected results from solution processing devices using the compounds as a host material.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. A first device, comprising an organic light emitting device comprising:
    an anode;
    a cathode; and
    a first organic layer disposed between the anode and the cathode, comprising a compound having the formula:

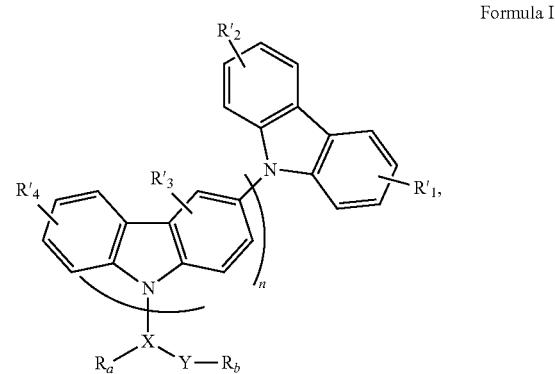

Formula I wherein n is 1;
wherein R'$_1$, R'$_2$, R'$_3$, R'$_4$, R$_a$, and R$_b$ are hydrogen;
wherein X is biphenyl; and
wherein Y is dibenzothiophene.

2. The first device of claim 1, wherein the compound is

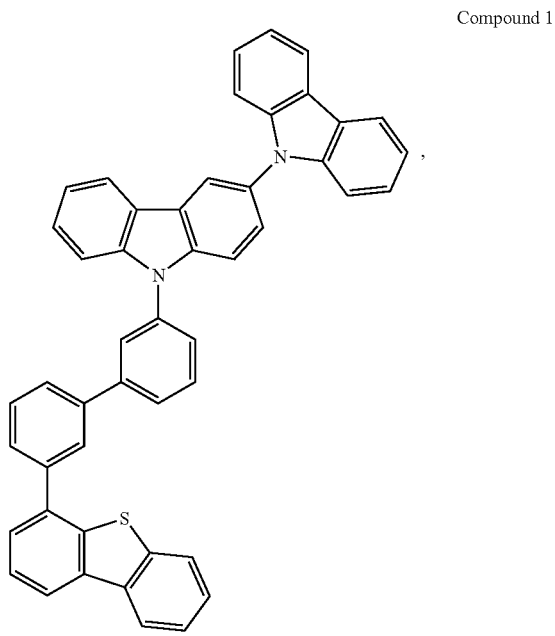 [SMILES: c1cc(-c2cccc(-n3c4ccccc4c4cc(-n5c6ccccc6c6ccccc65)ccc43)c2)cc(-c2cccc3c2sc2ccccc23)c1]

Compound 1

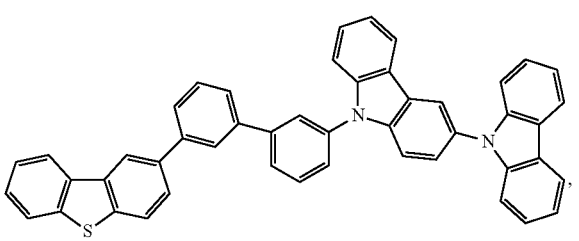

Compound 7

-continued

Compound 49
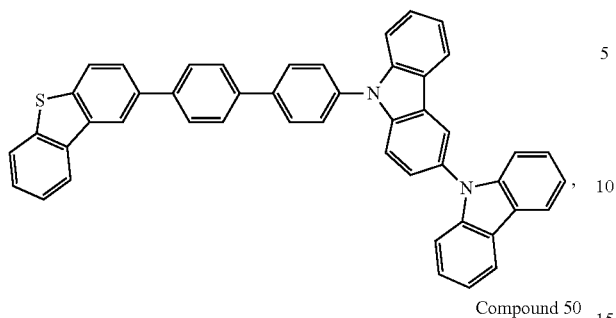

Compound 50
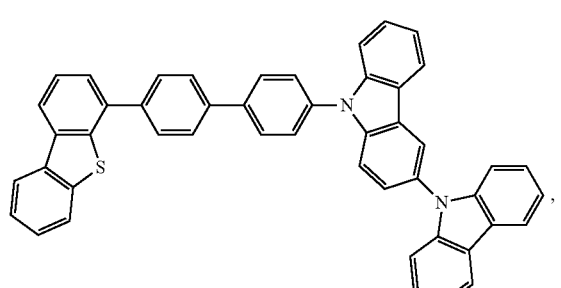

Compound 53
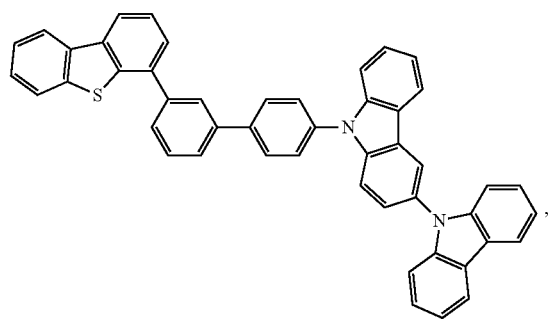

Compound 54
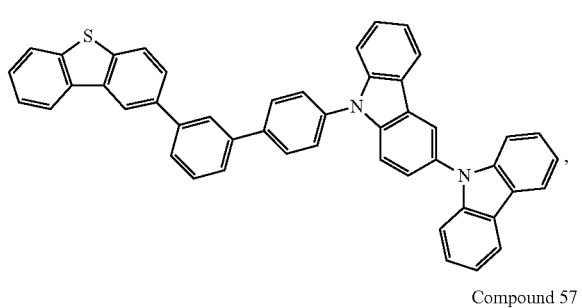

Compound 57
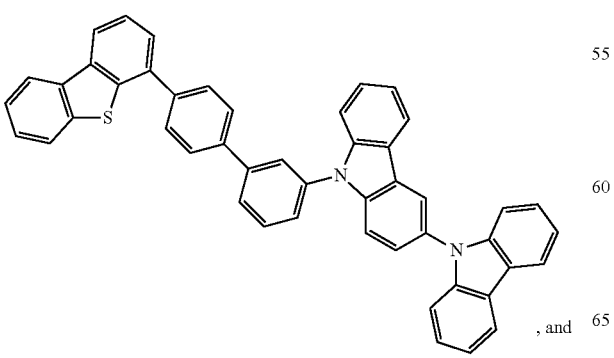, and

-continued

Compound 58
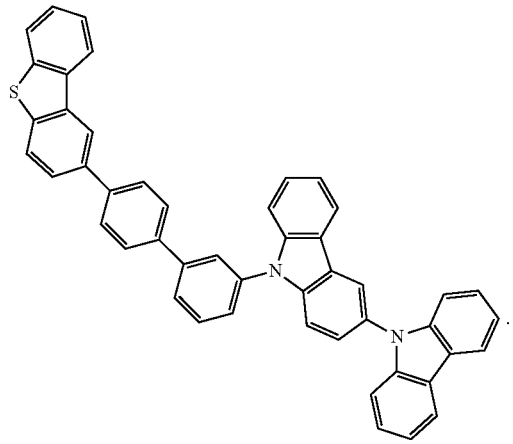

3. The first device of claim 1, wherein the first organic layer is an emissive layer and the compound having

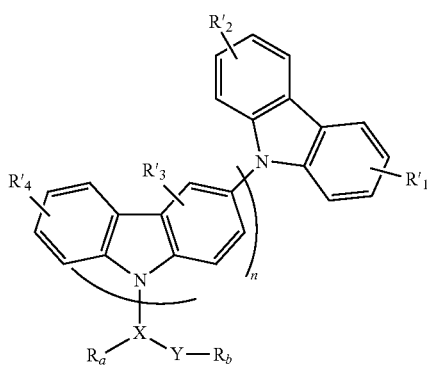

Formula I is a host.

4. The first device of claim 3, wherein the first organic layer further comprises an emissive dopant having the formula

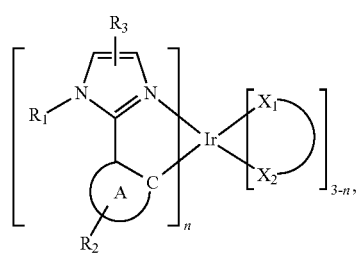

wherein A is a 5 or 6 membered carbocyclic or heterocyclic ring;

wherein $R_1$, $R_2$, and $R_3$ independently represent mono, di, tri or tetra substituents;

wherein each of $R_1$, $R_2$, and $R_3$ are independently selected from the group consisting of hydrogen, deuterium, alkyl, alkoxy, amino, alkenyl, alkynyl, arylkyl, aryl, and heteroaryl;

wherein n is 1, 2, or 3; and wherein X—Y is an ancillary ligand.

5. The first device of claim 4, wherein the emissive dopant is selected from the group consisting of:

Compound D
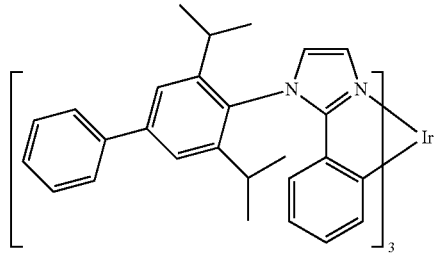

Compound H
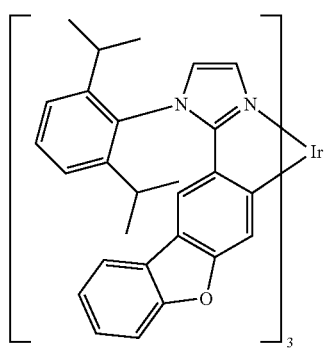

Compound I
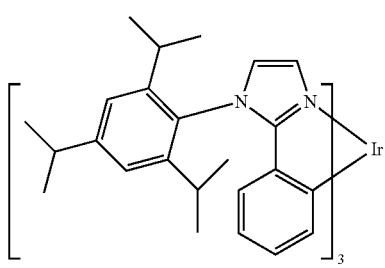

Compound J
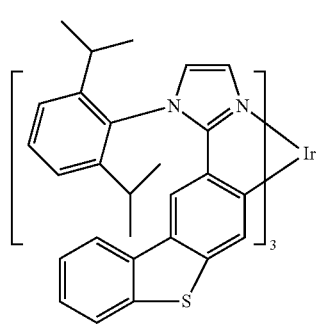

Compound K
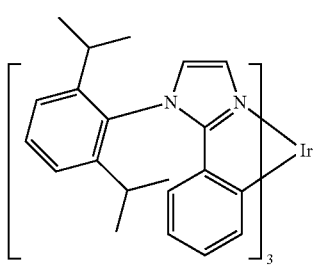

Compound L
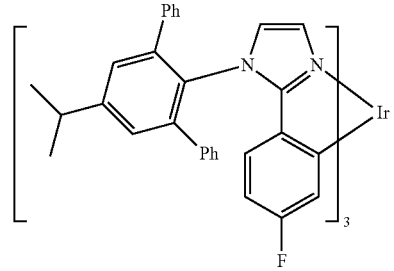

Compound M
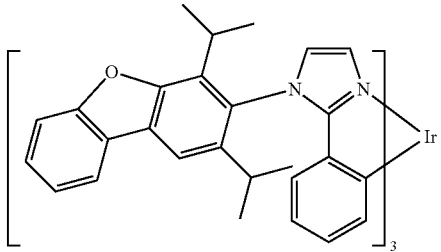

Compound N
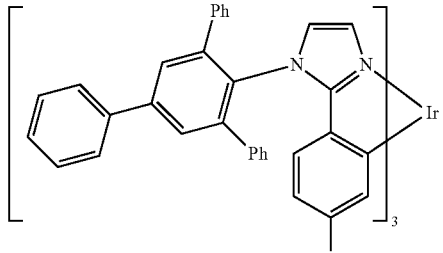

Compound O
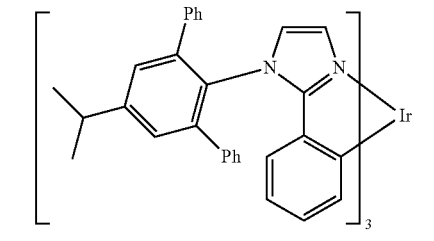

Compound P

[structure with Ph groups, imidazole, Ir]

6. The first device of claim 1, wherein the device further comprises a second organic layer that is a non-emissive layer and the compound having Formula I is a material in the second organic layer.

7. The first device of claim 6, wherein the second organic layer is a blocking layer and the compound having Formula I is a blocking material in the second organic layer.

8. The first device of claim 1, wherein the first organic layer is disposed using solution processing.

9. The first device of claim 1, wherein the device is an organic light emitting device.

10. The first device of claim 1, wherein the device is a consumer product.

11. The first device of claim 1, wherein the compound of formula I is:
Compound 1
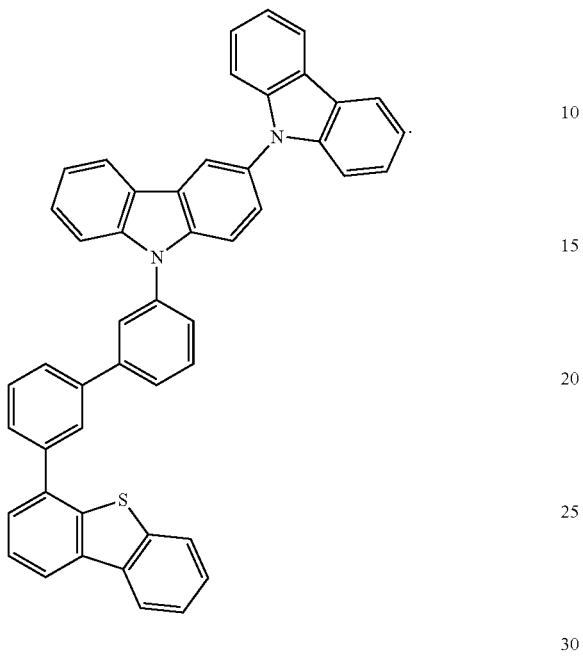
* * * * *